(12) United States Patent  
Samejima et al.

(10) Patent No.: US 10,175,573 B2  
(45) Date of Patent: Jan. 8, 2019

(54) CURABLE COMPOSITION AND COLOR FILTER

(71) Applicant: FUJIFILM Corporation, Minato-ku, Tokyo (JP)

(72) Inventors: Suguru Samejima, Haibara-gun (JP); Takashi Kawashima, Haibara-gun (JP); Yousuke Murakami, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 703 days.

(21) Appl. No.: 14/799,690

(22) Filed: Jul. 15, 2015

(65) Prior Publication Data

US 2015/0316844 A1   Nov. 5, 2015

Related U.S. Application Data

(63) Continuation of application No. PCT/JP2014/050656, filed on Jan. 16, 2014.

(30) Foreign Application Priority Data

Feb. 8, 2013 (JP) ................................. 2013-023516

(51) Int. Cl.
*G03F 7/00* (2006.01)
*C08K 5/3417* (2006.01)
(Continued)

(52) U.S. Cl.
CPC .......... *G03F 7/0007* (2013.01); *C08K 5/0041* (2013.01); *C08K 5/3417* (2013.01);
(Continued)

(58) Field of Classification Search
CPC ... C08K 5/0041; C08K 5/3417; G03F 7/0007; G03F 7/038; G03F 7/105; G03F 7/40; C08L 63/00; G02B 5/201; G02B 5/223; C09B 47/0671; C09B 47/0675; C09B 67/0033; C09B 69/108
(Continued)

(56) References Cited

U.S. PATENT DOCUMENTS 5,968,688 A    10/1999   Masuda et al.
8,158,307 B2   4/2012    Yoshibayashi et al.
(Continued)

FOREIGN PATENT DOCUMENTS

CN   101373329 A   2/2009
JP   4-81469 A     3/1992
(Continued)

OTHER PUBLICATIONS

Hamaguchi et al., JP 2000-345004 A machine translation in English, Dec. 12, 2000 (Year: 2000).*
(Continued)

*Primary Examiner* — David T Karst
(74) *Attorney, Agent, or Firm* — Sughrue Mion, PLLC

(57) ABSTRACT

Provided is a colored curable composition having a good chemical resistance, and capable of forming a good colored layer pattern, the colored curable composition including an epoxy group-containing compound, and a phthalocyanine dye having a functional group capable of forming a covalent bond by a reaction with the epoxy group under heating.

13 Claims, 4 Drawing Sheets

(51) Int. Cl.
*C08K 5/00* (2006.01)
*C08L 63/00* (2006.01)
*G02B 5/20* (2006.01)
*C09B 47/067* (2006.01)
*C09B 67/22* (2006.01)
*C09B 69/10* (2006.01)
*G03F 7/038* (2006.01)
*G03F 7/105* (2006.01)
*G03F 7/40* (2006.01)
*G02B 5/22* (2006.01)

(52) U.S. Cl.
CPC .......... *C08L 63/00* (2013.01); *C09B 47/0671* (2013.01); *C09B 47/0675* (2013.01); *C09B 67/0033* (2013.01); *C09B 69/108* (2013.01); *G02B 5/201* (2013.01); *G03F 7/038* (2013.01); *G03F 7/105* (2013.01); *G03F 7/40* (2013.01); *G02B 5/223* (2013.01)

(58) Field of Classification Search
USPC ................................................ 523/440, 456
See application file for complete search history.

(56) References Cited

U.S. PATENT DOCUMENTS

| 8,273,167 | B2 | 9/2012 | Sugihara et al. |
|---|---|---|---|
| 2008/0139707 | A1 | 6/2008 | Kawakami et al. |
| 2008/0206659 | A1 | 8/2008 | Yoshibayashi et al. |
| 2009/0134367 | A1* | 5/2009 | Shibatani ............ C09B 67/0022 252/582 |
| 2010/0256252 | A1 | 10/2010 | Sugihara et al. |
| 2011/0026153 | A1 | 2/2011 | Yoshibayashi |

FOREIGN PATENT DOCUMENTS

| JP | 10-160921 A | 6/1998 |
|---|---|---|
| JP | 10-171118 A | 6/1998 |
| JP | 2000-345004 A | 12/2000 |
| JP | 2001-249218 A | 9/2001 |
| JP | 2002-201371 A | 7/2002 |
| JP | 2004-292672 A | 10/2004 |
| JP | 2005-35949 A | 2/2005 |
| JP | 2005-225221 A | 8/2005 |
| JP | 2008-50599 A | 3/2008 |
| JP | 2008-070822 A | 3/2008 |
| JP | 2009-31723 A | 2/2009 |
| JP | 2009-051896 A | 3/2009 |
| JP | 2009-132899 A | 6/2009 |
| JP | 2010-008915 A | 1/2010 |
| JP | 2011-032366 A | 2/2011 |
| JP | 2011-57910 A | 3/2011 |
| JP | 2011-157478 A | 8/2011 |
| JP | 2012-181512 A | 9/2012 |
| JP | 2013-1785 A | 1/2013 |
| WO | 2009/104339 A1 | 8/2009 |
| WO | 2012/108435 A1 | 8/2012 |

OTHER PUBLICATIONS

Sugiura et al., JP 04-081469 A machine translation in English, Mar. 16, 1992 (Year: 1992).*
Office Action dated May 17, 2016, from the Japanese Patent Office in counterpart Japanese Application No. 2013-023516.
Office Action dated Jun. 28, 2016, from the State Intellectual Property Office of People's Republic of China in counterpart Chinese Application No. 201480007493.X.
Office Action dated Feb. 28, 2017 from the State Intellectual Property Office of the P.R.C. in counterpart Chinese Application No. 201480007493.X.
International Search Report for PCT/JP2014/050656 dated Apr. 15, 2014 [PCT/ISA/210].
Written Opinion of the International Search Authority for PCT/JP2014/050656 dated Apr. 15, 2014 [PCT/ISA/237].
International Preliminary Report on Patentability dated Aug. 20, 2015 issued in International Application No. PCT/JP2014/050656.

* cited by examiner

CURABLE COMPOSITION AND COLOR FILTER

CROSS-REFERENCE TO RELATED APPLICATIONS

This application is a Continuation of PCT International Application No. PCT/JP2014/050656 filed on Jan. 16, 2014, which claims priority under 35 U.S.C § 119(a) to Japanese Patent Application No. 2013-023516 filed on Feb. 8, 2013. Each of the above application(s) is hereby expressly incorporated by reference, in its entirety, into the present application.

TECHNICAL FIELD

This invention relates to a colored curable composition; a cured film and a color filter using the same; a method for manufacturing a color filter; a solid-state image sensing device, a liquid crystal display device, and an organic EL display device.

BACKGROUND ART

Color filter is a constituent indispensable for solid-state image sensing device and display unit of liquid crystal display device. Colored curable composition has been used for forming such color filter (Patent Literatures 1 to 3). There has been a demand of finer pattern in the color filter layer. There has also been a growing demand of chemical resistance higher than before.

CITATION LIST

Patent Literature

[Patent Literature 1] JP-A-2011-032366
[Patent Literature 2] JP-A-2008-070822
[Patent Literature 3] JP-A-2010-008915

SUMMARY OF THE INVENTION

Technical Problem

As described above, there has been a demand of colored curable composition which has a good chemical resistance and is capable of forming a good colored layer pattern.

This invention is aimed at solving the problem, and is to provide a colored curable composition having a good chemical resistance and being capable of forming a good colored layer pattern.

Solution to Problem

After intensive studies conducted under such circumstances, the present inventors found out that a colored curable composition, having a good chemical resistance and being capable of forming a good colored layer pattern, may be obtainable by adding an epoxy group-containing compound and a phthalocyanine dye having a functional group capable of forming a covalent bond by a reaction with the epoxy group under heating to a colored curable composition.

The problems described above were solved specifically by the solving following means <1>, and preferably by the following solving means <2> to <15>.

<1> A colored curable composition comprising an epoxy group-containing compound and a phthalocyanine dye having a functional group capable of forming a covalent bond by a reaction with the epoxy group under heating.

<2> A colored curable composition comprising an epoxy group-containing compound, and a phthalocyanine dye having a functional group, wherein the functional group is at least one species selected from a carboxyl group, an epoxy group, an aryl ester group, a tertiary alkyl ester group, a group represented by the formula (1), a group represented by the formula (2), amino group and a thiol group;

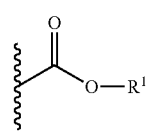

(1)

wherein $R^1$ represents a fluorine atom-containing alkyl group;

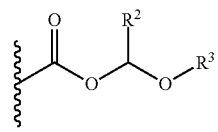

(2)

wherein each of $R^2$ and $R^3$ independently represents an alkyl group, and $R^2$ and $R^3$ may combine with each other to form a ring.

<3> The colored curable composition of <1> or <2>, wherein the phthalocyanine dye is a halogenated phthalocyanine dye.

<4> The colored curable composition of <3>, wherein the halogenated phthalocyanine dye is represented by the formula (1-2);

Formula (1-2)

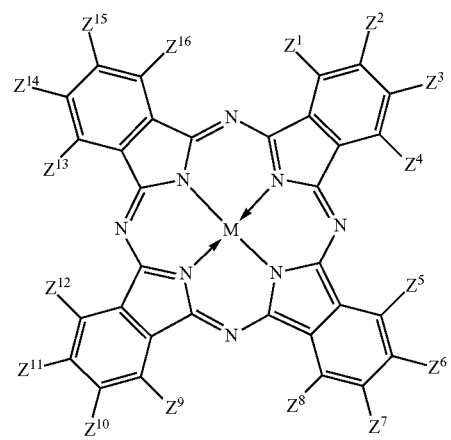

wherein each of $Z^1$ to $Z^{16}$ represents a hydrogen atom, a substituent or a halogen atom, at least one of $Z^1$ to $Z^{16}$ represents a halogen atom, and at least other one of $Z^1$ to $Z^{16}$ represents a substituent having the functional group. M represents two hydrogen atoms, a metal atom, a metal oxide or a metal halide.

<5> The colored curable composition of any one of <1> to <4>, wherein the phthalocyanine dye has, per molecule, one to four functional groups capable of forming a covalent bond by a reaction with the epoxy group under heating.

<6> The colored curable composition of any one of <1> to <5>, wherein the epoxy group-containing compound has, per molecule, two or more epoxy groups.

<7> The colored curable composition of any one of <1> to <6>, wherein the epoxy group-containing compound has an epoxy equivalent of 500 g/eq or below.

<8> The colored curable composition of any one of <1> to <7>, wherein wherein the epoxy group-containing compound is contained in an amount of 5 to 40% by mass, relative to total solids of the colored curable composition.

<9> The colored curable composition of any one of <1> to <8>, further comprising a yellow coloring matter.

<10> The colored curable composition of <9>, which comprises 50 to 90% by mass of a colorant containing the phthalocyanine dye and the yellow coloring matter, relative to total solids of the colored curable composition.

<11> A cured film obtainable by curing a colored curable composition described in any one of <1> to <10>.

<12> A color filter having a colored layer obtainable by using the colored curable composition described in any one of <1> to <10>.

<13> The color filter of <12>, wherein the colored layer has a thickness of 0.1 to 0.8 μm.

<14> A method for manufacturing a color filter, the method comprising:
forming a colored layer by curing a colored curable composition which contains a phthalocyanine dye having a functional group capable of forming a covalent bond by a reaction with an epoxy group under heating, and an epoxy group-containing compound; forming a photoresist layer on the colored layer; obtaining a resist pattern by patterning the photoresist layer by exposure and development; and dry-etching the colored layer using the resist pattern as an etching mask.

<15> A liquid crystal display device, an organic electroluminescence element, or a solid-state image sensing device, comprising the color filter described in <12> or <13>, or the color filter obtainable by the method for manufacturing a color filter described in <14>.

Advantageous Effects of Invention

According to this invention, there is provided a colored curable composition having a good chemical resistance, and being capable of forming a good colored layer pattern.

DESCRIPTION OF EMBODIMENTS

Figure 1:
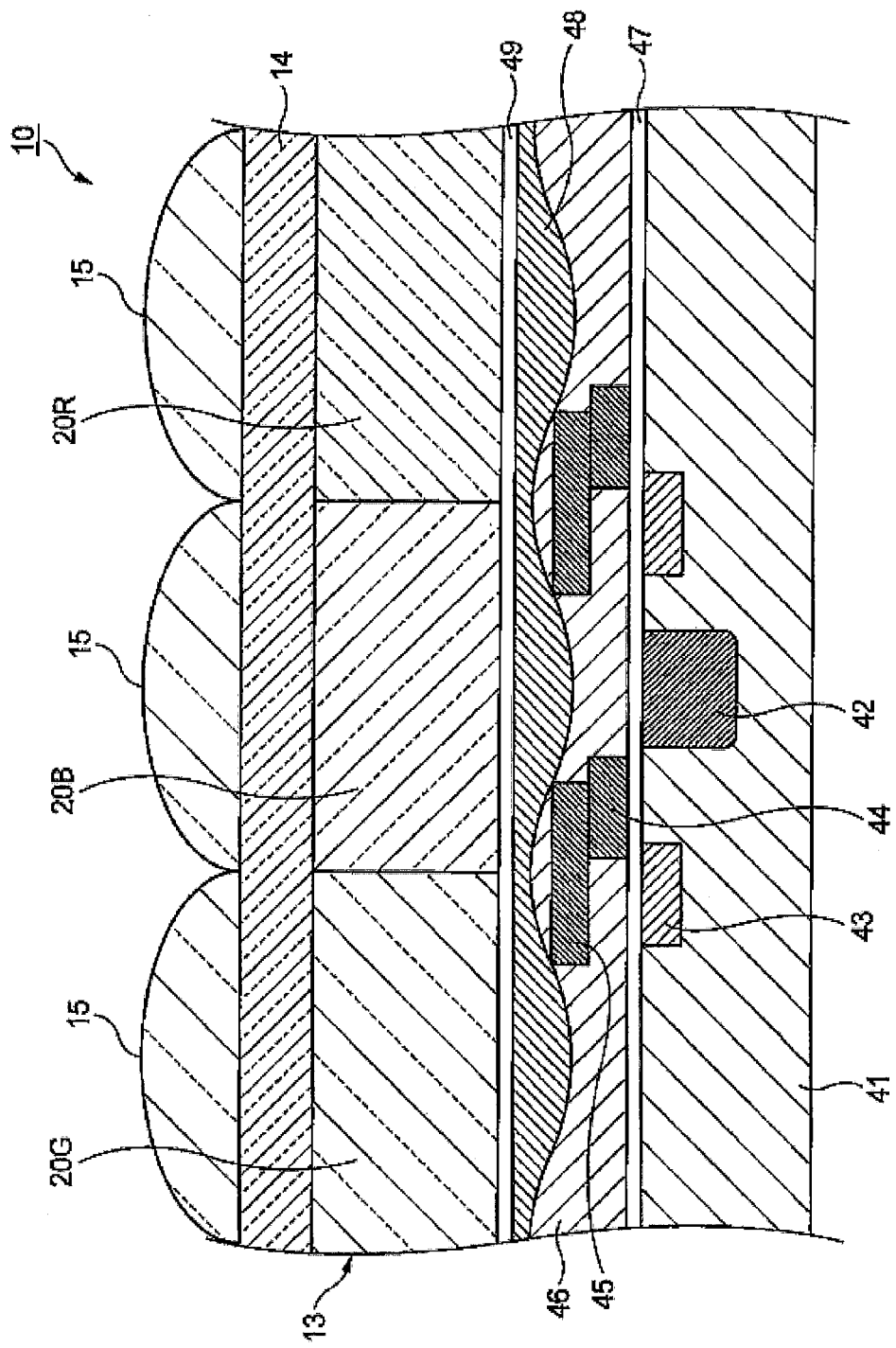
[FIG. 1] A schematic cross sectional view illustrating an exemplary configuration of a color filter and a solid-state image sensing device.

The present invention will be explained in detail below. As used herein, the numerical ranges expressed with "to" are used to mean the ranges including the values indicated before and after "to" as lower and upper limits.

In this specification, notation of group (atomic group) without being preceded by "substituted" or "unsubstituted", is used to encompass not only group having no substituent, but also group having substituent. For example, "alkyl group" encompass not only alkyl group having no substituent (unsubstituted alkyl group), but also alkyl group having substituent (substituted alkyl group).

In this specification, "(meth)acrylate" means acrylate and methacrylate, "(meth)acryl" means acryl and methacryl, and "(meth)acryloyl" means acryloyl and methacryloyl.

The "colored layer" in the context of this invention means pixels used for the color filter.

The dye in this invention means a coloring compound soluble in specific organic solvents. Now the specific organic solvents are exemplified typically by those enumerated later in the section of solvent capable of solubilizing the dye and the epoxy group-containing compound. Accordingly, the coloring compound which can dissolve into at least one of these organic solvents corresponds to the dye in this invention.

The colored curable composition of this invention (also referred to as "the composition of this invention", hereinafter), a color filter and a method for manufacturing the same, a solid-state image sensing device, a liquid crystal display device, and an organic electroluminescence element will be detailed. While the description of the constituent features given below may be made on the representative embodiments of this invention, this invention is by no means limited by these embodiments.

<Colored Curable Composition>

The composition of this invention contains an epoxy group-containing compound, and a phthalocyanine dye having a functional group capable of forming a covalent bond by a reaction with the epoxy group under heating. The composition of this invention also contains an epoxy group-containing compound, and a phthalocyanine dye having a functional group, wherein the functional group is at least one species selected from a carboxyl group, an epoxy group, an aryl ester group, a tertiary alkyl ester group, a group represented by the following formula (1), a group represented by the following formula (2), amino group and thiol group. Now the functional groups essentially possessed by the phthalocyanine dye are also collectively referred to as "the functional group(s) (X) used in this invention".

[Chemical Formula 4]

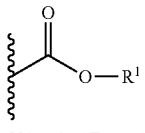
(1)

[Chemical Formula 5]

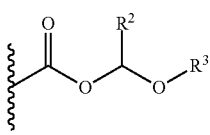
(2)

(In the formula (1), $R^1$ represents a fluorine atom-containing alkyl group. In the formula (2), each of $R^2$ and $R^3$ independently represents an alkyl group, where $R^2$ and $R^3$ may combine with each other to form a ring.)

A supposed mechanism, although not totally clarified, is such that, by adding the epoxy group-containing compound and the phthalocyanine dye having the functional group (X) used in this invention to the composition of this invention, the functional group (X) used in this invention and the epoxy group react under heating to form a covalent bond (for example, the epoxy group of the epoxy group-containing compound crosslinks with the functional group possessed by the phthalocyanine dye), to form a stronger film, thereby the chemical resistance may be improved, and a good colored layer pattern may be formed.

In the reaction mechanism illustrated below, $R^1$ represents a phthalocyanine skeleton of the phthalocyanine dye, and each of $R^2$ and $R^3$ independently represents an alkyl group or aryl group.

Carboxyl group, amino group, and thiol group are supposed to participate in the formation of a covalent bond between the epoxy group, which serves as a binder, and the phthalocyanine dye according to the reaction mechanism illustrated below, to thereby form a strong film.

Tertiary alkyl ester group and the formula (2) are supposed to decompose (deprotect the ester moiety) under heating to produce a carboxylic acid, and then to follow the same reaction mechanism as the carboxyl group.

A supposed mechanism of aryl ester group and the group represented by the formula (1), although not totally clarified, is typically illustrated in the reaction mechanism below, in which (A) the functional group (X) used in this invention and (B) epoxy group react first under heating, thereby (B) epoxy group combines with (A) the functional group (X) used in this invention, $O-R^2$ is released from (A) the functional group (X) used in this invention, and the released $O-R^2$ again combines with (A) the functional group (X) used in this invention, thereby (A) the functional group (X) used in this invention and (B) epoxy group form a covalent bond, to give (C) compound in which a covalent bond is formed between the epoxy compound, which serves as a binder, and the phthalocyanine dye, and this contributes to form a strong film.

[Chemical Formula 6]

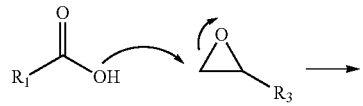

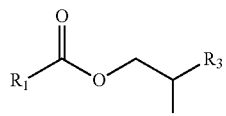

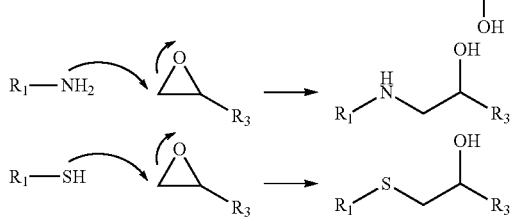

[Chemical Formula 7]

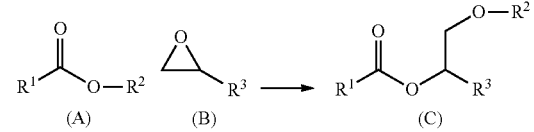

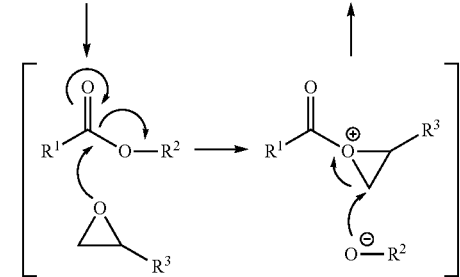

<Phthalocyanine Dye>

The phthalocyanine dye used in this invention has the functional groups (X) used in this invention, as described above.

The phthalocyanine dye used in this invention preferably contains a halogen atom (halogenated phthalocyanine).

The phthalocyanine dye used in this invention may contain a substituent other than the functional group (X) used in this invention and halogen atom.

The substituent will be explained below.

<<Functional Group Capable of Forming Covalent Bond by Reaction with Epoxy Group Under Heating>>

The functional groups (X) used in this invention mean, for example, those capable of forming a covalent bond by a reaction with the epoxy group in the process of heat curing at 100° C. or above, to significantly improve the chemical resistance (curability).

Among the functional groups (X) used in this invention, preferable examples include carboxyl group, epoxy group, aryl ester group, tertiary alkyl ester group, the group represented by the formula (1), the group represented by the formula (2), and amino group and thiol group; more preferable examples include carboxyl group, epoxy group, aryl ester group, tertiary alkyl ester group, the group represented by the formula (1), and the group represented by the formula (2); and furthermore preferable examples include carboxyl group, epoxy group, tertiary alkyl ester group, and the group represented by the formula (2).

The phthalocyanine dye used in this invention has the functional group, generally at the terminal portion of the structure thereof. By containing the functional group at the terminal portion of the structure of the phthalocyanine dye, the effect of this invention may be obtained more efficiently.

<<<Aryl Ester Group>>>

The aryl ester group is exemplified by substituted or unsubstituted aryl ester group, and substituted or unsubstituted heteroaryl ester group.

The aryl group contained in the aryl ester group is preferably aryl group having 6 to 18 carbon atoms, more preferably aryl group having 6 to 14 carbon atoms, and furthermore preferably aryl group having 6 to 10 carbon atoms. The aryl group is specifically exemplified by phenyl group and naphthyl group.

The heteroaryl group contained in the aryl ester group is preferably a five-membered ring or six-membered ring. The heteroaryl group is a monocycle or condensed ring, preferably a monocycle or condensed ring having 2 to 8 rings condensed with each other, more preferably a monocycle or condensed ring having 2 to 4 rings condensed with each other, and furthermore preferably a monocycle.

The substituent of the aryl ester group is preferably an electron attractive group, which is exemplified by nitro group, methoxy group, cyano group, carboxyl group, ketone group, acyloxy group, hydroxy group, perfluoroalkyl group, alkylsulfone group, ethoxy group, isopropoxy group, t-butoxy group, and benzyloxy group.

The aryl ester group used in this invention is preferably represented, for example, by the structural formula below.

[Chemical Formula 8]

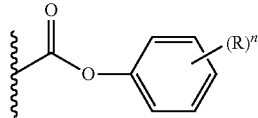

In the structure of the aryl ester group, R represents a hydrogen atom or electron attractive group, and n represents an integer of 0 to 3. The electron attractive group is exemplified by the above-described electron attractive group, and is preferably nitro group and perfluoroalkyl group (in particular, trifluoromethyl group). Position of substitution by R may be any of the ortho-position, meta-position and para-position, wherein the para-position is preferable. n preferably represents 0 or 1.

<<<Tertiary Alkyl Ester Group>>>

The tertiary alkyl ester group is exemplified by substituted or unsubstituted tertiary alkyl ester group. The tertiary alkyl group in the tertiary alkyl ester group is exemplified by t-butyl group, t-pentyl group, and t-hexyl group, wherein t-butyl group and t-pentyl group are particularly preferable.

<<<Group Represented by Formula (1)>>>

In the group represented by the formula (1), $R^1$ represents a fluorine atom-containing alkyl group.

The fluorine atom-containing alkyl group is preferably a fluorine atom-containing alkyl group having two or more fluorine atoms and 1 to 10 carbon atoms, and may have any of straight-chain form, branched-chain form and cyclic form, wherein the straight-chain form or branched-chain form is preferable. The fluorine atom-containing alkyl group preferably has 1 to 10 carbon atoms, more preferably 1 to 5 carbon atoms, and particularly 1 to 4 carbon atoms. The fluorine atom-containing alkyl group preferably has (—CF$_3$) as the terminal structure. The fluorine atom-containing alkyl group preferably has a degree of substitution by fluorine atoms of 40 to 100%, and more preferably 50 to 100%. Now the degree of substitution by fluorine atoms means the percentage (%) of hydrogen atoms in the fluorine atom-containing alkyl group substituted by fluorine atoms.

<<<Group Represented by Formula (2)>>>

In the group represented by the formula (2), each of $R^2$ and $R^3$ independently represents an alkyl group, where $R^2$ and $R^3$ may combine with each other to form a ring.

In the formula (2), each of $R^2$ and $R^3$ independently represents either substituted or unsubstituted alkyl group, and may have any of straight-chain. form, branched-chain form, and cyclic form formed by $R^2$ and $R^3$ combined with each other. In particular, the straight-chain form, or the unsubstituted alkyl group having 3 to 5 carbon atoms, formed by $R^2$ and $R^3$ combined with each other, are preferable. For the case where at least one of $R^2$ and $R^3$ represents a straight-chain alkyl group, each of $R^2$ and $R^3$ independently has 1 to 5 carbon atoms, and more preferably 1 to 4 carbon atoms.

In particular in the formula (2), each of $R^2$ and $R^3$ independently represents a methyl group, ethyl group, propyl group, butyl group, or cyclic alkyl group having 4 to 6 carbon atoms formed by $R^2$ and $R^3$ combined with each other.

<<Binding Form of Substituent Used in this Invention>>

The phthalocyanine dye used in this invention has the above-described functional group, wherein this functional group may be directly bound to the phthalocyanine skeleton of the phthalocyanine dye, or may be bound via some kind of linking group. The functional group is, for example, bound in such a way that a hydrogen atom in any substituent in the group of substituent T below has been substituted.

(Substituent T)

Examples of the substituent T include alkyl group (preferably straight-chain, branched-chain, or cyclic alkyl group having 1 to 24 carbon atoms, such as methyl group, ethyl group, propyl group, isopropyl group, butyl group, tert-butyl group, pentyl group, hexyl group, heptyl group, octyl group, 2-ethylhexyl group, dodecyl group, hexadecyl group, cyclopropyl group, cyclopentyl group, cyclohexyl group, 1-norbornyl group, 1-adamantyl group); alkenyl group (preferably alkenyl group having 2 to 18 carbon atoms, such as vinyl group, allyl group, 3-butene-1-yl group); aryl group (preferably aryl group having 6 to 24 carbon atoms, such as, phenyl group, naphthyl group); heterocyclic group (preferably heterocyclic group having 1 to 18 carbon atoms, such as 2-thienyl group, 4-pyridyl group, 2-furyl group, 2-pyrimidinyl group, 1-pyridyl group, 2-benzothiazolyl group, 1-imidazolyl group, 1-pyrazolyl group, benzotriazole-1-yl group); silyl group (preferably silyl group having 3 to 18 carbon atoms, such as trimethylsilyl group, triethylsilyl group, tributylsilyl group, tert-butyldimethylsilyl group, tert-hexyldimethylsilyl group); hydroxy group; cyano group; nitro group; alkoxy group (preferably alkoxy group having 1 to 24 carbon atoms, such as methoxy group, ethoxy group, 1-butoxy group, 2-butoxy group, isopropoxy group, tert-butoxy group, dodecyloxy group, and if being a cycloalkyloxy group, such as cyclopentyloxy group, cyclohexyloxy group); aryloxy group (preferably aryloxy group having 6 to 24 carbon atoms, such as phenoxy group, 1-naphthoxy group); heterocyclic oxy group (preferably heterocyclic oxy group having 1 to 18 carbon atoms, such as 1-phenyltetrazole-5-oxy group, 2-tetrahydropyranyloxy group); silyloxy group (preferably silyloxy group having 1 to 18 carbon atoms, such as trimethylsilyloxy group, tert-butyldimethylsilyloxy group, diphenylmethylsilyloxy group); acyloxy group (preferably acyloxy group having 2 to 24 carbon atoms, such as acetoxy group, pivaloyloxy group, benzoyloxy group, dodecanoyloxy group); alkoxycarbonyloxy group (preferably alkoxycarbonyloxy group having 2 to 24 carbon atoms, such as ethoxycarbonyloxy group, tert-butoxycarbonyloxy group, and if being a cycloalkyloxycarbonyloxy group, such as cyclohexyloxycarbonyloxy group); aryloxycarbonyloxy group (preferably aryloxycarbonyloxy group having 7 to 24 carbon atoms, such as phenoxycarbonyloxy group); carbamoyloxy group (preferably carbamoyloxy group having 1 to 24 carbon atoms, such as N,N-dimethylcarbamoyloxy group, N-butylcarbamoyloxy group, N-phenylcarbamoyloxy group, N-ethyl-N-phenylcarbamoyloxy group); sulfamoyloxy group (preferably sulfamoyloxy group having 1 to 24 carbon atoms, such as N,N-diethylsulfamoyloxy group, N-propylsulfamoyloxy group); alkylsulfonyloxy group (preferably alkylsulfonyloxy group having 1 to 24 carbon atoms, such as methylsulfonyloxy group, hexadecylsulfonyloxy group, cyclohexylsulfonyloxy group); arylsulfonyloxy group (preferably arylsulfonyloxy group having 6 to 24 carbon atoms, such as phenylsulfonyloxy group); acyl group (preferably acyl group having 1 to 24 carbon atoms, such as formyl group, acetyl group, pivaloyl group, benzoyl group, tetradecanoyl group, cyclohexanoyl group); alkoxycarbonyl group (preferably alkoxycarbonyl group having 2 to 24 carbon atoms, such as methoxycarbonyl group, ethoxycarbonyl group, octadecyloxycarbonyl group, cyclohexyloxycarbonyl group, 2,6-di-tert-butyl-4-methylcyclohexyloxycarbonyl group); aryloxycarbonyl group (preferably aryloxycarbonyl group having 7 to 24 carbon atoms, such as phenoxycarbonyl group); carbamoyl group (preferably carbamoyl group having 1 to 24 carbon atoms, such as carbamoyl group, N,N-diethylcarbamoyl group, N-ethyl-N-octylcarbamoyl group, N,N-dibutylcarbamoyl group, N-propylcarbamoyl group, N-phenylcarbamoyl group, N-methyl-N-phenylcarbamoyl group, N,N-dicyclohexylcarbamoyl group); amino group (preferably amino group having 24 or less carbon atoms, such as amino group, methylamino group, N,N-dibutylamino group, tetradecylamino group, 2-ethylhexylamino group, cyclohexylamino group); anilino group (preferably anilino group having 6 to 24 carbon atoms, such as anilino group, N-methylanilino group); heterocyclic amino group (preferably heterocyclic amino group having 1 to 18 carbon atoms, such as 4-pyridylamino group); carbonamide group (preferably carbonamide group having 2 to 24 carbon atoms, such as acetamide group, benzamide group, tetradecanamide group, pivaloylamide group, cyclohexanamide group); ureido group (preferably ureido group having 1 to 24 carbon atoms, such as ureido group, N,N-dimethylureido group, N-phenylureido group); imide group (preferably imide group having 24 or less carbon atoms, such as N-succinimide group, N-phthalimide group); alkoxycarbonylamino group (preferably alkoxycarbonylamino group having 2 to 24 carbon atoms, such as methoxycarbonylamino group, ethoxycarbonylamino group, tert-butoxycarbonylamino group, octadecyl oxycarbonylamino group, cyclohexyloxycarbonylamino group); aryloxycarbonylamino group (preferably aryloxycarbonylamino group having 7 to 24 carbon atoms, such as phenoxycarbonylamino group); sulfonamide group (preferably sulfonamide group having 1 to 24 carbon atoms, such as methanesulfonamide group, butanesulfonamide group, benzenesulfonamide group, hexadecanesulfonamide group, cyclohexanesulfonamide group); sulfamoylamino group (preferably sulfamoylamino group having 1 to 24 carbon atoms, such as N,N-dipropylsulfamoylamino group, N-ethyl-N-dodecylsulfamoylamino group); azo group (preferably azo group having 1 to 24 carbon atoms, such as phenylazo group, 3-pyrazolylazo group); alkylthio group (preferably alkylthio group having 1 to 24 carbon atoms, such as methylthio group, ethylthio group, octylthio group, cyclohexylthio group); arylthio group (preferably arylthio group having 6 to 24 carbon atoms, such as phenylthio group); heterocyclic thio group (preferably heterocyclic thio group having 1 to 18 carbon atoms, such as 2-benzothiazolylthio group, 2-pyridyl thio group, 1-phenyltetrazolylthio group), alkylsulfinyl group (preferably alkylsulfinyl group having 1 to 24 carbon atoms, such as dodecanesulfinyl group); arylsulfinyl group (preferably arylsulfinyl group having 6 to 24 carbon atoms, such as phenylsulfinyl group); alkylsulfonyl group (preferably alkylsulfonyl group having 1 to 24 carbon atoms, such as methylsulfonyl group, ethylsulfonyl group, propylsulfonyl group, butylsulfonyl group, isopropylsulfonyl group, 2-ethylhexylsulfonyl group, hexadecylsulfonyl group, octylsulfonyl group, cyclohexylsulfonyl group); arylsulfonyl group (preferably arylsulfonyl group having 6 to 24 carbon atoms, such as phenylsulfonyl group, 1-naphthylsulfonyl group); sulfamoyl group (preferably sulfamoyl group having 24 or less carbon atoms, such as sulfamoyl group, N,N-dipropylsulfamoyl group, N-ethyl-N-dodecylsulfamoyl group, N-ethyl-N-phenylsulfamoyl group, N-cyclohexylsulfamoyl group); sulfo group; phosphonyl group (preferably phosphonyl group having 1 to 24 carbon atoms, such as phenoxyphosphonyl group, octyloxyphosphonyl group, phenylphosphonyl group); and phosphinoylamino group (preferably phosphinoylamino group having 1 to 24 carbon atoms, such as diethoxyphosphinoylamino group, dioctyloxyphosphinoylamino group).

The substituent T may further be substituted by the substituent T, without departing from the scope of this invention.

<<Halogenated Phthalocyanine>>

The phthalocyanine dye used in this invention is preferably halogenated phthalocyanine dye (phthalocyanine dye having halogen atom(s)), as described above. The halogenated phthalocyanine dye used in this invention is a compound generally showing a maximum absorption in the wavelength region from 600 to 800 nm, and preferably in the region from 630 to 750 nm. By using such halogenated phthalocyanine dye, the composition of this invention when used for color filter will be improved in colorability of the colored layer.

The above-described functional group (X) used in this invention possessed by the phthalocyanine dye may be bound directly to the phthalocyanine skeleton of the phthalocyanine dye, or may be bound via some kind of linking group, wherein the functional group (X) used in this invention is preferably bound via the linking group to phthalocyanine skeleton by reason of wavelength control.

<<Substituent>>

This sort of linking group typically has a form in which a hydrogen atom in any substituent in the group of substituent T described above has been substituted, and is preferably represented by the formula (1-1) below.

Formula (1-1)

—X-A$^1$        [Chemical Formula 9]

(In the formula (1-1), X represents an oxygen atom or sulfur atom, and A$^1$ represents a phenyl group or naphthyl group having the above-described functional group used in this invention.)

In the formula (1-1), X represents an oxygen atom or sulfur atom, and preferably oxygen atom.

A$^1$ represents phenyl group or naphthyl group having the above-described functional group used in this invention.

The group represented by the formula (1-1) is more preferably a group represented by the formula (1-1-1).

[Chemical Formula 10]

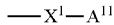

Formula (1-1-1)

(In the formula (1-1-1), $X^1$ represents an oxygen atom or sulfur atom, and $A^{11}$ represents a phenyl group having the above-described functional group used in this invention.)

In the formula (1-1-1), $X^1$ represents an oxygen atom or sulfur atom, and preferably an oxygen atom.

$A^{11}$ represents a phenyl group having the above-described functional group used in this invention, and preferably represents —$R^1$, —C(=O)O-(phenylene group)-$R^1$ or —C(=O)O—$R^1$. Now, $R^1$ represents the above-described functional group used in this invention (i.e., at least functional group selected from carboxyl group, epoxy group, aryl ester group, tertiary alkyl ester group, the group represented by the formula (1), the group represented by the formula (2), amino group and thiol group).

The phthalocyanine dye used in this invention also preferably contains halogen atom(s) (halogenated phthalocyanine). The halogen atom is preferably chlorine atom or fluorine atom.

The halogen atom may be bound directly to the phthalocyanine skeleton of the phthalocyanine dye, or may be bound via some kind of linking group, and is preferably bound directly to the phthalocyanine skeleton. When it is bound via some kind of linking group, the possible forms are such that a hydrogen atom of the substituent in the above-described group of substituent T has been replaced.

<<Other Substituent>>

The phthalocyanine dye used in this invention may have a substituent other than the functional group (X) used in this invention and halogen atom. Such other substituent is exemplified by those contained in the above-described group of substituent T.

Among them, such other substituent is preferably a group represented by the formula (1-1-2) below.

[Chemical Formula 11]

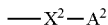

Formula (1-1-2)

(In the formula (1-1-2), $X^2$ represents an oxygen atom or sulfur atom, and $A^2$ represents a phenyl group or naphthyl group.)

In the formula (1-1-2), $X^2$ represents an oxygen atom or sulfur atom, and preferably an oxygen atom. When $X^2$ represents an oxygen atom, the resultant phthalocyanine dye will show a maximum absorption shifted to the shorter wavelength side.

$A^2$ represents a substituted phenyl group or substituted naphthyl group, preferably a phenyl group having 1 to 5 substituents or naphthyl group having 1 to 7 substituents, and preferably a phenyl group having 1 to 5 substituents.

The group represented by the formula (1-1-2) is preferably a group represented by the formula (1-1-2-1) below.

[Chemical Formula 12]

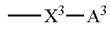

Formula (1-1-2-1)

(In the formula (1-1-2-1), $X^3$ represents an oxygen atom or sulfur atom, and $A^3$ represents a phenyl group having 1 to 5 substituents R.)

In the formula (1-1-2-1), $X^3$ represents an oxygen atom or sulfur atom, and preferably an oxygen atom. When $X^3$ represents an oxygen atom, the resultant phthalocyanine dye will show a maximum absorption shifted to the shorter wavelength side.

$A^3$ represents a phenyl group having 1 to 5 substituents R, more preferably a phenyl group having 1 to 3 substituents R, and furthermore preferably a phenyl group having a single substituent R.

In the phenyl group having the substituent R, the substituent R is preferably represented by —C(=O)O—$R^1$. $R^1$ in the substituent R preferably represents a group formed by combining —$(CH_2)_n$— (n represents an integer of 1 to 5, and more preferably represents an integer of 1 to 3) with —O—.

<<<Preferable Embodiments of Phthalocyanine Dye>>>

The phthalocyanine dye used in this invention is more preferably a halogenated phthalocyanine dye represented by the formula (1-2) below.

[Chemical Formula 13]

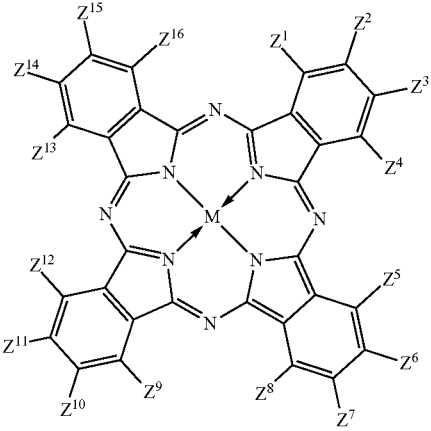

Formula (1-2)

(In the formula (1-2), each of $Z^1$ to $Z^{16}$ represents a hydrogen atom, substituent or halogen atom, at least one of $Z^1$ to $Z^{16}$ represents a halogen atom, and at least other one of $Z^1$ to $Z^{16}$ represents a substituent having the above-described functional group (X) used in this invention. M represents two hydrogen atoms, metal atom, metal oxide or metal halide.)

$Z^1$, $Z^4$, $Z^5$, $Z^8$, $Z^9$, $Z^{12}$, $Z^{13}$ and $Z^{16}$ in the formula (1-2) represent substituents which substitute on eight α-positions of the phthalocyanine nucleus, so that these substituents will collectively referred to as "α-positioned substituents" on occasions. Similarly, $Z^2$, $Z^3$, $Z^6$, $Z^7$, $Z^{10}$, $Z^{11}$, $Z^{14}$ and $Z^{15}$ in the formula (1-2) represent substituents which substitute on eight β-positions of the phthalocyanine nucleus, so that these substituents will generally referred to as "β-positioned substituent" on occasions.

Each of $Z^1$ to $Z^{16}$ represents a hydrogen atom, substituent or halogen atom, at least one of $Z^1$ to $Z^{16}$ represents a halogen atom, and at least other one of $Z^1$ to $Z^{16}$ represents a substituent having the above-described functional group (X) used in this invention.

The halogenated phthalocyanine dye represented by the formula (1-2) preferably has, in one molecule thereof, 5 to 15 halogen atoms for any of $Z^1$ to $Z^{16}$, and more preferably 6 to 14 halogen atoms. The halogen atom is exemplified by chlorine atom, fluorine atom, bromine atom, and iodine atom, wherein chlorine atom or fluorine atom is more preferable.

The substituent having the functional group (X) used in this invention is preferably, for example, those represented by the above-described formula (1-1). The number of the substituents having the functional group (X) used in this invention, per one molecule of the halogenated phthalocyanine dye, is preferably 1 to 8, more preferably 1 to 6, and furthermore preferably 2 to 4.

In the formula (1-2), M represents two hydrogen atoms, metal atom, metal oxide or metal halide. The metal atom is exemplified by iron, magnesium, nickel, cobalt, copper, palladium, zinc, vanadium, titanium, indium, and tin. The metal oxide is exemplified by titanyl and vanadyl. The metal halide is exemplified by aluminum chloride, indium chloride, germanium chloride, tin (II) chloride, tin (IV) chloride, and silicon chloride. Preferable examples include metal atom, metal oxide and metal halide; which are specifically copper, zinc, cobalt, nickel, iron, vanadyl, titanyl, indium chloride, and tin (II) chloride; furthermore preferable examples include copper, vanadyl and zinc; furthermore preferable examples include zinc and copper, and particularly preferable examples include zinc. When the central metal is zinc or copper, the phthalocyanine dye will advantageously have a high heat resistance. When the central metal is zinc, the phthalocyanine dye will show a higher transmittance in the green wavelength range of 520 nm to 545 nm or around than the dye with copper, and will advantageously improve the luminance when the dye is applied to the color filter. Such phthalocyanine dye is particularly preferable also because it will be more soluble into acetone, methanol, methyl cellosolve and other general solvents, and also will be more compatible with resins, so that the contrast may be enhanced.

The phthalocyanine dye in this invention may have other substituent for $Z^1$ to $Z^{16}$ in the formula (1-2), besides the substituent having the functional group (X) used in this invention and halogen atom. Such other substituent is not specifically limited so long as the phthalocyanine dye will not ruin the function thereof.

When the phthalocyanine dye in this invention has such other substituent, zero to eight out of $Z^1$ to $Z^{16}$, more preferably zero to five of them, and furthermore preferably zero or one of them is preferably a group represented by the formula (1-1-2) or the formula (1-1-2-1). Such other substituent may alternatively be substituents described, for example, in paragraphs [0027] to [0037] of JP-A-2012-077153, or substituents described in paragraph [0185] of JP-A-2012-208494, the contents of which are incorporated into this specification.

Preferable and specific examples of the phthalocyanine dye used in this invention will be enumerated below, of course without limiting this invention. The preferable and specific examples of the phthalocyanine dye used in this invention may be other than those based on the combinations listed in Tables below. For example, in the specific examples G-1 to G-22, and G'-1 to G'-3 below, S-1 may be replaced with any of S-2 to S-47 shown below.

In the formula below, R represents a substituent having the functional group (X) used in this invention, and is preferably bound to the β-position. S represents the other substituent which may be possessed by the phthalocyanine dye used in this invention. X represents a halogen atom which may be possessed by the phthalocyanine dye used in this invention.

[Chemical Formula 14]

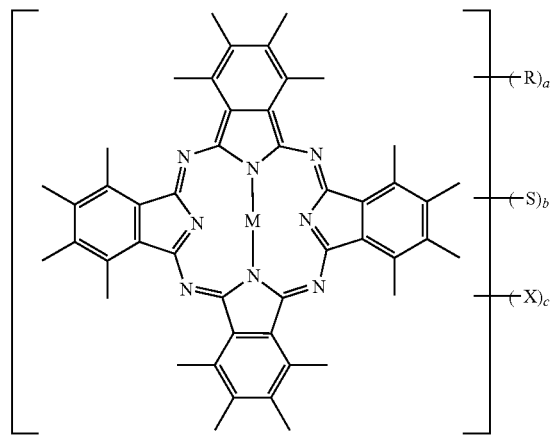

TABLE 1

|  | R | S | X | M | a | b | c |
|---|---|---|---|---|---|---|---|
| G-1 | R-1 | S-1 | Cl | Zn | 2 | 2 | 12 |
| G-2 | R-2 | S-1 | Cl | Zn | 2 | 2 | 12 |
| G-3 | R-1 | S-1 | F | Zn | 2 | 2 | 12 |
| G-4 | R-2 | S-1 | F | Zn | 2 | 2 | 12 |
| G-5 | R-3 | — | Cl | Zn | 4 | 0 | 12 |
| G-6 | R-4 | — | Cl | Zn | 4 | 0 | 12 |
| G-7 | R-5 | — | Cl | Zn | 4 | 0 | 12 |
| G-8 | R-3 | — | F | Zn | 4 | 0 | 12 |
| G-9 | R-4 | — | F | Zn | 4 | 0 | 12 |
| G-10 | R-5 | — | F | Zn | 4 | 0 | 12 |

TABLE 2

|  | R | S | X | M | a | b | c |
|---|---|---|---|---|---|---|---|
| G-11 | R-6 | — | Cl | Zn | 4 | 0 | 12 |
| G-12 | R-7 | — | Cl | Zn | 4 | 0 | 12 |
| G-13 | R-8 | — | Cl | Zn | 4 | 0 | 12 |
| G-14 | R-9 | — | Cl | Zn | 4 | 0 | 12 |
| G-15 | R-10 | — | Cl | Zn | 4 | 0 | 12 |
| G-16 | R-11 | S-1 | Cl | Zn | 2 | 2 | 12 |
| G-17 | R-12 | S-1 | Cl | Zn | 2 | 2 | 12 |
| G-18 | R-1 | S-1 | Cl | Cu | 2 | 2 | 12 |
| G-19 | R-1 | S-1 | F | Cu | 2 | 2 | 12 |
| G-20 | R-1 | S-1 | — | Cu | 6 | 2 | 0 |
| G-21 | R-13 | S-1 | Cl | Cu | 4 | 0 | 12 |
| G-22 | R-14 | S-1 | Cl | Cu | 4 | 0 | 12 |
| G'-1 | R-1 | — | Cl | Zn | 4 | 0 | 12 |
| G'-2 | R-2 | — | Cl | Zn | 4 | 0 | 12 |
| G'-3 | R-1 | — | F | Zn | 4 | 0 | 12 |

[Chemical Formula 15]
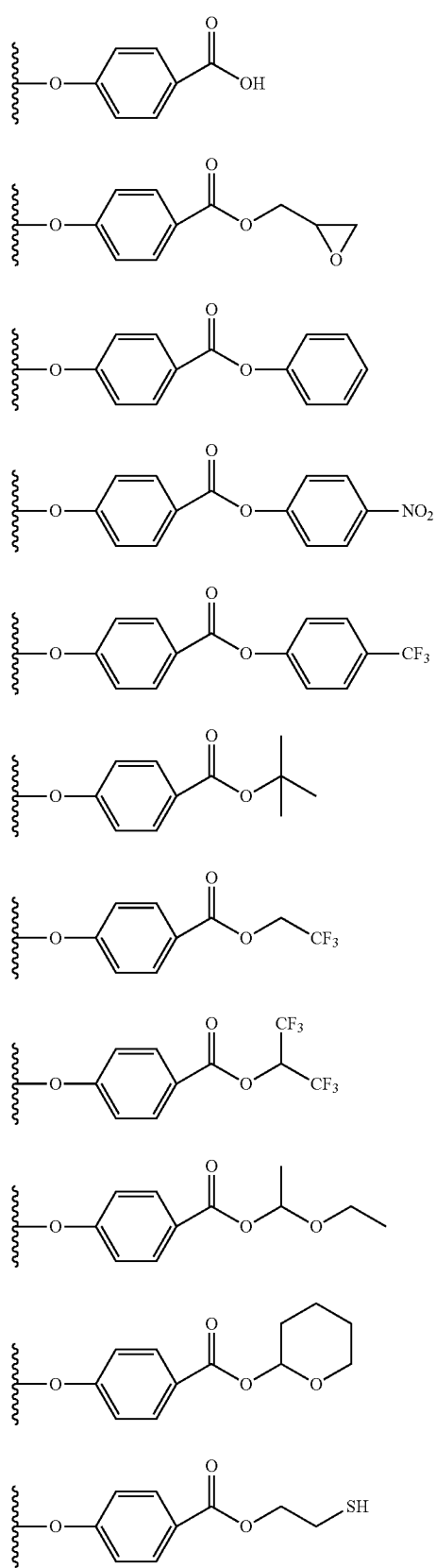
R-1 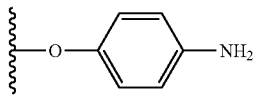
[Chemical Formula 16]
R-12
R-13 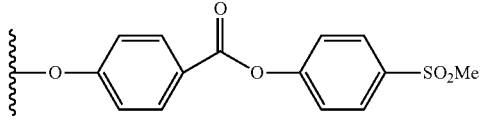
R-14 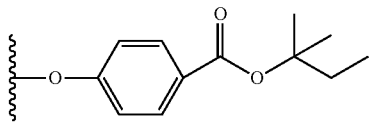
[Chemical Formula 17]
(S-1) 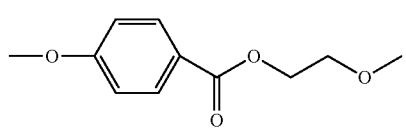
(S-2) 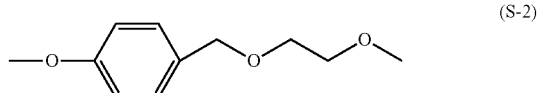
(S-3) 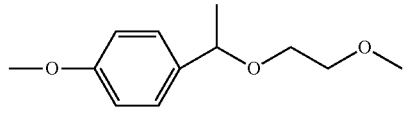
(S-4) 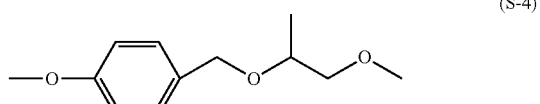
(S-5) 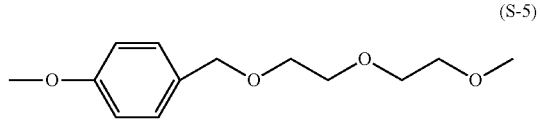
(S-6) 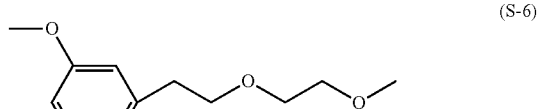
(S-7) 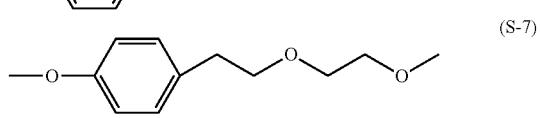
(S-8) 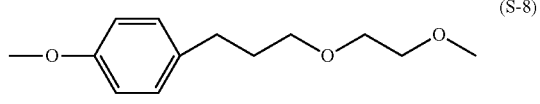
(S-9) 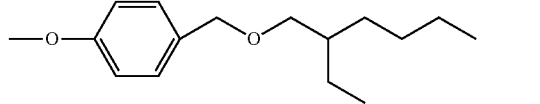
(S-10) 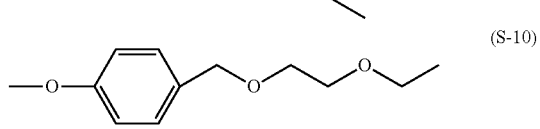

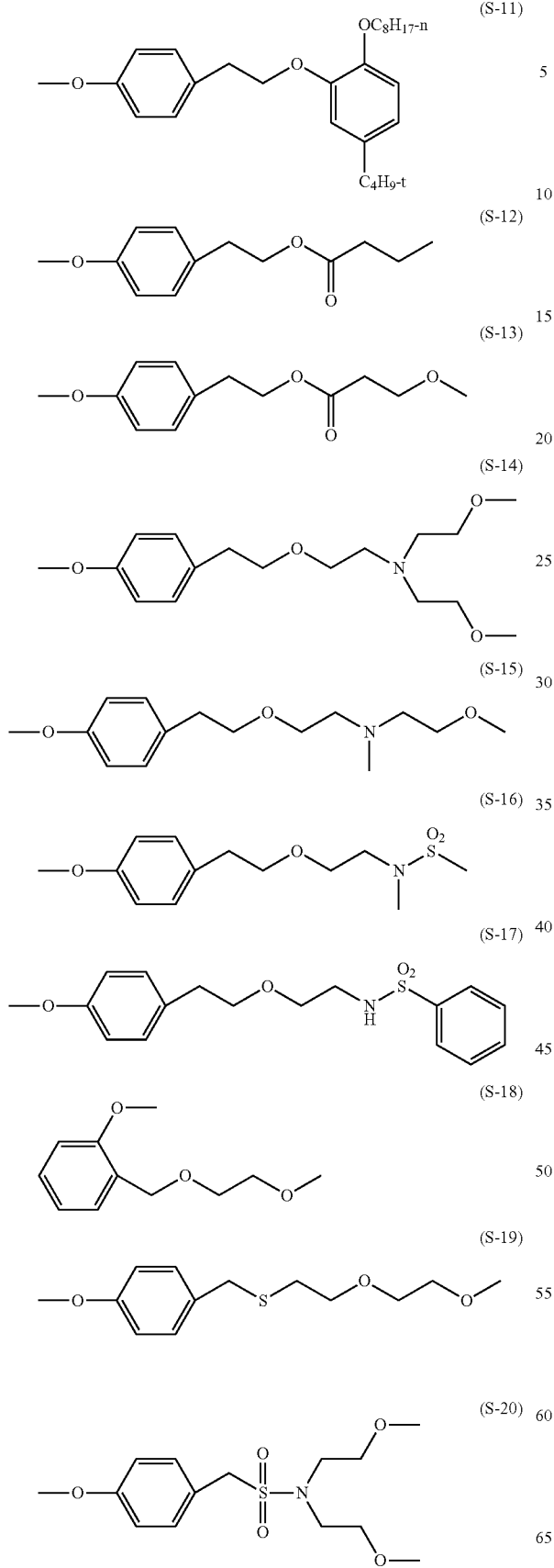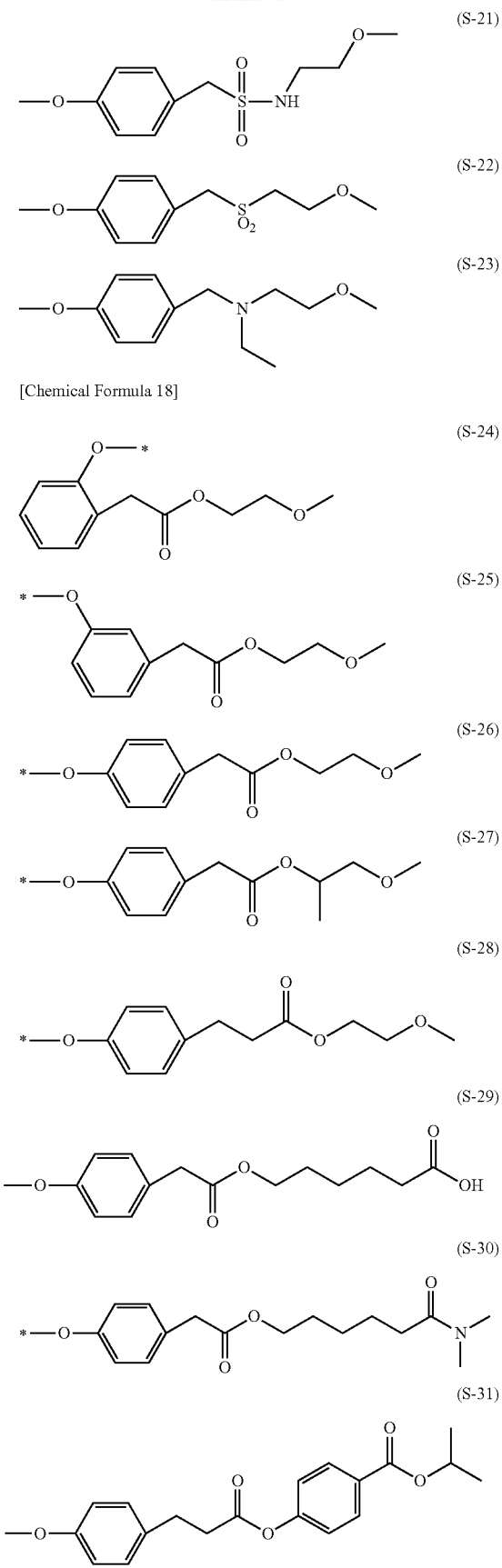

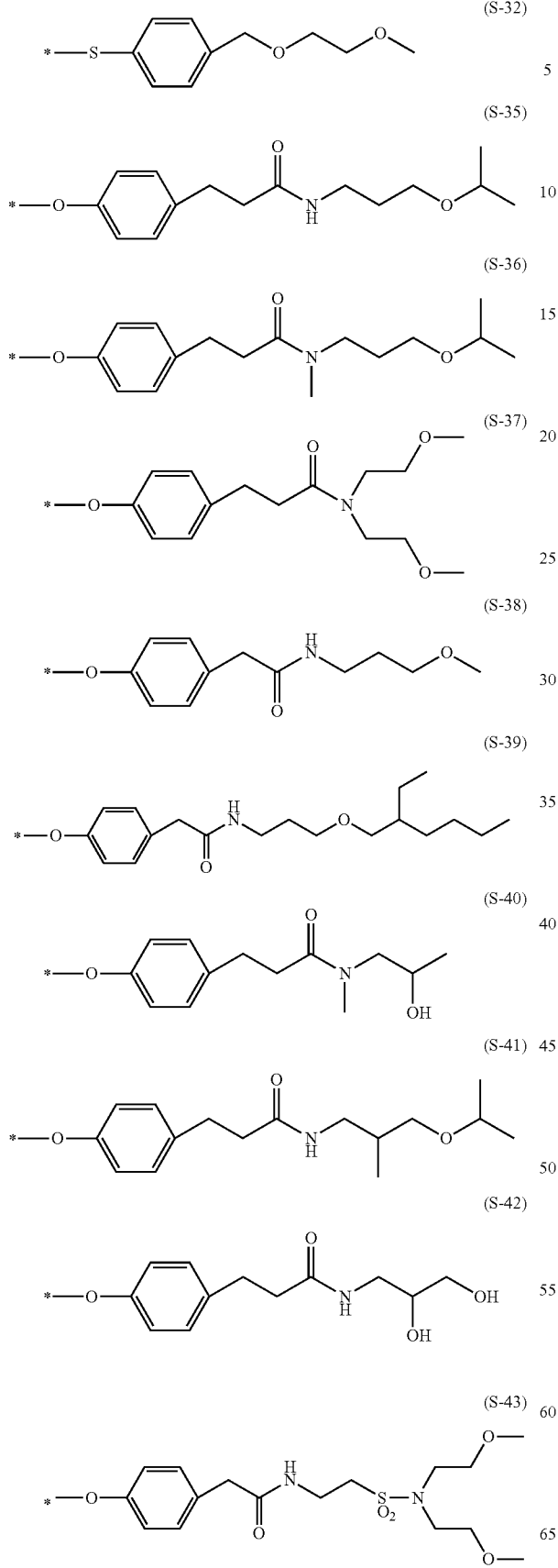
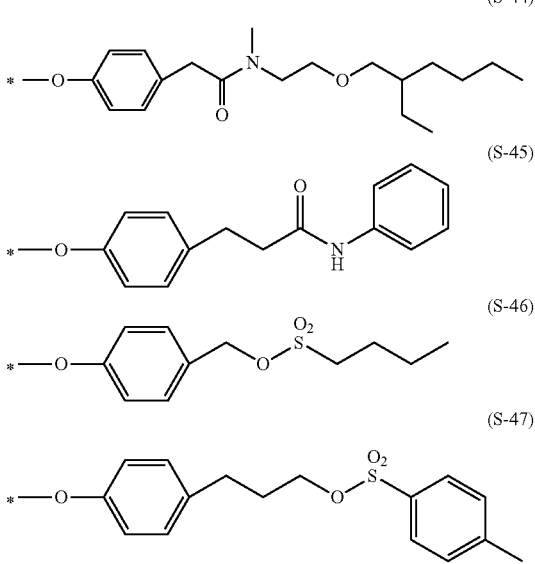

<Method for Manufacturing Phthalocyanine Dye>

The method for manufacturing the phthalocyanine dye used in this invention is arbitrarily selectable from known methods without special limitation. It is particularly preferable to use a method of cyclizing a phthalonitrile compound and a metal salt preferably in a molten state or in an organic solvent. Preferred embodiments of the method for manufacturing the phthalocyanine dye will be described below. Note, however, that this invention is by no means limited to the preferred embodiments explained below.

That is, the phthalocyanine dye may be manufactured by allowing:

a phthalonitrile compound (1) represented by the formula (I) below,

[Chemical Formula 19]

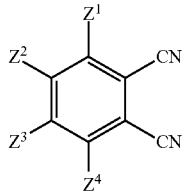

(I)

a phthalonitrile compound (2) represented by the formula (II) below,

[Chemical Formula 20]

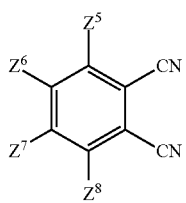

(II)

a phthalonitrile compound (3) represented by the formula (III) below,

[Chemical Formula 21]

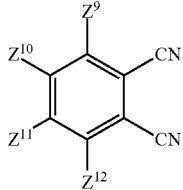

(III)

or a phthalonitrile compound (4) represented by the formula (IV) below,

[Chemical Formula 22]

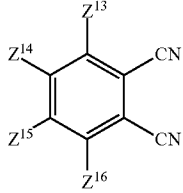

(IV)

to react with at least one species selected from the group consisting of metal atom, metal oxide, metal carbonyl, metal halide and organic acid metal (may collectively be referred to as "metal compounds" in this specification) to proceed a cyclization reaction.

Now in the formulae (I) to (IV), $Z^1$ to $Z^{16}$ are determined depending on a target structure of the phthalocyanine dye (1). More specifically, $Z^1$ to $Z^{16}$ in the formulae (I) to (IV) are synonymous to $Z^1$ to $Z^{16}$ in the formula (1), and will therefore be not explained again.

The cyclization reaction may follow any of known methods such as those described, for example, in JP-A-S64-45474.

In the above embodiment, the cyclization reaction is preferably proceeded by allowing the phthalonitrile compound represented by the formulae (I) to (IV) to react with one species selected from the group consisting of metal, metal oxide, metal carbonyl, metal halide and organic acid metal in a molten state of in an organic solvent. The metal, metal oxide, metal carbonyl, metal halide and organic acid metal usable in this process are not specifically limited so long as they can yield a matter equivalent to M in the formula (1-1). Accordingly, exemplified are metals such as iron, copper, zinc, vanadium, titanium, indium and tin; metal halides such as chloride, bromide and iodide of these metals; metal oxides such as vanadium oxide, titanium oxide and copper oxide; organic acid metals such as acetates; complex compounds such as acetyl acetonate; and metal carbonyls such as iron carbonyl, all of which having been enumerated in the section regarding M in the formula (1-1). More specifically, metals such as iron, copper, zinc, vanadium, titanium, indium, magnesium and tin; metal halides such as chloride, bromide and iodide of these metals, for example, vanadium chloride, titanium chloride, copper chloride, zinc chloride, cobalt chloride, nickel chloride, iron chloride, indium chloride, aluminum chloride, tin chloride, gallium chloride, germanium chloride, magnesium chloride, copper iodide, zinc iodide, cobalt iodide, indium iodide, aluminum iodide, gallium iodide, copper bromide, zinc bromide, cobalt bromide, aluminum bromide, gallium bromide; metal oxides such as vanadium monoxide, vanadium trioxide, vanadium tetroxide, vanadium pentoxide, titanium dioxide, iron monoxide, diiron trioxide, triiron tetroxide, manganese oxide, nickel monoxide, cobalt monoxide, cobalt tridioxide, cobalt dioxide, cuprous oxide, cupric oxide, dicopper trioxide, palladium oxide, zinc oxide, germanium monoxide, and germanium dioxide; organic acid metals such as copper acetate, zinc acetate, cobalt acetate, copper benzoate, and zinc benzoate; complex compounds such as acetyl acetonate; and metal carbonyls such as cobalt carbonyl, iron carbonyl, and nickel carbonyl. Among them, preferable examples include metal, metal oxide and metal halide, more preferable examples include metal halide, furthermore preferable examples include vanadium iodide, copper iodide and zinc iodide, and furthermore preferable examples include copper iodide and zinc iodide, and particularly zinc iodide. When zinc iodide is used, the central metal will be zinc as a consequence. The reason why iodide, among the metal halide, is preferably used is that the iodide is highly soluble in the solvent or resin, so that the obtainable phthalocyanine dye will show a sharp spectral peak, and the peak is likely to fall within the target wavelength range from 640 to 750 nm. Although the detailed mechanism of sharpening of the spectral peak when iodide is used in the cyclization reaction remains unclear, it is supposedly because, when iodide is used, iodine which remains in the phthalocyanine dye after the reaction will participate into some kind of interaction with the phthalocyanine dye, and can exist as being intercalated between layers of the phthalocyanine dye. The mechanism is, however, not limitative. In order to obtain an effect equivalent to that obtainable when the metal iodide is used for the cyclization reaction, the obtained phthalocyanine dye may be treated with iodine.

While the cyclization reaction in this embodiment can proceed under a solvent-free condition, it is preferable to use an organic solvent. Any arbitrary solvent showing a low, and preferably no, reactivity with the phthalonitrile compound as the starting material will suffice, and such solvent is exemplified by inert solvents such as benzene, toluene, xylene, nitrobenzene, monochlorobenzene, o-chlorotoluene, dichlorobenzene, trichlorobenzene, 1-chloronaphthalene, 1-methylnaphthalene, ethylene glycol, and benzonitrile; alcohols such as methanol, ethanol, 1-propanol, 2-propanol, 1-butanol, 1-hexanol, 1-pentanol, and 1-octanol; and aprotic polar solvents such as pyridine, N,N-dimethylformamide, N,N-dimethylacetamide, N-methyl-2-pyrrolidinone, N,N-dimethylacetophenone, triethylamine, tri-n-butylamine, and dimethylsulfoxide, sulfolane.

Among them, 1-chloronaphthalene, 1-methylnaphthalene, 1-octanol, dichlorobenzene and benzonitrile are preferably used, and 1-octanol, dichlorobenzene and benzonitrile are more preferably used. These solvents may be used independently, or two or more species thereof may be used in combination.

While conditions of reaction between any of the phthalonitrile compounds represented by the formulae (I) to (IV) and the metal compound are not specifically limited so long as the reaction can proceed thereunder. For example, the amount of charge, per 100 parts by mass of organic solvent, of the phthalonitrile compound represented by the formulae (I) to (IV) is 1 to 500 parts by mass, and preferably 10 to 350 parts by mass in total, and the amount of charge of the metal compound, per 4 mol of such phthalonitrile compound is preferably in the range from 0.8 to 2.0 mol, and more preferably from 0.8 to 1.5 mol. The reaction temperature of cyclization is preferably 30 to 250° C., and more preferably 80 to 200° C., although not specifically limited. The reaction time is preferably 3 to 20 hours, although not specifically limited. The reaction may be followed by filtration, washing and drying according to known methods of synthesizing phthalocyanine dyes, to thereby obtain the phthalocyanine dye usable for the succeeding steps efficiently in a high-purity state.

In this embodiment, the phthalonitrile compound represented by the formulae (I) to (IV), used as the starting material, may be synthesized by any of known methods, or may be commercially available.

The amount mixing of the phthalocyanine dye in the composition of this invention is preferably 20 to 70% by mass of the total solids, more preferably 30 to 60% by mass, and particularly 40 to 50% by mass.

The amount of mixing of the halogen atom-free phthalocyanine dye (also referred to as "non-halogenated phthalocyanine dye", hereinafter) in the composition of this invention is preferably 5% by mass or less of the total solids, and more preferably 1% by mass or less. With the amount of mixing controlled within these ranges, the effect of this invention may be obtained more efficiently.

<Other Colorants>

The composition of this invention may contain other colorant besides the phthalocyanine dye, and preferably contains such other colorant. Such other colorant preferably used here is a yellow coloring matter which may be dye or pigment or a mixed system of dye and pigment, wherein dye is preferable from the viewpoint of possibility of obtaining a composition in which the colorant is uniformly dissolved without using dispersant.

The pigment is exemplified by a variety of known inorganic or organic pigments. Whichever the inorganic pigment or organic pigment may be used, it is preferable to use a pigment having the possible smallest average particle size, considering that a higher transmittance is preferred. Also taking the handleability into consideration, the average particle size of the pigment is preferably 0.01 to 0.1 µm, and more preferably 0.01 to 0.05 µm.

The pigment preferably used in this invention is exemplified by C.I. Pigment Yellows 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214, wherein C.I. Pigment Yellow 150 (PY150) is particularly preferable.

These organic pigments may be used independently, or may be combined in various ways in order to improve color purity.

When the colorant in this invention is the dye, the obtainable colored curable composition will have the dye uniformly dissolved therein. Any of known dyes having been used for color filters are usable without special limitation.

On the basis of chemical structure, the dye is exemplified by azo-base dye (e.g., C.I. solvent yellow 162), and methine-base dye (C.I. solvent yellow 93).

The methine-base dye is preferably a monomethine dye, and more preferably a monomethine dye represented by the formula (5) below.

[Chemical Formula 23]

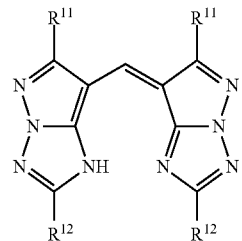

Formula (5)

(In the formula (5), each $R^{11}$ independently represents an alkyl group or vinyl group, and each $R^{12}$ independently represents an aromatic ring group having a substituent.)

$R^{11}$ preferably represents an alkyl group having 1 to 12 carbon atoms, and more preferably represents an alkyl group having 1 to 6 carbon atoms.

$R^{12}$ preferably represents a phenyl group or naphthyl group, and the substituent is preferably an alkylsulfonylamino group, vinylsulfonylamino group, arylsulfonylamino group, alkylcarbonylamino group, vinylcarbonylamino group, or arylcarbonylamino group, wherein alkylsulfonylamino group is particularly preferable. The alkyl group having 1 to 12 carbon atoms may have an unsaturated bond, and such substituent is exemplified by allylsulfonylamino group.

As the colorant, acidic dye and/or derivatives may preferably be used.

Also direct dye, basic dye, mordant dye, acidic mordant dye, azoic dye, disperse dye, oil color, food color, and/or derivatives of them are advantageous for use.

The acidic dye will specifically be exemplified below, but not limited thereto. Exemplified are acid yellows 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, and 251.

Also exemplified are Direct Yellows 2, 33, 34, 35, 38, 39, 43, 47, 50, 54, 58, 68, 69, 70, 71, 86, 93, 94, 95, 98, 102, 108, 109, 129, 136, 138, and 141; Food Yellows 3; Mordant Yellows 5, 8, 10, 16, 20, 26, 30, 31, 33, 42, 43, 45, 56, 50, 61, 62, and 65; and derivatives of these dyes.

The yellow coloring matter used in this invention is particularly azo-base dye and/or methine-base dye.

The amount of mixing of the colorant, which includes the phthalocyanine dye and the yellow coloring matter, in the composition used in this invention is preferably 50 to 90% by mass relative to the total solids of the composition of this invention, preferably 60 to 85% by mass, and more preferably 65 to 80% by mass.

For an exemplary case where the yellow coloring matter is a dye, the amount of mixing of the colorant, which includes the phthalocyanine dye and the yellow coloring matter, in the composition used in this invention is preferably 50 to 90% by mass relative to the total solids of the composition of this invention, preferably 60 to 85% by mass, and more preferably 70 to 80% by mass.

For another exemplary case where the yellow coloring matter is a pigment, the amount of mixing of the colorant, which includes the phthalocyanine dye and the yellow coloring matter, in the composition used in this invention is preferably 50 to 90% by mass relative to the total solids of the composition of this invention, preferably 60 to 85% by mass, and more preferably 65 to 85% by mass.

<Pigment Dispersion>

The pigment, intended to be used for preparing the composition of this invention, is preferably given in the form of pigment dispersion. From the viewpoint of improving dispersibility of the pigment, it is further preferable to add a pigment dispersant.

The pigment dispersant usable in this invention is exemplified by polymer dispersant [e.g., polyamideamine and salt thereof, polycarboxylic acid and salt thereof, high-molecular-weight unsaturated acid ester, modified polyurethane, modified polyester, modified poly(meth)acrylate, (meth)acrylic copolymer, naphthalenesulfonic acid-formalin condensate], and, polyoxyethylene alkylphosphate ester, polyoxyethylene alkylamine, alkanolamine, and pigment derivative.

The polymer dispersant is structurally classified into straight-chain polymer, terminal-modified polymer, graft-type polymer, and block-type polymer.

The polymer dispersant adheres to the surface of the pigment, and acts to prevent re-flocculation. Accordingly, preferred structure thereof is exemplified by the terminal-modified polymer, graft-type polymer, and block-type polymer, each having a moiety to be anchored on the surface of the pigment.

Meanwhile, the pigment derivative demonstrates an effect of promoting adsorption of the polymer dispersant, through modifying the surface of the pigment.

The pigment dispersant usable in this invention is also commercially available, which is specifically exemplified by "Disperbyk-101 (polyamideamine phosphate), 107 (carboxylic ester), 110 (acid group-containing copolymer), 130 (polyamide), 161, 162, 163, 164, 165, 166, 170 (high-molecular-weight copolymers)", and "BYK-P104, P105 (high-molecular-weight unsaturated polycarboxylic acids)", all from BYK-Chemie GmbH; "Efka 4047, 4050, 4010, 4165 (polyurethane-base), Efka 4330 to 4340 (block copolymer), 4400 to 4402 (modified polyacrylate), 5010 (polyesteramide), 5765 (high-molecular-weight polycarboxylic acid salt), 6220 (fatty acid polyester), 6745 (phthalocyanine derivative), and 6750 (azo pigment derivative)", all from EFKA; "Ajisper PB821, PB822" from Ajinomoto Fine-Techno Co., Inc.; "Flowren TG-710 (urethane oligomer)", "Polyflow No. 50E, No. 300 (acrylic copolymer)", from Kyoeisha Chemical Co., Ltd.; "Disperlon KS-860, 873SN, 874, #2150 (aliphatic polybasic carboxylic acids), #7004 (polyether ester), DA-703-50, DA-705, DA-725", all from Kusumoto Chemicals, Ltd.; "Demol RN, N (naphthalene-sulfonic acid-formalin condensates), MS, C, SN—B (aromatic sulfonic acid-formalin condensates)", "Homogenol L-18 (polymer polycarboxylic acid)", "Emulgen 920, 930, 935, 985 (polyoxyethylene nonyl phenyl ethers)", "Acetamin 86 (stearylamine acetate)", all from KAO Corporation; "Solsperse 5000 (phthalocyanine derivative), 22000 (azo pigment derivative), 13240 (polyester amine), 3000, 17000, 27000 (terminal-functionalized polymers), 24000, 28000, 32000, 38500 (graft-type polymers)", all from The Lubrizol Corporation; and "Nikkol T106 (polyoxyethylene sorbitan monooleate), MYS-IEX (polyoxyethylene monostearate)", from Nikko Chemicals Co., Ltd.

Also dispersant described in paragraphs [0028] to [0124] of JP-A-2011-070156, or dispersant described in JP-A-2007-277514 are preferably used, the contents of which are incorporated into this specification.

These pigment dispersant may be used independently, or two or more species thereof may be used in combination. In this invention, it is particularly preferable to use the pigment derivative and the polymer dispersant in combination.

The content of the pigment dispersant in the composition of this invention is preferably 1 to 80 parts by mass per 100 parts by mass of pigment as the colorant, more preferably 5 to 70 parts by mass, and furthermore preferably 10 to 60 parts by mass.

For a specific case where the polymer dispersant is used, the amount of consumption preferably falls in the range from 5 to 100 parts by mass on a mass basis per 100 parts by mass of pigment, and more preferably falls in the range from 10 to 80 parts by mass.

For an exemplary case where the pigment derivative is used in combination, the amount of consumption of the pigment derivative preferably falls in the range from 1 to 30 parts by mass on a mass basis per 100 parts by mass of pigment, and more preferably falls in the range from 3 to 20 parts by mass, and furthermore preferably from 5 to 15 parts by mass.

Pigment Derivative

For an exemplary case where the pigment is contained as the colorant, it is preferable for the composition to further contain a pigment derivative, in order to improve adsorptivity of the dispersed resin onto the pigment. The pigment derivative is a compound configured by substituting a part of the organic pigment with an acidic group, basic group of a phthalimidemethyl group. Pigment derivative having an acidic group or basic group is preferably contained as the pigment derivative, from the viewpoint of dispersibility and dispersion stability.

The organic pigment for configuring the pigment derivative is exemplified by diketopyrrolopyrrole-base pigment, azo-base pigment, phthalocyanin-base pigment, anthraquinone-base pigment, quinacridone-base pigment, dioxazine-base pigment, perinone-base pigment, perylene-base pigment, thioindigo-base pigment, isoindoline-base pigment, isoindolinone-base pigment, quinophthalone-base pigment, threne-base pigment, and metal complex-base pigment.

The acidic group possessed by the pigment derivative is preferably sulfonic acid group, carboxylic acid group and quaternary ammonium salt group thereof, more preferably carboxylic acid group or sulfonic acid group, and furthermore preferably sulfonic acid group. The basic group possessed by the pigment derivative is preferably amino group, and particularly tertiary amino group.

As the pigment derivative, quinoline-base, benzimidazolone-base and isoindoline-base pigment derivatives are particularly preferable, wherein quinoline-base and benzimidazolone-base pigment derivatives are more preferable. In particular, pigment derivative having the structure below is preferable.

[Chemical Formula 24]

In the formula (P), A represents a partial structure selected from those represented by the formulae (PA-1) to (PA-3) below. B represents a single bond, or (t+1)-valent linking group. C represents a single bond, —NH—, —CONH—, —CO$_2$—, —SO$_2$NH—, —O—, —S— or —SO$_2$—. D represents a single bond, alkylene group, cycloalkylene group or arylene group. E represents —SO$_3$H, —SO$_3$M (M represents an alkali metal atom), —CO$_2$H or —N(Rpa)(Rpb). Each of Rpa and Rpb independently represents an alkyl group or aryl group, where Rpa and Rpb may combine with each other to form a ring. t represents an integer of 1 to 5.

[Chemical Formula 25]

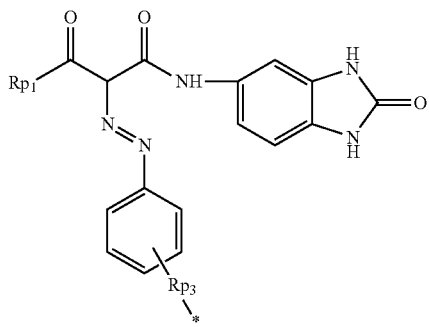
(PA-1)

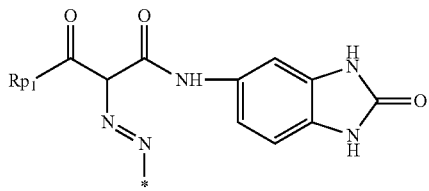
(PA-2)

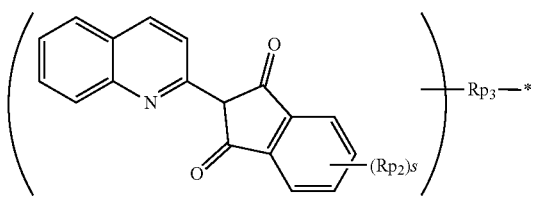
(PA-3)

In the formulae (PA-1) and (PA-2), Rp1 represents an alkyl group or aryl group having 1 to 5 carbon atoms. In the formula (PA-3), Rp2 represents a hydrogen atom, halogen atom, alkyl group, or hydroxy group. s represents an integer of 1 to 4. When s is 2 or larger, a plurality of (Rp2) s may be same or different. In the formulae (PA-1) and the formula (PA-3), Rp3 represents a single bond, —NH—, —CONH—, —CO$_2$—, —SO$_2$NH—, —O—, —S— or —SO$_2$—. * represents a linking site with B.

In the formula (P), Rp1 particularly represents a methyl group or phenyl group, and more preferably represents a methyl group. In the formula (PA-3), Rp2 preferably represents a hydrogen atom or halogen atom, and more preferably represents a hydrogen atom or chlorine atom.

In the formula (P), the (t+1)-valent linking group represented by B is exemplified by alkylene group, cycloalkylene group, arylene group and heteroarylene group. Among them, linking groups represented by the structural formulae (PA-4) to (PA-9) below are preferable.

[Chemical Formula 26]

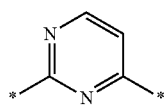
(PA-4)

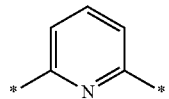
(PA-5)

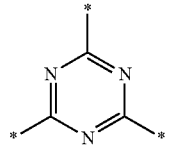
(PA-6)

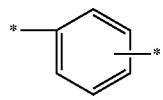
(PA-7)

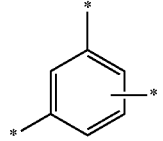
(PA-8)

(PA-9)

The pigment derivative having, particularly as B, the linking group represented by the structural formula (PA-5) or (PA-8), out of the structural formulae (PA-4) to (PA-9), is preferable from the viewpoint of dispersibility.

In the formula (P), the alkylene group, cycloalkylene group and arylene. group, represented by D, are exemplified by methylene, ethylene, propylene, butylene, pentylene, hexylene, decylene, cyclopropylene, cyclobutylene, cyclopentylene, cyclohexylene, cyclooctylene, cyclodecylene, phenylene, and naphthylene groups. Alkylene group is particularly preferable as D, and alkylene group having 1 to 5 carbon atoms is more preferable.

In the formula (P), when E represents —N (Rpa) (Rpb), the alkyl group and aryl group represented by Rpa and Rpb are exemplified by methyl group, ethyl group, propyl group, isopropyl group, butyl group, sec-butyl group, tert-butyl group, pentyl group, isopentyl group, neopentyl group, hexyl group, octyl group, decyl group, cyclopropyl group, cyclobutyl group, cyclopentyl group, cyclohexyl group, cyclooctyl group, cyclodecyl group, phenyl group, and naphthyl group. Each of Rpa and Rpb more preferably represents an alkyl group, and more preferably represents an alkyl group having 1 to 5 carbon atoms. t preferably represents 1 or 2.

Specific examples of the pigment derivative will be enumerated below, without limiting this invention. In the specific examples below, M represents an alkali metal (Na, K, etc.).

[Chemical Formula 27]
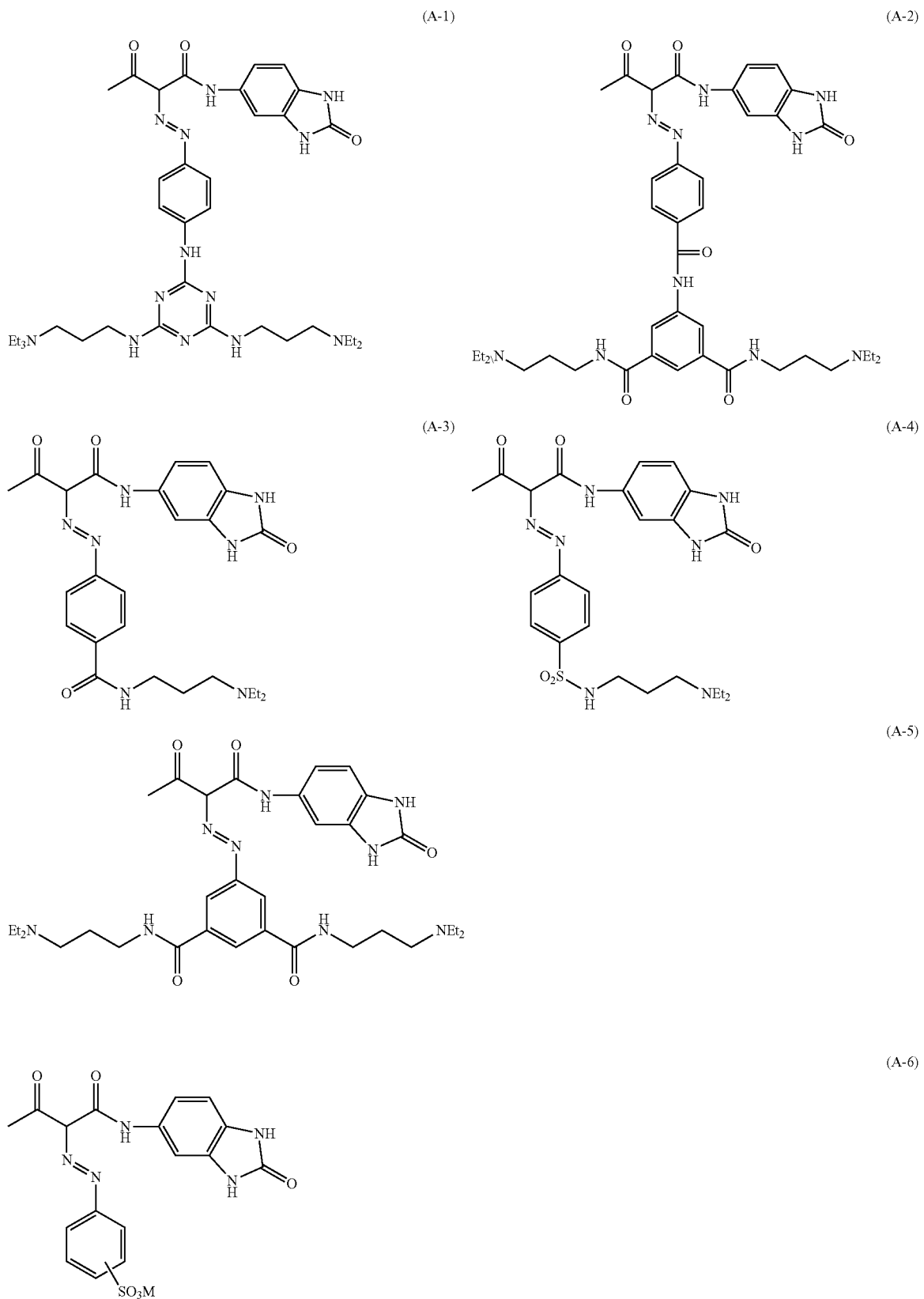

-continued
(A-7)
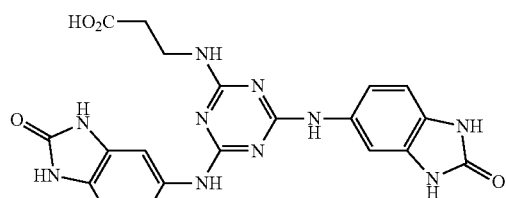
[Chemical Formula 28]
(A-8)
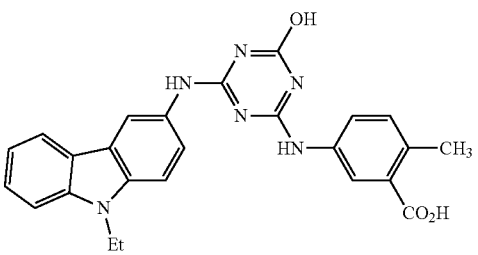
(A-9)
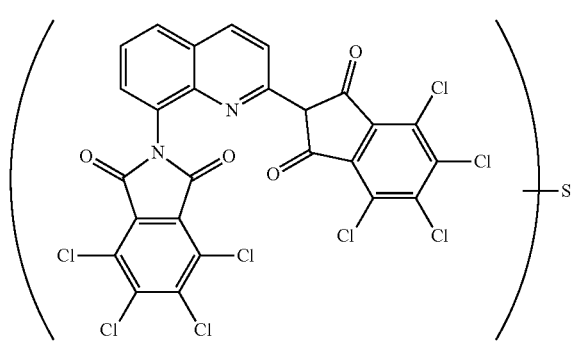
(A-10)
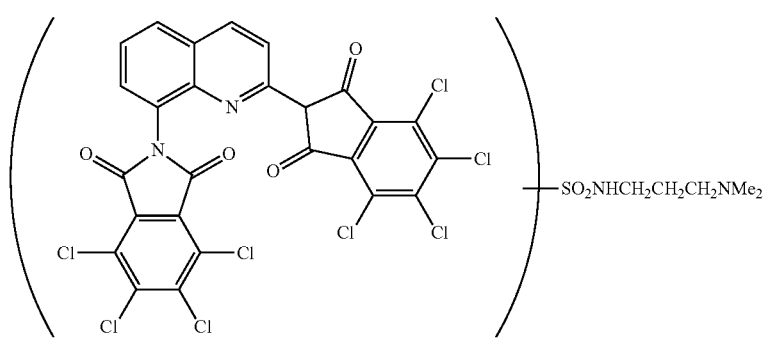
(A-11)
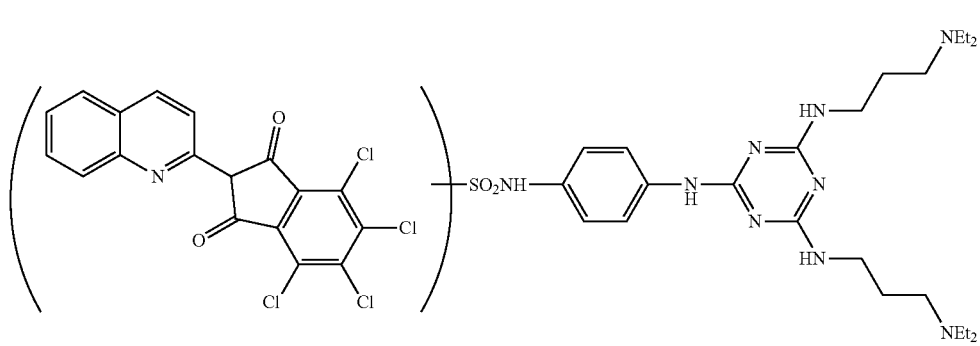
(A-12)
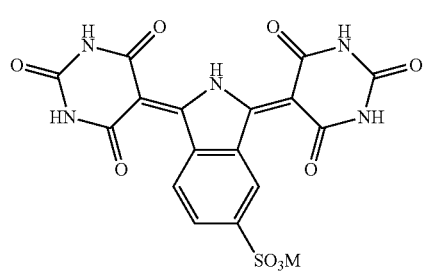
(A-13)
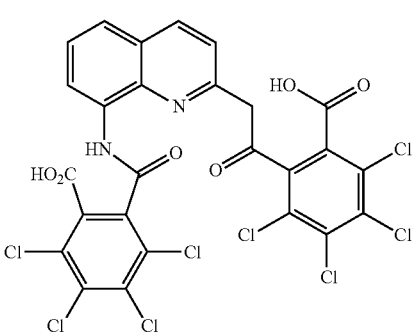

(A-14)
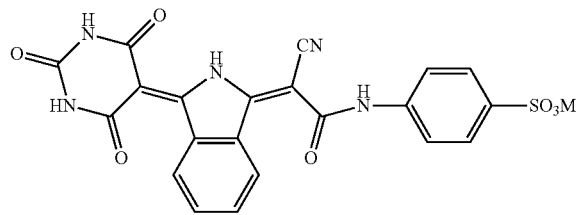
(A-15)
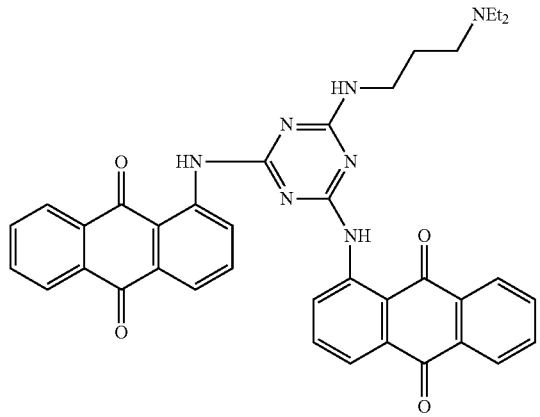
(A-16)
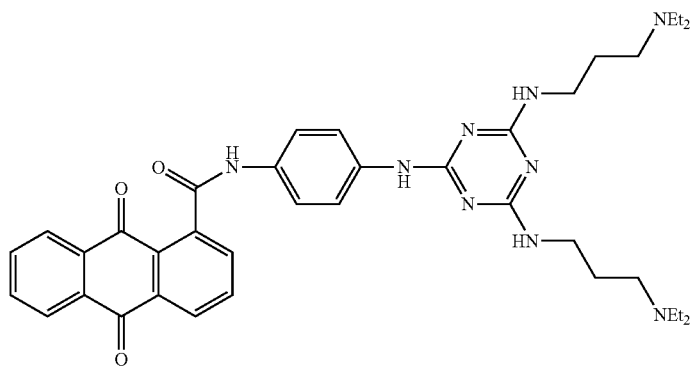
(A-17)
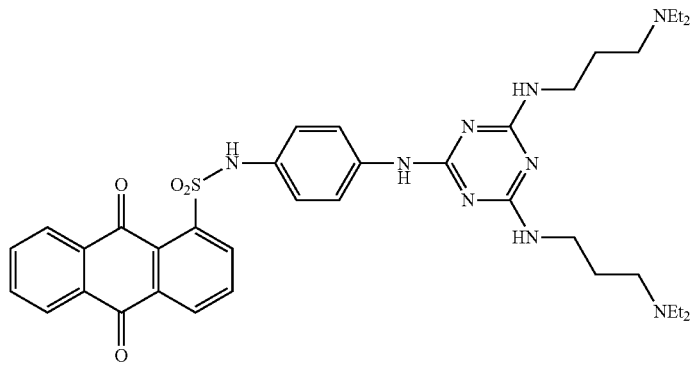
(A-18)
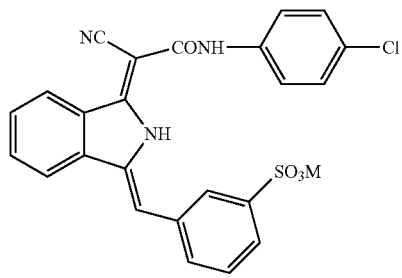

[Chemical Formula 29]
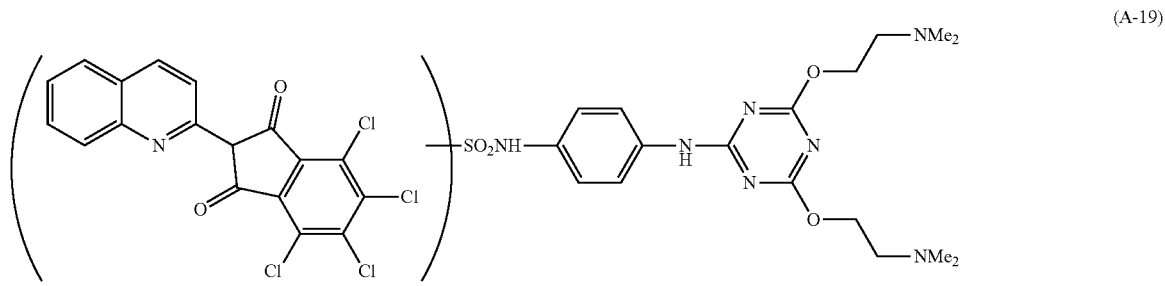
(A-19)
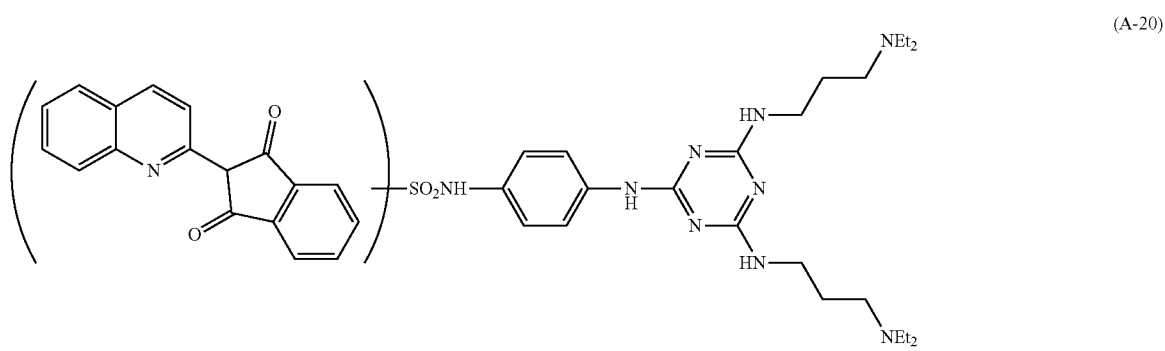
(A-20)
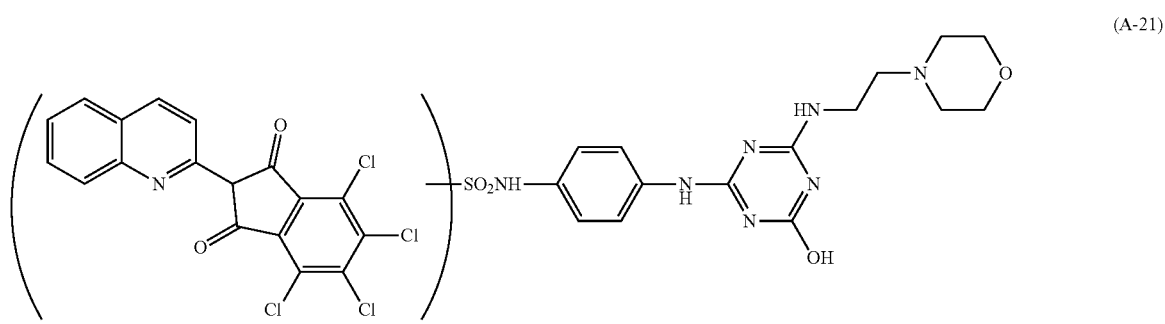
(A-21)
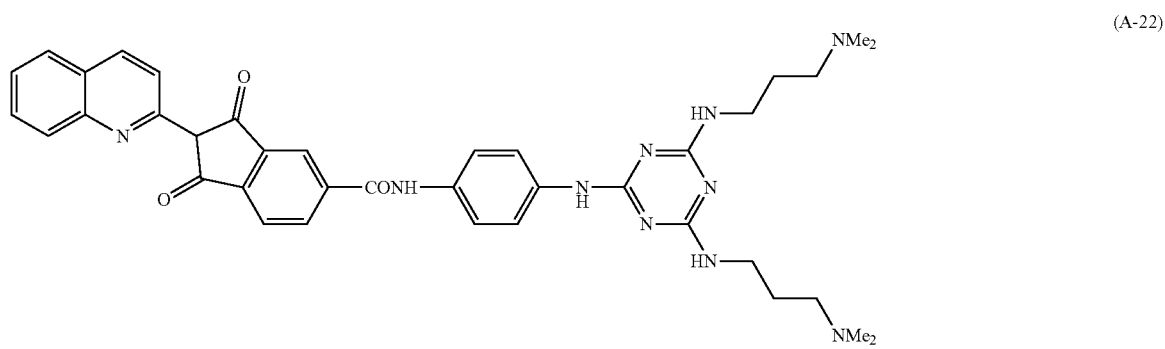
(A-22)

-continued
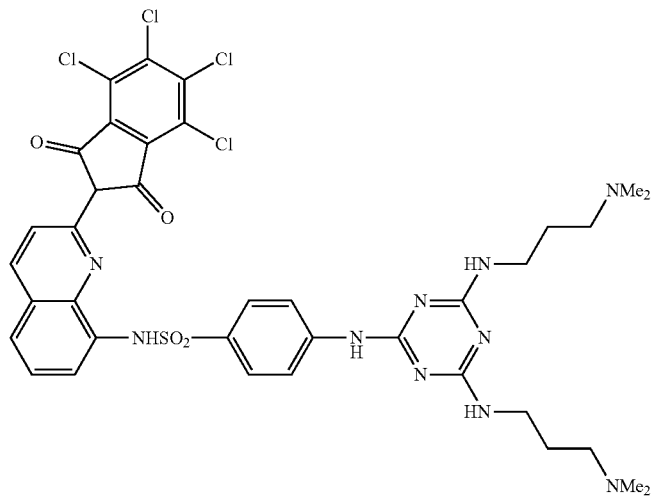
(A-23)
[Chemical Formula 30]
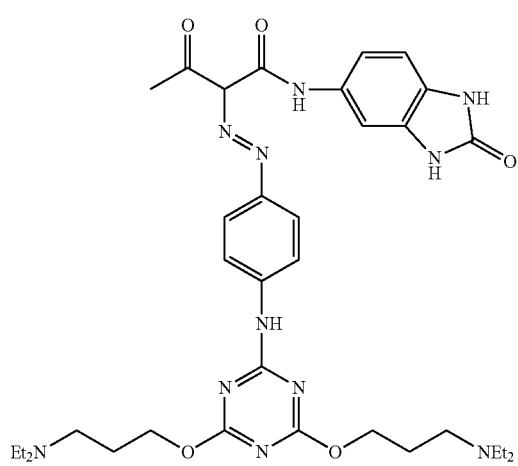
(A-24)
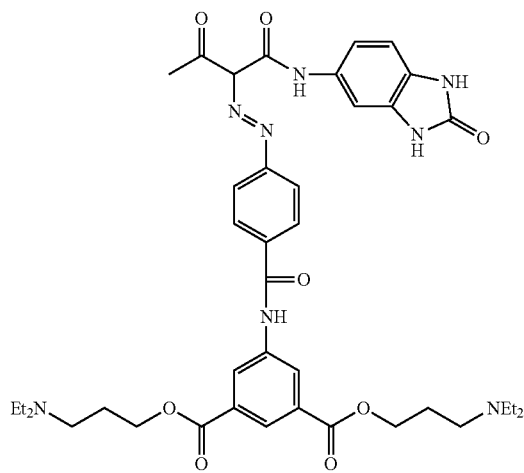
(A-25)
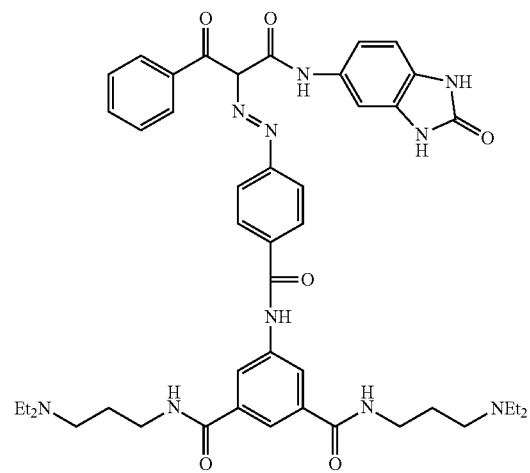
(A-26)

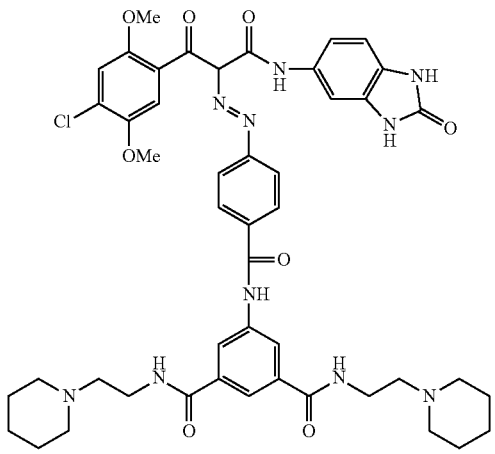 (A-27)

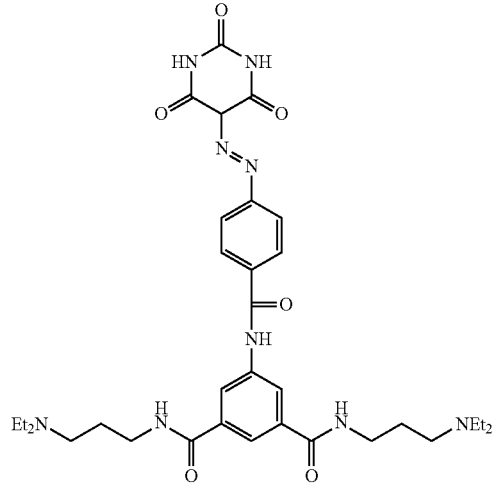 (A-28)

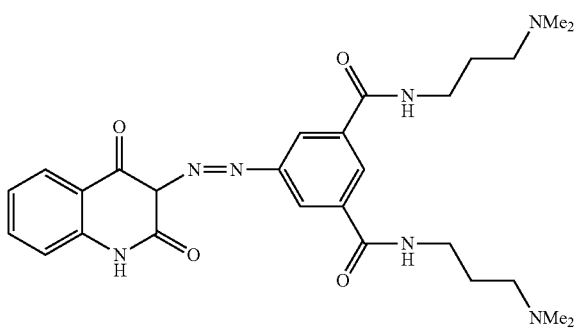 (A-29)

Among these pigment derivatives, (A-1), (A-2), (A-5), (A-9), (A-10), (A-11), (A-19), (A-20), (A-21), (A-22), (A-23), (A-24) and (A-25) are preferable; and (A-1), (A-2), (A-9), (A-10) and (A-23) are more preferable.

The content of the pigment derivative in the colored curable composition of this invention is preferably 1 to 30% by mass of the total mass of the pigment, and more preferably 3 to 20% by mass. The pigment derivatives may be used independently, or two or more species thereof may be used in combination.

—Solvent—

The solvent in the pigment dispersion is not specifically limited, so long as it is organic solvent generally used for pigment-dispersed composition. The solvent is exemplified by 1-methoxy-2-propyl acetate, 1-methoxy-2-propanol, ethylene glycol monomethyl ether, diethylene glycol monomethyl ether, ethyl acetate, butyl acetate, ethyl lactate, acetone, methyl ethyl ketone, methyl isobutyl ketone, cyclohexanone, n-propanol, 2-propanol, n-butanol, cyclohexanol, ethylene glycol, diethylene glycol, toluene, and xylene. Two or more of these solvents may be used in combination, in order to control the melting point, viscosity, and dispersibility of pigment.

The content of the solvent in the pigment dispersion may arbitrarily be selected, depending on the purposes of use and so forth of the pigment dispersion.

The content of the pigment dispersion, when used for preparing the colored curable composition described later, is determined so that the total contents of the pigment and the pigment dispersant accounts for 5 to 50% by mass of the total mass, but excluding the solvent, of the pigment dispersion, from the viewpoint of handleability.

The content of the colorant may be determined so long as the effect of the invention will not be ruined, and is preferably 10 to 55% by mass relative to the total solids of the colored curable composition of this invention, and more preferably 15 to 45% by mass. The colorant is preferably added to the colored curable composition, so that the ratio of absorption intensities (absorption at 450 nm/absorption at 650 nm) falls within the range from 0.95 to 1.05.

<Epoxy Group-Containing Compound>

The composition of this invention contains at least one species of epoxy group-containing compound. The epoxy group-containing compound used in this invention preferably has two or more epoxy groups in a single molecule. By using the compound having two or more epoxy groups in a single molecule, the effect of this invention will be obtained more efficiently.

The epoxy group-containing compound used in this invention preferably has an epoxy equivalent (=molecular weight of epoxy group-containing compound/the number of epoxy groups) of 500 g/eq or below, more preferably 100 to 400 g/eq, and furthermore preferably 100 to 300 g/eq. By setting the upper limit value of the epoxy equivalent of the epoxy group-containing compound used in this invention to 500 g/eq or below, the effects of this invention, regarding rapid curability of the colored curable composition and a good chemical resistance, will be demonstrated efficiently. Meanwhile, the lower limit of the epoxy equivalent of the epoxy group-containing compound used in this invention is preferably set to 100 g/eq or above, from the viewpoint of practical stability.

The epoxy group-containing compound used in this invention may be either a low-molecular-weight compound (e.g., with a molecular weight of smaller than 2000, and even smaller than 1000), or a high-molecular-weight compound (macromolecule) (e.g., with a molecular weight of 1000 or larger, and with a weight-average molecular weight of 1000 or larger if the compound is a polymer). In this invention, the epoxy group-containing compound more preferably has a molecular weight of 200 to 100000. In this invention, the compound having two or more epoxy groups in a single molecule, and having a molecular weight of 200 or larger, (more preferably, with a molecular weight of 100000 or smaller) is particularly preferable.

The epoxy compound, if being a low-molecular-weight compound, is exemplified by a compound represented by the formula (EP1) below.

[Chemical Formula 31]

(EP1)

In the formula (EP1), each of $R^{EP1}$ to $R^{EP3}$ independently represents a hydrogen atom, halogen atom, or alkyl group, wherein the alkyl group may have a cyclic structure, or may have a substituent. $R^{EP1}$ and $R^{EP2}$, or, $R^{EP2}$ and $R^{EP3}$ may combine with each other to form a cyclic structure. The substituent which may be possessed by the alkyl group is exemplified by hydroxy group, cyano group, alkoxy group, alkylcarbonyl group, alkoxycarbonyl group, alkylcarbonyloxy group, alkylthio group, alkylsulfone group, alkylsulfonyl group, alkylamino group, and alkylamide group.

$Q^{EP}$ represents a single bond or $(n^{EP})$-valent organic group. $R^{EP1}$ to $R^{EP3}$ may also combine with $Q^{EP}$ to form a cyclic structure.

$n^{EP}$ represents an integer of 2 or larger, preferably 2 to 10, and more preferably 2 to 6. When $Q^{EP}$ represents a single bond, $n^{EP}$ is 2.

$Q^{EP}$ when being an $(n^{EP})$-valent organic group is exemplified by chain-like or cyclic $(n^{EP})$-valent saturated hydrocarbon group (preferably having 2 to 20 carbon atoms); $(n^{EP})$-valent aromatic ring group (preferably having 6 to 30 carbon atoms); and $(n^{EP})$-valent organic group configured by chain-like or cyclic saturated hydrocarbon or aromatic hydrocarbon, which is bound with divalent linking group such as ether group, ester group, amide group, sulfonamide group, alkylene group (preferably having 1 to 4 carbon atoms, and more preferably methylene group), or bound with trivalent linking group such as —N(—)$_2$, or bound with any combination of them.

Specific examples of the epoxy group-containing compound will be enumerated below, without limiting this invention.

[Chemical Formula 32]

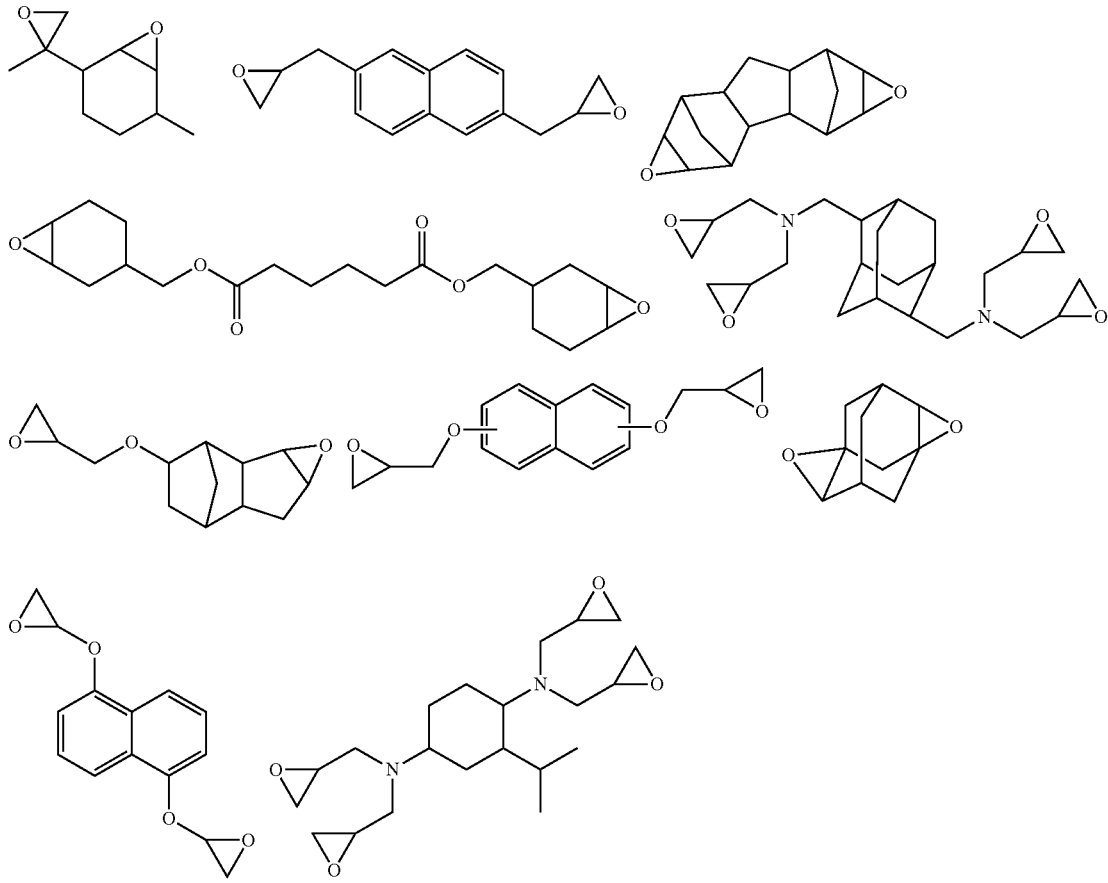

-continued
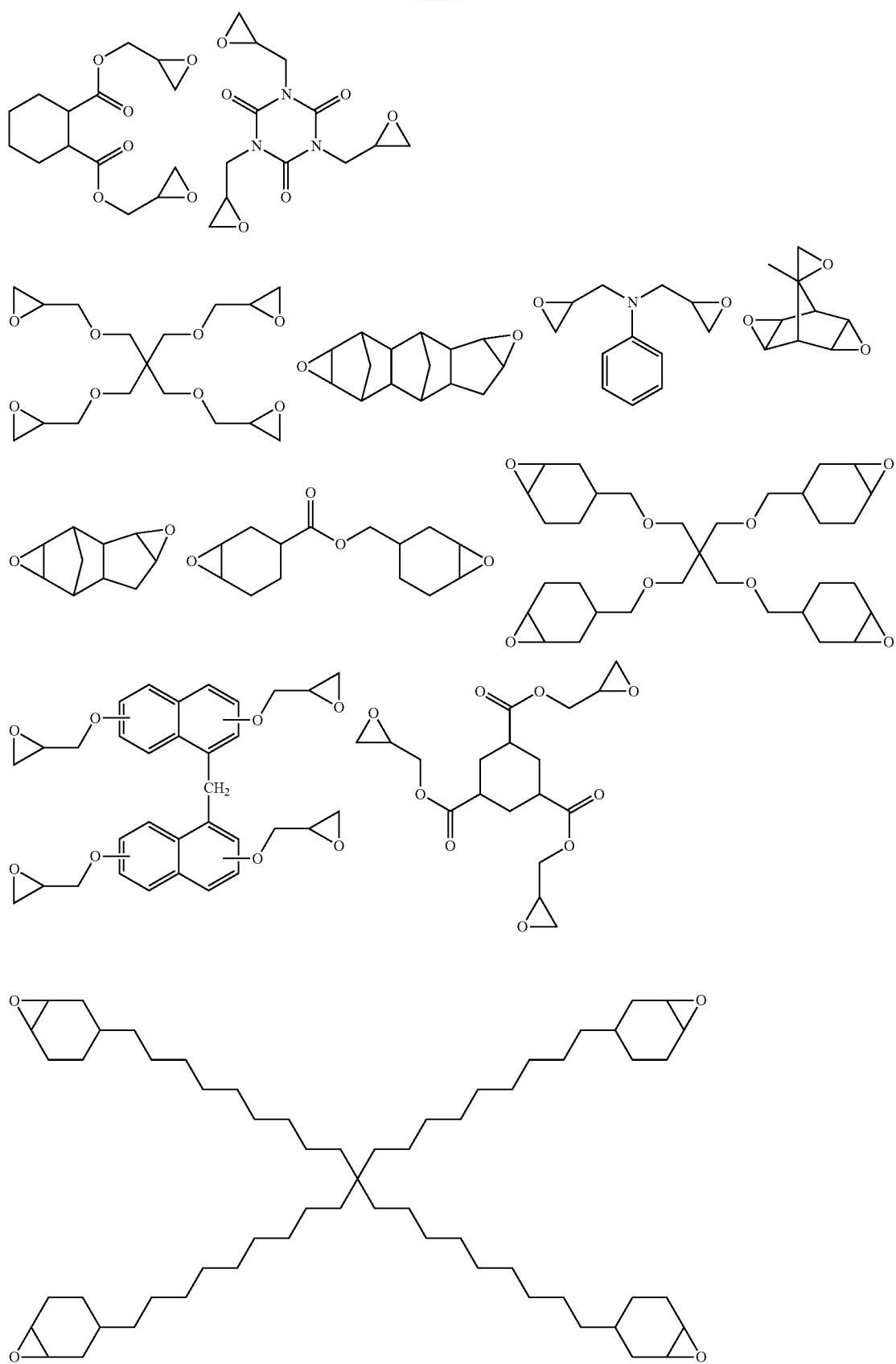

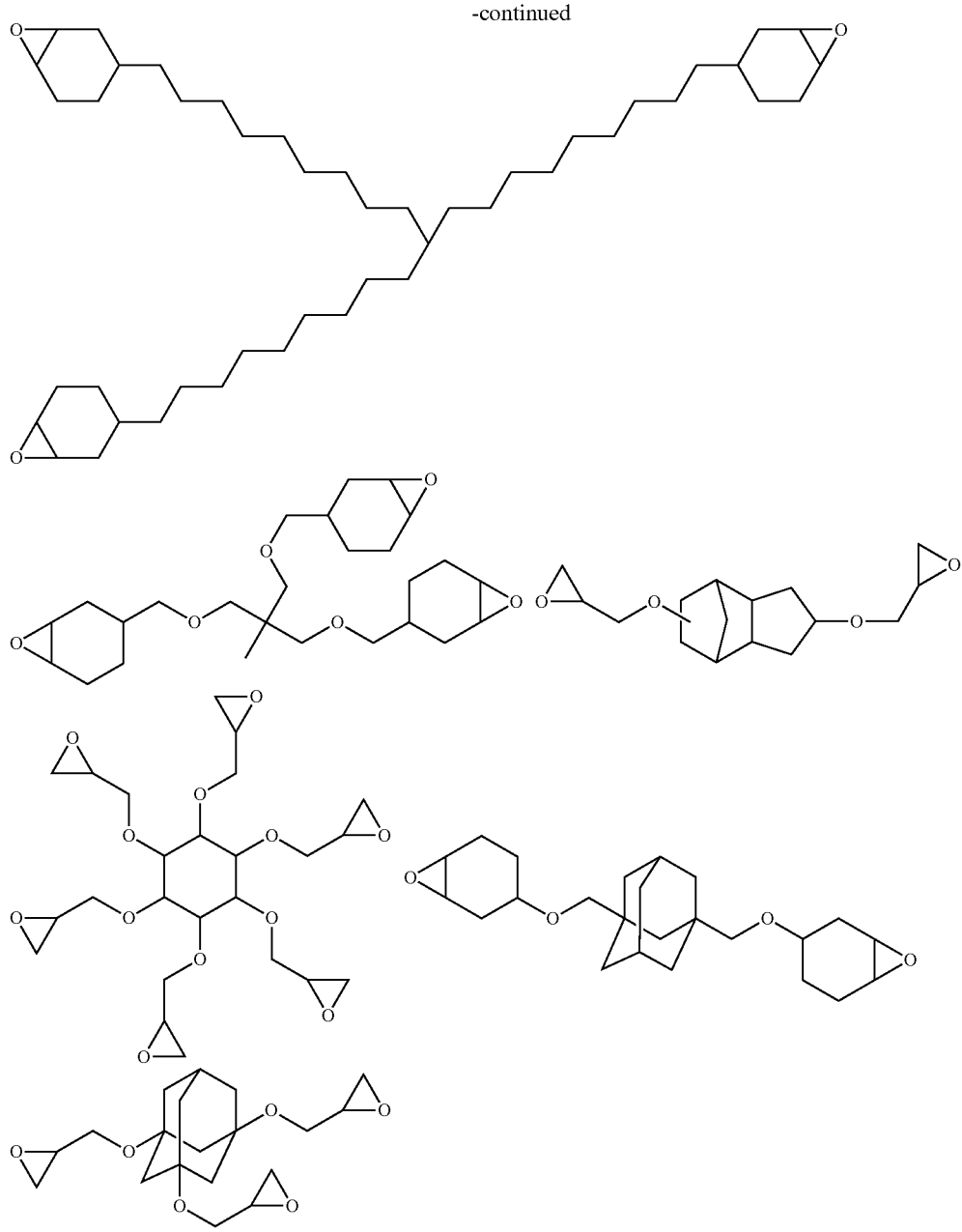

Also oligomer or polymer, having epoxy group in the side chain thereof, are usable as the epoxy group-containing compound used in this invention. This type of compound is exemplified by bisphenol A epoxy resin, bisphenol F epoxy resin, phenol novolac epoxy resin, cresol novolac epoxy resin, and aliphatic epoxy resin.

These compounds are commercially available, or may be obtained by introducing epoxy groups into side chains of polymer.

Commercially available bisphenol A epoxy resin is exemplified by JER827, JER828, JER834, JER1001, JER1002, JER1003, JER1055, JER1007, JER1009, JER1010 (all from Japan Epoxy Resin Co., Ltd.), EPICLON860, EPICLON1050, EPICLON1051, EPICLON1055 (all from DIC Corporation); bisphenol F epoxy resin is exemplified by JER806, JER807, JER4004, JER4005, JER4007, JER4010 (all from Japan Epoxy Resin Co., Ltd.), EPICLON830, EPICLON835 (all from DIC Corporation), LCE-21, RE-602S (all from Nippon Kayaku Co., Ltd.); phenol novolac epoxy resin is exemplified by JER152, JER154, JER157S70, JER157S65 (all from Japan Epoxy Resin Co., Ltd.), EPICLON N-740, EPICLON N-770, EPICLON N-775 (all from DIC Corporation); cresol novolac epoxy resin is exemplified by EPICLON N-660, EPICLON N-665, EPICLON N-670, EPICLON N-673, EPICLON N-680, EPICLON N-690, EPICLON N-695 (all from DIC Corporation), EOCN-1020 (from Nippon Kayaku Co., Ltd.); and aliphatic epoxy resin is exemplified by ADEKA RESIN EP-4080S, ditto EP-4085S, ditto EP-4088S (all from ADEKA Corporation), Celloxide 2021P, Celloxide 2081, Celloxide 2083, Celloxide 2085, EHPE 3150, EPOLEAD PB 3600, ditto PB 4700 (all from Daicel Corporation), Denacol EX-212L, EX-214L, EX-216L, EX-321L, EX-850L (all from Nagase ChemteX Corporation). Other Examples include ADEKA RESIN EP-4000S, ditto EP-4003S, ditto EP-4010S, ditto EP-4011S (all from ADEKA Corporation), NC-2000, NC-3000, NC-7300, XD-1000, EPPN-501, EPPN-502 (all from ADEKA Corporation), and JER1031S (from Japan Epoxy Resin Co., Ltd.).

As the commercially available epoxy group-containing compound, also JER1031S (from Mitsubishi Chemical Corporation), JER1032H60 (from Mitsubishi Chemical Corporation), EPICLON HP-4700 (from DIC Corporation), and EPICLON N-695 (from DIC Corporation) are preferably used.

In a synthetic process of introducing epoxy group into the side chain of polymer, the introducing reaction may be allowed to proceeded typically using, as a catalyst, tertiary amine such as triethylamine or benzylmethylamine, quaternary ammonium salt such as dodecyltrimethylammonium chloride, tetramethylammonium chloride, or tetraethylammonium chloride, pyridine, or triphenylphosphine, in an organic solvent, at a reaction temperature of 50 to 150° C., for several to several tens of hours. The amount of introduction of alicyclic epoxy unsaturated compound is preferably controlled so that the obtainable polymer will have an acidic value in the range from 5 to 200 mg KOH/g.

While those having a glycidyl group as the epoxy group, such as glycidyl(meth)acrylate or allyl glycidyl ether, may be used as the epoxy unsaturated compound, it is preferable to use unsaturated compound having an alicyclic epoxy group. This sort of compound is exemplified by those enumerated below.

[Chemical Formula 33]

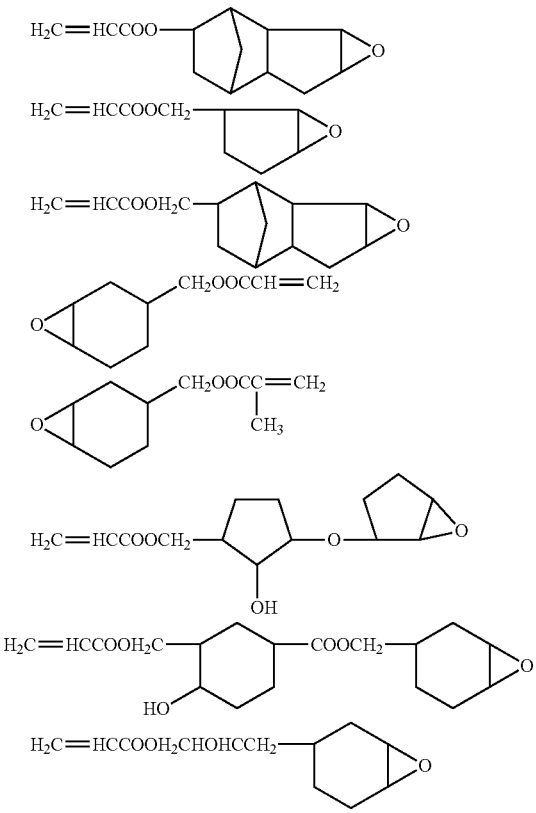

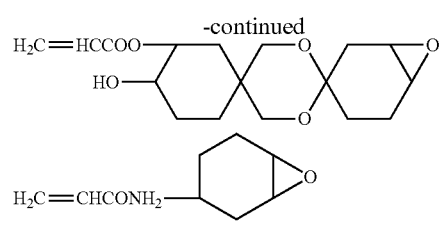

In this invention, the epoxy group-containing compounds may be used independently, or two or more species thereof may be used in combination.

While the total contents of the epoxy group-containing compound in the composition of this invention may vary depending on whether the low-molecular-weight compound or the high-molecular-weight compound is mixed, it is preferably 5 to 40% by mass relative to the total solids (mass) of the colored curable composition, more preferably 5 to 35% by mass, and particularly 5 to 30% by mass. With the amount of mixing controlled in these ranges, the obtainable cured film will have a more improved chemical resistance.

In the composition of this invention, the number of functional groups possessed by the phthalocyanine dye, and the epoxy equivalent of the epoxy group-containing compound preferably satisfy the relation of (epoxy equivalent/number of functional groups possessed by phthalocyanine dye)=25 g/eq or larger, and 500 g/eq or smaller. By satisfying such relation, the effect of this invention may be obtained more efficiently.

<Solvent>

The composition of this invention contains a solvent (organic solvent, in general) capable of dissolving at least the halogenated phthalocyanine dye and the epoxy group-containing compound.

The organic solvent is preferably exemplified by esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate [e.g., methyl oxyacetate, ethyl oxyacetate, butyl oxyacetate (e.g., methyl methoxyacetate, ethyl methoxyacetate, butyl methoxyacetate, methyl ethoxyacetate, ethyl ethoxyacetate, etc.)]; alkyl 3-oxypropionate esters [e.g., methyl 3-oxypropionate, ethyl 3-oxypropionate, etc. (e.g., methyl 3-methoxypropionate, ethyl 3-methoxypropionate, methyl 3-ethoxypropionate, ethyl 3-ethoxypropionate, etc.)]; alkyl 2-oxypropionate esters [e.g., methyl 2-oxypropionate, ethyl 2-oxypropionate, propyl 2-oxypropionate, etc. (e.g., methyl 2-methoxypropionate, ethyl 2-methoxypropionate, propyl 2-methoxypropionate, methyl 2-ethoxypropionate, ethyl 2-ethoxypropionate)]; methyl 2-oxy-2-methylpropionate and ethyl 2-oxy-2-methylpropionate (e.g., methyl 2-methoxy-2-methylpropionate, ethyl 2-ethoxy-2-methylpropionate, etc.); methyl piruvate, ethyl piruvate, propyl piruvate, methyl acetoacetate, ethyl acetoacetate, methyl 2-oxobutanoate, ethyl 2-oxobutanoate, etc.; and, ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, etc.; and, ketones such as methyl ethyl ketone, cyclohexanone, 2-heptanone, 3-heptanone, etc.; and, aromatic hydrocarbons such as toluene, xylene, etc.

From the viewpoint of improving surface quality of coating, it is also preferable to mix two or more species of these solvents. In this case, it is particularly preferable to use a mixed solvent composed of two or more species selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

From the viewpoint of coatability, the content of the solvent in the colored curable composition is preferably determined so that the total solid concentration of the composition falls in the range from 5 to 30% by mass, more preferably 7 to 25% by mass, and particularly 10 to 20% by mass.

<Various Additives>

The colored curable composition of this invention may optionally be added with various additives, such as surfactant, acid anhydride, curing agent, curing catalyst, filler, adhesion promoter, antioxidant, UV absorber, and de-flocculating agent, without ruining the effects of this invention.

In the colored curable composition of this invention, the amount of mixing of photo-polymerizable compound is preferably 1% by mass or less of the total solids, more preferably 0.5% by mass or less, and furthermore preferably zero.

(Surfactant)

From the viewpoint of further improving the coatability, the colored curable composition of this invention is preferably added with any of a variety of surfactants. The surfactant usable here includes fluorine-containing surfactant, nonionic surfactant, cationic surfactant, anionic surfactant, and silicone-base surfactant.

In particular, by containing the fluorine-containing surfactant, the colored curable composition of this invention will be further improved in liquid properties (in particular, fluidity) when prepared in the form of coating liquid, and thereby uniformity of thickness of coating and effect of liquid saving may further be improved.

More specifically, for the case where a film is formed with a coating liquid which uses the colored curable composition containing the fluorine-containing surfactant, interfacial tension between the coated surface and the coating liquid will be reduced, wettability onto the coated surface will be improved, and thereby the coatability onto the coated surface will be improved. This is advantageous since a film of uniform thickness, only with a small variation in thickness, may be obtained even if a film as thin as several micrometers is formed only with a small volume of liquid.

The fluorine content of the fluorine-containing surfactant is preferably 3 to 40% by mass, more preferably 5 to 30% by mass, and particularly 7 to 25% by mass. The fluorine-containing surfactant having a fluorine content controlled in these ranges is advantageous in terms of uniformity of thickness of the coated film and the effect of liquid saving, and is smoothly soluble in the colored curable composition.

The fluorine-containing surfactant is exemplified by Megafac F781 (from DIC Corporation).

The surfactants may be used independently, or two or more species thereof may be used in combination.

While the colored curable composition need not contain the surfactant, the amount of addition of the surfactant, when contained, is preferably 0.001 to 2.0% by mass of the total solids of the colored curable composition, and preferably 0.005 to 1.0% by mass.

When the surfactant is a high-molecular-weight compound (or resin), the acid value of the solid content of the high-molecular-weight compound is controlled to 80 mg KOH/g or below.

<Acid Anhydride>

The colored curable composition of this invention may contain an acid anhydride. By containing the acid anhydride, the epoxy group-containing compound will be improved in the cross-linkability based on thermal curing.

The acid anhydride is exemplified by phthalic anhydride, nadic anhydride, maleic anhydride, and succinic anhydride. Among these acid anhydrides, phthalic anhydride is preferable by virtue of its small influence on the pigment dispersion. Amine-base compound, also generally used as the epoxy curing agent, is advantageous in terms of its relatively long pot life.

The content of acid anhydride in the colored curable composition is preferably 10 to 40% by mass relative to the content of epoxy group-containing compound, and more preferably 15 to 30% by mass. With a content of acid anhydride of 10% by mass or more, the epoxy group-containing compound will have an increased crosslinking density, and an increased mechanical strength, meanwhile with a content of 30% by mass or less, the heat curable component will be suppressed in the coated film, to thereby advantageously increase concentration of the coloring matter.

(Curing Agent)

The composition of this invention may be added with a curing agent. There are a great variety of curing agents, and they largely vary from species to species in properties, survival time of mixture of resin and curing agent, viscosity, curing temperature, curing time, and heat generation, so that it is preferable to select an appropriate curing agent taking purpose of use, conditions of use, conditions of working and so forth into consideration. The curing agent is detailed in "Epoxy Resin", in Japanese, edited by Hiroshi Kakiuchi (published by Shokodo Co., Ltd.), Chapter 5. Examples of the curing agent will be enumerated below.

Those demonstrating catalytic action include tertiary amines, boron trifluoride-amine complex; those demonstrating stoichiometric reaction with the functional group of epoxy resin include polyamine, acid anhydride, etc.; those curable at normal temperature include diethylenetriamine, polyamide resin; those curable at middle temperatures include diethylaminopropylamine, and tris(dimethylaminomethyl)phenol; and those curable at high temperatures include phthalic anhydride, meta-phenylenediamine, etc. When classified by chemical structure, amines include aliphatic polyamine such as diethylenetriamine; aromatic polyamine such as meta-phenylenediamine; tertiary amine such as tris(dimethylaminomethyl)phenol; acid anhydride such as phthalic anhydride; polyamide resin, polysulfide resin, boron trifluoride-monoethylamine complex; initial condensate of synthetic resin such as phenol resin, and dicyandiamide, etc.

These curing agents react under heating with an epoxy group, and polymerize the resin, to thereby increase the crosslinking density, which means curing. From the viewpoint of thinning of the film, the amounts of consumption of both of the binder and the curing agent are preferably small as possible, and in particular, the curing agent is 35% by mass or less of the epoxy group-containing compound, preferably 30% by mass or less, and more preferably 25% by mass or less.

(Curing Catalyst)

In order to obtain a composition with a high concentration of coloring matter, it is effective to employ, besides the reaction with the curing agent, a curing mechanism mainly based on a reaction between epoxy groups. For this purpose, a curing catalyst may be used, while abandoning the curing agent. Only a slight amount of addition of the curing catalyst, typically $\frac{1}{10}$ to $\frac{1}{1000}$ or around on a mass basis, preferably $\frac{1}{20}$ to $\frac{1}{500}$ or around, and more preferably $\frac{1}{30}$ to $\frac{1}{250}$ or around, relative to the epoxy resin with an epoxy equivalent of approximately 150 to 200, will suffice for the curing.

<Method of Preparing Colored Curable Composition>

A preferable method of preparing the colored curable composition of this invention will be explained, without limiting this invention.

When the dye is used as the colorant, the dye is dissolved in an appropriate solvent together with the epoxy group-containing compound. Meanwhile, when the pigment is contained as the colorant, the pigment is mixed after prepared in the form of pigment dispersion as described above.

The colored curable composition of this invention is preferably prepared by adding, to the thus-obtained pigment dispersion or dye solution, the epoxy group-containing compound, and an optional curing catalyst or curing agent; or by adding the curing catalyst or curing agent when the binder per se is the epoxy group-containing compound, so as to impart heat curability, and optionally by adding a solvent.

<Filtration>

The colored curable composition of this invention is preferably filtered through a filter, for the purpose of reducing foreign matters or reducing defects.

The filter used for filtration is arbitrarily selectable from those having been used for filtration, without special limitation.

Filter material is exemplified by fluorine-containing resin such as PTFE (polytetrafluoroethylene); polyamide-base resin such as nylon-6 and nylon-6,6; and polyolefin resins such as polyethylene and polypropylene (PP) (including high density- and ultrahigh-molecular-weight products). Among them, polypropylene (including high density polypropylene) is preferable.

The pore size of filter is typically 0.01 to 20.0 μm or around, preferably 0.01 to 5 μm or around, and furthermore preferably 0.01 to 2.0 μm or around, but not specifically limited.

With the pore size of filter controlled in these ranges, the filter may remove fine particles more effectively, and may reduce the turbidity.

Now, the pore size of filter may be referred to the nominal values presented by the manufacturers. Commercially available filters are selectable from a variety of filters marketed, for example, by Nihon Pall Ltd., Toyo Roshi Kaisha, Ltd., Nihon Entegris K.K. (formerly Microlith Japan, Inc.) and Kitz Micro Filter Corp.

In the filtration, two or more kinds of filters may be used in combination.

For example, the filtration through a first filter may be followed by the next filtration through a second filter having a pore size different from that of the first filter.

In this process, each of the filtration through the first filter and the filtration through the second filter may be run once, or may be repeated twice or more times.

The second filter may be configured by the same material with the above-described first filter.

<Applications>

The colored curable composition of this invention is preferably used as a cured film after being cured. A cured layer of the colored curable composition of this invention is preferably used as a color layer of a color filter. It is preferably used particularly for the colored curable composition to be dry-etched.

In this invention, the thickness of the colored layer is preferably 0.1 to 1.0 μm, and more preferably 0.1 to 0.8 μm. According to this invention, the colored layer may be thinned since the colorant may be highly concentrated therein.

<Color Filter and Method for Manufacturing the Same>

The color filter of this invention is a colored pattern in which at least one pattern, out of all patterns composing the color filter, is formed by the above-described colored curable composition of this invention. The color filter of this invention is not specifically limited, so long as at least one of the patterns is a colored pattern formed by the above-described colored curable composition of this invention, and is preferably manufactured by the method for manufacturing a color filter of this invention, as described below.

An exemplary method for manufacturing a color filter of this invention includes forming a colored layer by using the above-described colored curable composition of this invention;

forming a photoresist layer on the colored layer; obtaining a resist pattern by patterning the photoresist layer by exposure and development; and dry-etching the colored layer using the resist pattern as an etching mask.

In the method for manufacturing a color filter of this invention, a first colored layer is formed by using the above-described colored curable composition of this invention (also referred to as first colored curable composition).

Now, the first colored layer is configured by the colored curable composition of this invention, and has therefore a good solvent resistance and a good resistance against alkali developing solution as described above.

In this way, as detailed later, the first colored layer is successfully prevented from dissolving into a developing solution which is used when a resist pattern (patterned photoresist layer) is formed as an etching mask on the first colored layer; into an organic solvent contained in a second or third colored radiation-sensitive composition, used when a second colored radiation-sensitive layer is formed on the first colored layer using the second colored radiation-sensitive composition, or used when a third colored radiation-sensitive layer is formed on the first colored layer using the third colored radiation-sensitive composition; or into a developing solution used when the second or third colored radiation-sensitive layer formed by using the second or third colored radiation-sensitive composition, is developed after the exposure. This successfully reduces risks that the coloring component in the first colored layer is eluted into the above-described solvents or developing solutions, and that the coloring component in the second or third colored radiation-sensitive composition contaminates the first colored layer. Accordingly, color loss of the first colored layer, or an overlapped region where a plurality of colors are overlapped with each other may be reduced, and thereby the finally obtainable color filter will have an improved performance.

The method is advantageous in particular for manufacturing the color filter for a micro-sized, solid-state image sensing device, for which for example a thickness of 0.1 to 1.0 µm and/or a pixel pattern size (a side of square matrix pattern) of 2 µm or smaller (e.g., 0.5 to 2.0 µm) are required.

Now, the solid-state image sensing device will be outlined, referring to FIG. 1 for example.

As illustrated in FIG. 1, a solid-state image sensing device 10 is configured by a photodetector (photodiode) 42, a color filter 13, a planarizing film 14, and microlenses 15, which are formed over a silicon substrate. In this invention, it is not always necessary to provide the planarizing film 14. Note that, in FIG. 1, constituents are illustrated in a partially emphasized manner, regardless of their real ratios of thickness and width, for clear understanding.

The support may not only be the silicon substrate, but also may be an arbitrary substrate having been used for the color filter, and is not specifically limited. Examples include soda glass plate, borosilicate glass plate, quartz glass plate, and any of these plates having a translucent electrode film formed thereon, which are used for liquid crystal display device and so forth; and substrates for photo-electric conversion device used for solid-state image sensing device and so forth, such as oxide film and silicon nitride film. An intermediate layer may be provided between any of these supports and the color filter 13, without ruining this invention.

Over the silicon substrate, there is provided a P-well 41, and the P-well has a photodiode 42 formed partially in the surface area thereof. The photodiode 42 is formed by implanting ion of an N-type impurity such as P or As, partially into the surface area of the P-well, followed by annealing. Again over the silicon substrate, and in surface areas of the P-well 41 but different from the above-described partial area, there is provided an impurity-diffused layer 43 having an N-type impurity concentration higher than in the photodiode 42. The impurity-diffused layer 43 is formed by implanting ion of an N-type impurity such as P or As, followed by annealing, and serves as a floating diffusion layer which transfer charge generated by the photodiode 42 upon receiving an incident light. In place of configuring the well 41 as a P-type impurity layer, and the photodiode 42 and the impurity-diffused layer 43 as N-type impurity layers, the well 41 may alternatively be configured as an N-type impurity layer, and the photodiode 42 and the impurity-diffused layer 43 as P-type impurity layers.

Over the P-well 41, the photodiode 42, and the impurity-diffused layer 43, there is provided an insulating film 47 configured by $SiO_2$ or $SiO_2/SiN/SiO_2$, and over the film 47, there is provided an electrode 44 typically composed of polysilicon, tungsten, tungsten silicide, Al, or Cu. The electrode 44 serves as a gate of a gate MOS transistor, and can act as a transfer gate for transferring charge generated in the photodiode 42 to the impurity-diffused layer 43. Over the electrode 44, there is further provided an interconnect layer 45. Still over the interconnect layer 45, there are provided a BPSG film 46 and a P-SiN film 48. The interface between the BPSG film 46 and the P-SiN film 48 are formed so as to wave above the photodiode 42, and thereby serves as an in-layer lens which efficiently guide the incident light to the photodiode 42. Over the BPSG film 46, there is formed a planarizing film layer 49 for the purpose of planarizing the surface of the P-SiN film 48 or any irregularity portion other than the pixel area.

Over the planarizing film layer 49, the color filter 13 is formed. Note that, in the explanation below, a colored film formed without being partitioned (so-called blanket film) over the silicon substrate is referred to as a "colored (colored radiation-sensitive) layer", whereas a colored film formed as being partitioned according to some pattern (for example, a film patterned into stripes) is referred to as a "colored pattern". Among the colored patterns, those configuring elements of the color filter 13 (for example, square- or rectangle-patterned colored pattern) is referred to as a "colored (red, green, blue) pixel".

The color filter 13 is configured by a plurality of two-dimensionally arranged green pixels (first color pixels) 20G, red pixels (second color pixels) 20R, and blue pixels (third color pixels) 20B. Each of colored pixels 20R, 20G, 20B are respectively formed over the photodetector 42. The green pixels 20G are arranged in a checkered pattern, and the blue pixels 20B and the red pixels 20R are formed between the individual green pixels 20G. Note that FIG. 1 illustrates the individual colored pixels 20R, 20G, 20B arranged in line, in order to explain that the color filter 13 is configured by three-color pixels.

The planarizing film 14 is formed so as to cover the top surface of the color filter 13, so as to planarize the surface of the color filter.

The microlenses 15 are condensing lenses arranged so as to direct the convex surfaces upward, and are provided over the planarizing film 14 (or over the color filter if there is no planarizing film), and above the photodetector 42. The individual microlenses 15 efficiently guide the light coming from an object to each photodetector 42.

Next, a method for manufacturing a color filter according to an embodiment of this invention will be explained.

Figure 2:
[FIG. 2] A schematic cross sectional view illustrating a first colored layer.

In the method for manufacturing a color filter according to the embodiment of this invention, first, as illustrated in the schematic cross sectional view of FIG. 2, a first colored layer 11 is formed using the first colored curable composition (step (i)). Now the first colored curable composition is the colored curable composition of this invention described above.

The first colored layer 11 may be formed by coating the colored curable composition over the support typically by spin coating, slit coating, or spray coating, followed by drying to form such colored layer.

The thickness of the first colored layer 11 preferably falls in the range from 0.3 to 1.0 µm, more preferably from 0.35 to 0.8 µm, and furthermore preferably from 0.35 to 0.7 µm.

A preferable method of curing is such as heating the first colored layer 11 using a heating device such as a hot plate or oven, so as to allow the composition to cure. The heating temperature is preferably 120° C. to 250° C., and more preferably 160° C. to 230° C. The heating time may vary depending on heating means, wherein it generally ranges from 3 to 30 minutes or around when heated on a hot plate, and generally ranges from 30 to 90 minutes or around when heated in an oven.

Next, the first colored layer 11 is patterned by dry etching so as to form a throughhole group (step (ii)). In this way, the first colored pattern is formed. According to this technique, the throughhole group having a desired pattern may be provided in a more reliable manner, as compared with the case where the first colored layer is formed using the colored radiation-sensitive composition, and then exposing and developing the first colored layer to form the throughhole group. This is because the colored radiation-sensitive composition, having a content of colorant of 50% by mass or more relative to the total solids of the composition, can afford therein only a limited room for addition of a component which contributes to the developing performance, and becomes difficult to be patterned in a reliable manner.

The first colored pattern may be a colored pattern provided over the support to give a first color, or may alternatively be a colored pattern provided over a support, having a pattern preliminarily formed thereon, to give a second color, or third or succeeding color.

Figure 3:
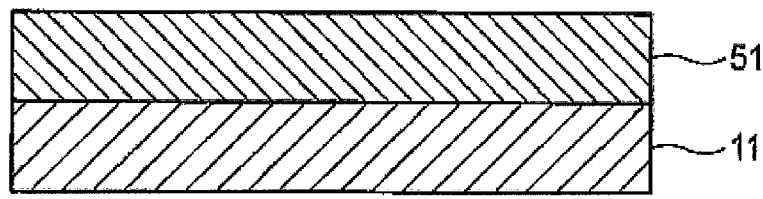
[FIG. 3] A schematic cross sectional view illustrating a photoresist layer formed on the first colored layer.

The first colored layer 11 may be dry-etched using a patterned photoresist layer as a mask, and an etching gas. For example, as illustrated in schematic cross sectional view of FIG. 3, first, a photoresist layer 51 is formed over the first colored layer 11.

More specifically, a positive or negative radiation-sensitive composition is applied (preferably coated) over the colored layer, and then dried to form the photoresist layer. The formation process of the photoresist layer 51 preferably includes prebaking. In particular, the formation process of the photoresist preferably includes post-exposure baking (PEB) and post-development baking (post-baking).

The photoresist used here is, for example, a positive radiation-sensitive composition. The positive radiation-sensitive composition usable here is a positive resist composition suitably used for positive photoresist which is sensitive to radial rays including ultraviolet radiation (g-line, h-line, i-line), far ultraviolet radiation including excimer laser light, electron beam, ion beam, and X-ray. Among the radial rays, g-line, h-line and i-line are preferable, and i-line is particularly preferable.

More specifically, a composition containing quinone diazide compound and an alkali-soluble resin is preferable as the positive radiation-sensitive composition. The positive radiation-sensitive composition, which contains quinone diazide compound and an alkali-soluble resin makes use of a mechanism by which a quinone diazide group decomposes upon irradiated by light at 500 nm or shorter to produce a carboxyl group, and as a consequence the composition changes from alkali-insoluble to alkali-soluble. The positive photoresist has been used for manufacturing IC or LSI, by virtue of its notably excellent resolution power. The quinone diazide compound is exemplified by naphthoquinone diazide compound.

The photoresist layer 51 preferably has a thickness of 0.1 to 3 μm, more preferably 0.2 to 2.5 μm, and furthermore preferably 0.3 to 2 μm. The photoresist layer 51 may be formed by coating by any coating method used for the first colored layer 11 described above.

Figure 4:
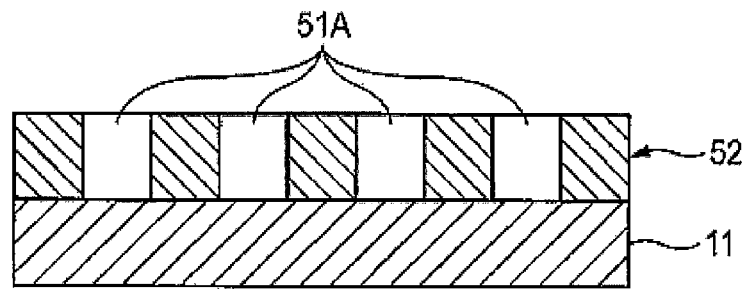
[FIG. 4] A schematic cross sectional view illustrating a resist pattern formed on the first colored layer.

Next, as illustrated in the schematic cross sectional view of FIG. 4, the photoresist layer 51 is exposed and developed to form a resist pattern (patterned photoresist layer) 52 having a resist throughhole group 51A provided therein.

The resist pattern 52 may be formed by appropriately optimizing any of known photolithographic techniques, without special limitation. By forming the resist throughhole group 51A in the photoresist layer 51 through exposure and development, the resist pattern 52 which serves as the etching mask in the succeeding etching may be provided on the first colored layer 11.

Exposure of the photoresist layer 51 is implemented by irradiating the positive or negative radiation-sensitive composition with g-line, h-line or i-line, and preferably with i-line, through a predetermined mask pattern. After the exposure, the photoresist is developed using a developing solution, to be removed selectively in a region where the colored pattern will be formed.

The developing solution usable here is arbitrarily selectable from those capable of dissolving an exposed area of the positive resist or uncured area of the negative resist, without adversely affecting the first colored layer which contains the colorant, and for which a variety of combinations of organic solvents or an alkaline aqueous solution may be used. The alkaline aqueous solution is preferably prepared so as to control the concentration of an alkaline compound to 0.001 to 10% by mass, and preferably 0.01 to 5% by mass. The alkaline compound is exemplified by sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, and 1,8-diazabicyclo[5.4.0]-7-undecene. The development process, when implemented by using the alkaline aqueous solution as the developing solution, is generally followed by rinsing with water.

Figure 5:
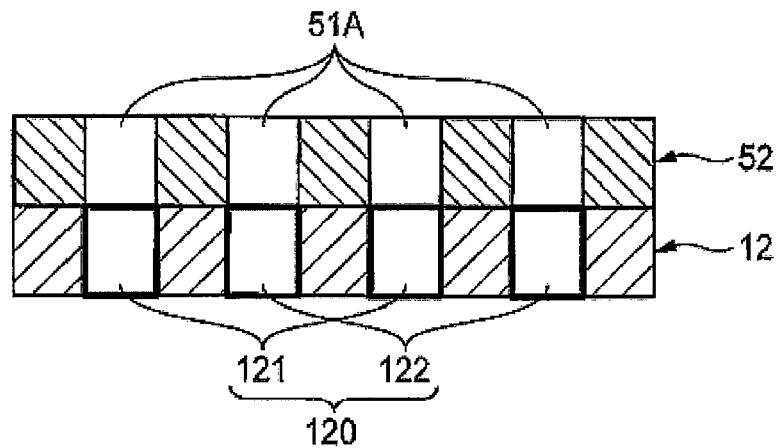
[FIG. 5] A schematic cross sectional view illustrating a first colored pattern, formed by providing a throughhole group in the first colored layer by etching.

Next, as illustrated in the schematic cross sectional view of FIG. 5, the first colored layer 11 is patterned by dry etching, using the resist pattern 52 as an etching mask, so as to form therein the throughhole group 120. In this way, the first colored pattern 12 is formed. Now the throughhole group 120 contains a first throughhole subgroup 121 and a second throughhole subgroup 122.

The throughhole group 120 is provided in the first colored layer 11 so as to form a checkered pattern. As a consequence, the first colored pattern 12, configured by providing the throughhole group 120 in the first colored layer 11, has a plurality of square first colored pixels arranged in a checkered pattern.

More specifically, in the dry etching, the first colored layer 11 is dry-etched using the resist pattern 52 as the etching mask. Representative methods of dry etching are described in JP-A-S59-126506, JP-A-S59-46628, ditto 58-9108, ditto 58-2809, ditto 57-148706, and ditto 61-41102.

The dry etching is preferably conducted according to the embodiment below, from the viewpoint of shaping the cross section of the pattern more rectangular, and reducing damages to the support.

The etching process preferably includes a first step of etching, in which the first colored layer 11 is etched using a mixed gas of a fluorine-containing gas and oxygen gas ($O_2$), to a range (depth) where the support remains unexposed; a second step of etching succeeding to the first step of etching, in which the first colored layer 11 is etched using a mixed gas of nitrogen gas ($N_2$) and oxygen gas ($O_2$), preferably to a range (depth) where the support exposes; and over-etching succeeding to exposure of the support. Specific techniques of the dry etching, the first step of etching, the second step of etching and the over-etching will be explained below.

The dry etching is conducted according to etching conditions preliminarily determined by the techniques below.

(1) The etchrate (nm/min) of the first step of etching, and the etchrate (nm/min) of the second step of etching are respectively estimated.

(2) The time required for etching a target thickness in the first step of etching, and the time required for etching a target thickness in the second step of etching are respectively estimated.

(3) The first step of etching is conducted according to the etching time estimated in (2).

(4) The second step of etching is conducted according to the etching time estimated in (2). Alternatively, the etching time may be determined by endpoint detection, and the second step of etching may be conducted according to the thus determined etching time.

(5) The over-etching time is estimated based on the total time of (3) and (4), based on which the over-etching is conducted.

The mixed gas used in the first step of etching preferably contains a fluorine-containing gas and oxygen gas ($O_2$), from the viewpoint of patterning an organic material which configures a film to be etched into a rectangular profile. By conducting the first step of etching only to a range where the support remains unexposed, the support is prevented from being damaged.

After the first step of etching is conducted using a mixed gas of a fluorine-containing gas and oxygen gas, only up to the range where the support remains unexposed, the second step of etching and the over-etching are preferably conducted using a mixed gas of nitrogen gas and oxygen gas, from the viewpoint of avoiding damages.

It is important to determine the ratio of the amount of etching in the first step of etching, and the amount of etching in the second step of etching, so as not to degrade the rectangularity obtained in the first step of etching. The ratio of the amount of etching in the second step of etching, relative to the total amount of etching (the total of the amount of etching in the first step of etching and the amount of etching in the second step of etching) preferably falls in the range larger than 0% and not larger than 50%, and preferably in the range from 10 to 20%. Note that the amount etching refers to the thickness of the film which remains unetched.

The etching preferably contains the over-etching. The over-etching is preferably conducted by presetting the ratio of over-etching. The ratio of over-etching is preferably estimated from the time of the initially conducted etching. While the ratio of over-etching may arbitrarily be set, it is preferably 30% or smaller of the etching time in the etching process, from the viewpoint of etching resistance of the photoresist and maintainability of the rectangular etched pattern, more preferably 5 to 25%, and particularly 10 to 15%.

Figure 6:
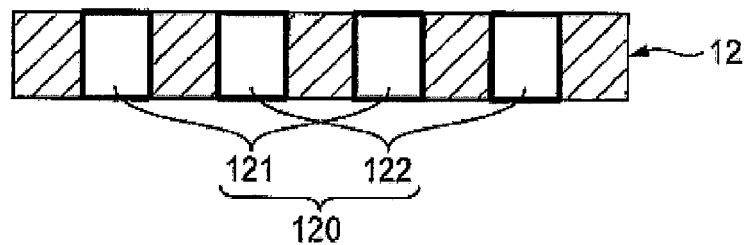
[FIG. 6] A schematic cross sectional view illustrating that the resist pattern shown in FIG. 5 has been removed.

Next, as illustrated in the schematic cross sectional view of FIG. 6, the resist pattern (or etching mask) 52 which remains after the etching is removed. The removal of the resist pattern 52 preferably contains a step of applying a stripping liquid or solvent over the resist pattern 52 to make the resist pattern 52 ready for removal, and a step of removing the resist pattern 52 using rinsing water.

The step of applying a stripping liquid or solvent over the resist pattern 52, to make the resist pattern 52 ready for removal, is exemplified by a step of applying a stripping liquid or solvent at least over the resist pattern 52, and allowing it to stay for a predetermined time for puddle development. The time over which the stripping liquid or solvent is allowed to stay is preferably several tens of seconds to several minutes, but not specifically limited.

The step of removing the resist pattern 52 using rinsing water is exemplified by a step of removing the resist pattern 52 by spraying the rinsing water from a spray-type or shower-type jetting nozzle against the resist pattern 52. Pure water is preferably used as the rinsing water. The jetting nozzle is exemplified by a jetting nozzle capable of covering the entire support within the range of jetting thereof, and a movable jetting nozzle capable of covering the entire support within the movable range thereof. The jetting nozzle, when configured as the movable type one, can more effectively remove the resist pattern 52 in the step of removing the resist pattern 52, by jetting the rinsing water while travelling from the center of the support to the end of the support twice of more times.

The stripping liquid generally contains an organic solvent, and may further contain an inorganic solvent. The organic solvent is exemplified by 1) hydrocarbon-base compound, 2) halogenated hydrocarbon-base compound, 3) alcohol-base compound, 4) ether or acetal-base compound, 5) ketone or aldehyde-base compound, 6) ester-base compound, 7) polyhydric alcohol-base compound, 8) carboxylic acid or its acid anhydride-base compound, 9) phenol-base compound, 10) nitrogen-containing compound, 11) sulfur-containing compound, and 12) fluorine-containing compound. The stripping liquid preferably contains the nitrogen-containing compound, and more preferably contains the noncyclic nitrogen-containing compound and the cyclic nitrogen-containing compound.

The noncyclic nitrogen-containing compound preferably has hydroxy group. Specific examples include monoisopropanolamine, diisopropanolamine, triisopropanolamine, N-ethylethanolamine, N,N-dibutylethanolamine, N-butylethanolamine, monoethanolamine, diethanolamine, and triethanolamine; preferable examples include monoethanolamine, diethanolamine, and triethanolamine; and more preferable examples include monoethanolamine ($H_2NCH_2CH_2OH$). The cyclic nitrogen-containing compound is exemplified by isoquinoline, imidazole, N-ethylmorpholine, ε-caprolactam, quinoline, 1,3-dimethyl-2-imidazolidinone, α-picoline, β-picoline, γ-picoline, 2-pipecoline, 3-pipecoline, 4-pipecoline, piperadine, piperidine, pyrazine, pyridine, pyrrolidine, N-methyl-2-pyrrolidone, N-phenylmorpholine, 2,4-lutidine, and 2,6-lutidine; preferably exemplified by N-methyl-2-pyrrolidone, and N-ethylmorpholine; and more preferably exemplified by N-methyl-2-pyrrolidone (NMP).

The stripping liquid preferably contains the noncyclic nitrogen-containing compound and the cyclic nitrogen-containing compound; more preferably contains at least one species selected from monoethanolamine, diethanolamine, and triethanolamine as the noncyclic nitrogen-containing compound, and at least one species selected from N-methyl-2-pyrrolidone and N-ethylmorpholine as the cyclic nitrogen-containing compound; and furthermore preferably contains monoethanolamine and N-methyl-2-pyrrolidone.

The removal using the stripping liquid will suffice if the resist pattern 52 formed on the first colored pattern 12 may be removed, wherein it is not always necessary to completely remove any deposited matter which possibly adheres as an etching product on the side faces of the first colored pattern 12. The deposited matter is an etching product adhered and accumulated on the side faces of the colored layer.

The stripping liquid preferably has a content of noncyclic nitrogen-containing compound of 9 parts by mass or more and 11 parts by mass or less, per 100 parts by mass of the stripping liquid, and has a content of cyclic nitrogen-containing compound of 65 parts by mass or more and 70 parts by mass or less, per 100 parts by mass of the stripping liquid. The stripping liquid is preferably a mixture of the noncyclic nitrogen-containing compound and the cyclic nitrogen-containing compound, diluted with pure water.

Figure 7:
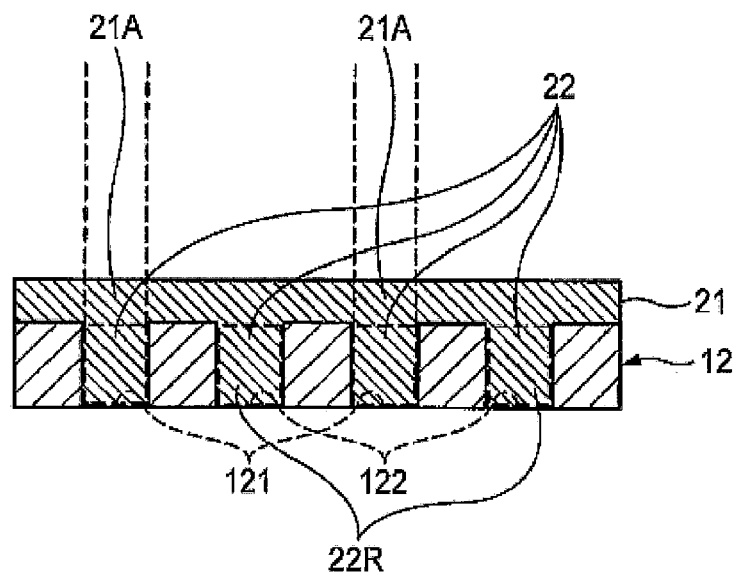
[FIG. 7] A schematic cross sectional view illustrating that a second colored pattern and a second colored radiation-sensitive layer have been formed.

Next, as illustrated in schematic cross sectional view of FIG. 7, a second colored radiation-sensitive layer 21 is stacked on the first colored layer (that is, the first colored pattern 12 configured by forming the throughhole group 120 in the first colored layer 11) using the second colored radiation-sensitive composition, so as to fill up the individual throughholes in the first throughhole subgroup 121 and in the second throughhole subgroup 122 with the second colored radiation-sensitive composition, to thereby form a plurality of second colored pixels (step (iii)). In this way, a second colored pattern 22, configured by a plurality of second colored pixels, is formed in the throughhole group 120 of the first colored layer 11. The second colored pixels are given as square pixels. The second colored radiation-sensitive layer 21 may be formed in the same way as the first colored layer 11 described above.

The thickness of the second colored radiation-sensitive layer 21 preferably falls in the range from 0.3 to 1 μm, more preferably in the range from 0.35 to 0.8 μm, and furthermore preferably in the range from 0.35 to 0.7 μm.

Figure 8:
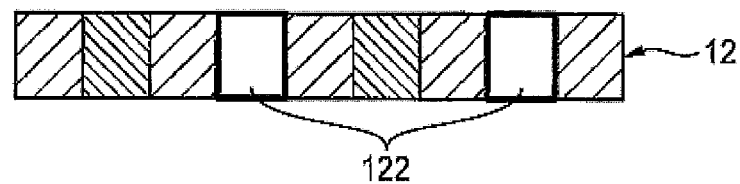
[FIG. 8] A schematic cross sectional view illustrating that the second colored radiation-sensitive layer, and a part of second colored pixels composing the second colored pattern, shown in FIG. 7, have been removed.

A region 21A of the second colored radiation-sensitive layer 21, corresponded to the first throughhole subgroup 121 provided to the first colored layer 11, is then exposed, and the product is developed to remove the second colored radiation-sensitive layer 21, and a plurality of second colored pixels 22R provided inside the individual throughholes in the second throughhole subgroup 122 (step (iv)) (see the schematic cross sectional view of FIG. 8).

Figure 9:
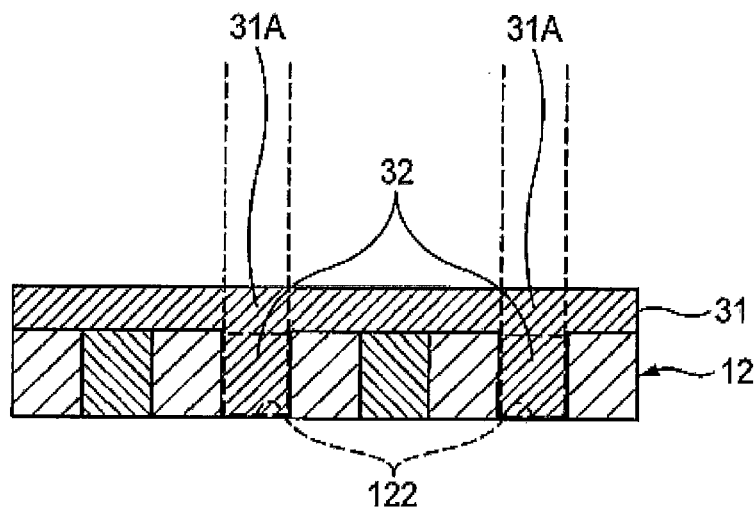
[FIG. 9] A schematic cross sectional view illustrating that a third colored pattern and a third colored radiation-sensitive layer have been formed.

Next, as illustrated in schematic cross sectional view of FIG. 9, a third colored radiation-sensitive layer 31 is formed on the first colored layer (that is, the first colored pattern 12 configured by forming the second colored pattern 22 in the first throughhole subgroup 121) using the third colored radiation-sensitive composition, so as to fill up the individual throughholes in the second throughhole subgroup 122 with the third colored radiation-sensitive composition, to thereby form a plurality of third colored pixels (step (v)). In this way, a third colored pattern 32, configured by a plurality of third colored pixels, is formed in the second throughhole subgroup 122 of the first colored layer 11. The third colored pixels are given as square pixels. The third colored radiation-sensitive layer 31 may be formed in the same way as the first colored layer 11 described above.

The thickness of the third colored radiation-sensitive layer 31 preferably falls in the range from 0.3 to 1 μm, more preferably in the range from 0.35 to 0.8 μm, and furthermore preferably in the range from 0.35 to 0.7 μm.

Figure 10:
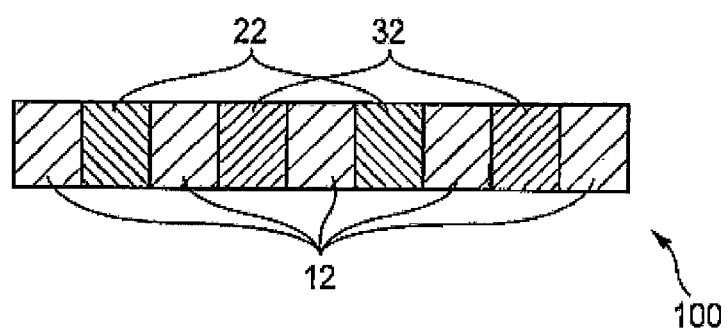
[FIG. 10] A schematic cross sectional view illustrating that the third colored radiation-sensitive layer shown in FIG. 9 has been removed.

A region 31A of the third colored radiation-sensitive layer 31, corresponded to the second throughhole subgroup 122 provided to the first colored layer 11, is then exposed, and the product is developed to remove the third colored radiation-sensitive layer 31, thereby as illustrated in schematic cross sectional view of FIG. 10, a color filter 100 having the first colored pattern 12, the second colored pattern 22, and the third colored pattern 32 is manufactured (step (vi)).

Each of the above-described second colored radiation-sensitive composition and the third colored radiation-sensitive composition contains a colorant. The colorant may be exemplified by those described above regarding the colored curable composition of this invention. Considering now a preferred embodiment in which one of the second colored pixel and the third colored pixel forms a red translucent portion, and the other forms a blue translucent portion, they respectively form the red translucent portion and the blue translucent portion. The colorant contained in the colored curable composition for forming the red translucent portion is preferably one or more species selected from those described in paragraphs [0037] and [0039] of JP-A-2012-172003, the contents of which are incorporated into this specification. The colorant contained in the colored curable composition for forming the blue translucent portion is preferably one or more species selected from C.I. Pigment Violets 1, 19, 23, 27, 32, 37, 42, and, C.I. Pigment Blues 1, 2, 15, 15:1, 15:2, 15:3, 15:4, 15:6, 16, 22, 60, 64, 66, 79, 80.

In each of the second colored radiation-sensitive composition and the third colored radiation-sensitive composition, the content of the colorant relative to the total solids of composition is preferably 30% by mass or more, more preferably 35% by mass or more, and furthermore preferably 40% by mass or more. The content of the colorant relative to the total solids of composition is generally 90% by mass or less, and preferably 80% by mass or less.

Each of the second colored radiation-sensitive composition and the third colored radiation-sensitive composition used here is preferably a negative radiation-sensitive composition. The negative radiation-sensitive composition usable here is any of those sensitive to radial rays including ultraviolet radiation (g-line, h-line, i-line), far ultraviolet radiation including excimer laser light, electron beam, ion beam and X-ray. Among the radial rays, g-line, h-line and i-line are preferable, and i-line is particularly preferable.

More specifically, the negative radiation-sensitive composition preferably contains a photo-polymerization initiator, polymerizable component (polymerizable compound), and binder resin (alkali-soluble resin, etc.), and is exemplified by those described in paragraphs [0017] to [0064] of JP-A-2005-326453. Such negative radiation-sensitive composition makes use of a mechanism by which the photo-polymerization initiator initiates a polymerization reaction of the polymerizable compound upon irradiated by radial ray, and as a consequence the composition changes from alkali-soluble to alkali-insoluble.

The second colored radiation-sensitive layer 21 and the third colored radiation-sensitive layer 31 may be exposed using g-line, h-line or i-line, and preferably using i-line.

The development succeeding to the exposure is generally conducted by using a developing solution.

The developing solution is exemplified by those described above regarding the exposure and development of the photoresist layer 51.

The development process, when conducted by using the alkaline aqueous solution as the developing solution, is generally followed by rinsing with water.

Each of the first colored pixels, the second colored pixels and the third colored pixels preferably has a length of side (a short side for rectangular pixel, and a side for square pixel) of 0.5 to 1.7 μm from the viewpoint of image resolution, and more preferably 0.6 to 1.5 μm.

According to the above-described method for manufacturing a color filter of this invention, the first colored layer, and consequently the first colored pixels are formed using the colored curable composition of this invention having a high colorant concentration, so that the first colored pixel may extremely be thinned (e.g., 0.7 μm or thinner). Accordingly, the method for manufacturing a color filter is capable for manufacturing the color filter which is successfully suppressed in crosstalk (color mixing of light).

The first colored pixels formed using the colored curable composition of this invention have a good solvent resistance and a good resistance against alkali developing solution as described above. Accordingly, an overlapped region where colors of other colored layer and other colored pattern are overlapped may be reduced, and thereby a high performance color filter may be manufactured.

The color filter obtained from the colored curable composition of this invention is suitably used for liquid crystal display device (LCD) and solid-state image sensing device (e.g., CCD, CMOS, etc.), and also for image display devices such as electronic paper and organic EL display device. In particular, the color filter of this invention is suitably used for solid-state image sensing devices such as CCD and CMOS.

The color filter of this invention is also suitable for color filter of liquid crystal display device. The liquid crystal display device equipped with such color filter can present a high quality image with a good hue and good display characteristics.

Definition of display device and details of the individual display devices may be referred, for example, to the description in paragraphs [0156] to [0163] of JP-A-2012-145604, the contents of which are incorporated into this specification.

EXAMPLE

This invention will further be detailed referring to Examples. All materials, amounts of use, ratios, details of processes, and procedures of processes described in Examples below may appropriately be modified without departing from the spirit of this invention. This invention is therefore not limited to the specific Examples described below. Note that "part(s)" and "%" are given on a mass basis unless otherwise specifically stated.

<Phthalocyanine Dye>

The Exemplary Compound below was used as the phthalocyanine dye.

<Exemplary Synthesis of Exemplary Compound G-1>

[Chemical Formula 34]

(Synthesis of Compound A)

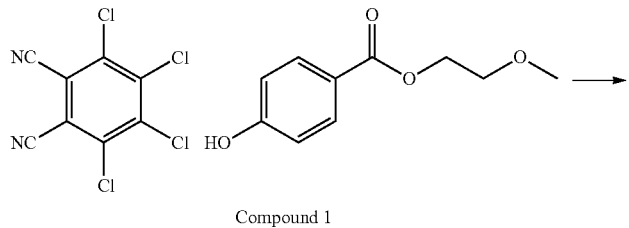

Compound 1

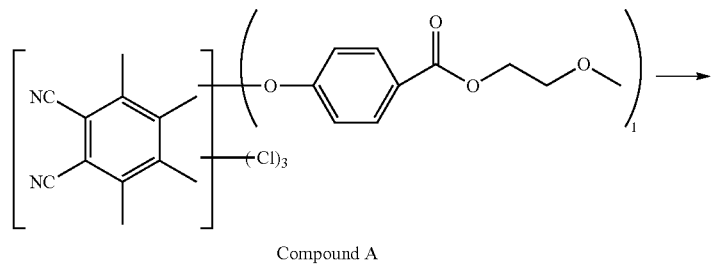

Compound A

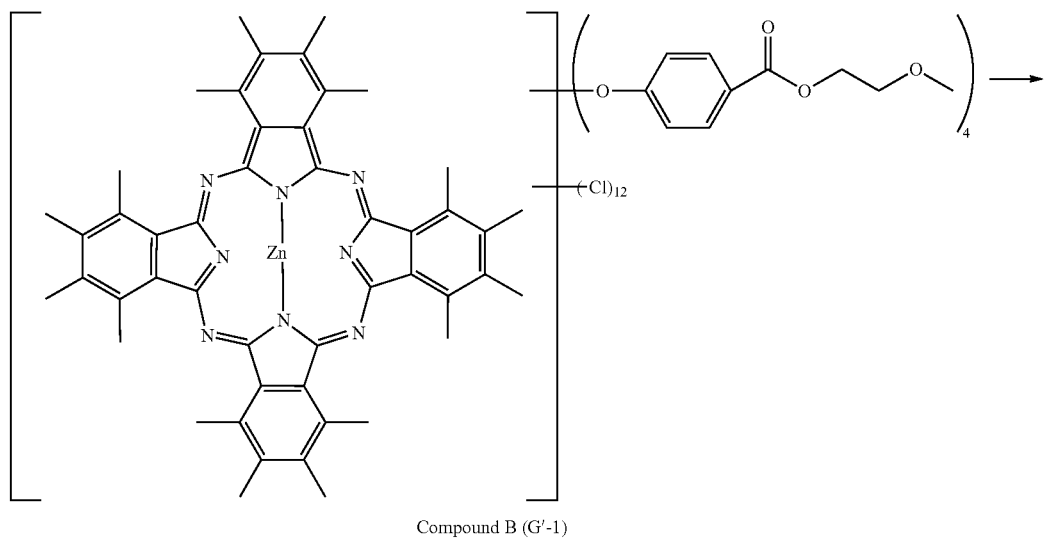

Compound B (G'-1)

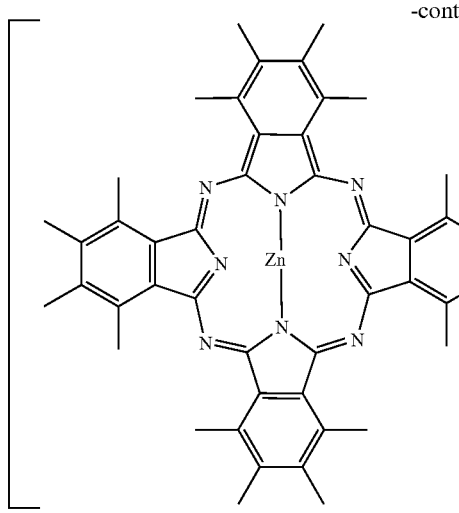
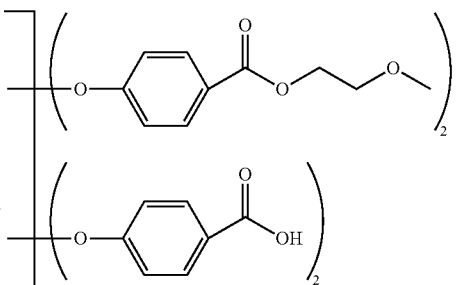

Compound C (G-1)

In a flask, tetrachlorophthalonitrile (80.0 g, 300.9 mmol), Compound 1 (59.03 g, 300.9 mmol), and 400 g of acetonitrile were placed, the content was stirred for 30 minutes so as to stabilize the inner temperature at 40° C., added with potassium carbonate (45.74 g, 330.9 mmol), and the content was allowed to react for approximately 3 hours. After cooled and filtered under suction, the obtained filtrate was condensed under reduced pressure at 40° C. for one hour, to evaporate off the solvent. The residue was dried overnight at 110° C. in vacuo, to obtain approximately 128 g (99.9%) of Compound A.

(Synthesis of Exemplary Compound G'-1 (Compound B))

In a flask, Compound A (125.0 g, 293.7 mmol) and 146.83 mL of benzonitrile were placed, the content was stirred under a nitrogen gas flow (10 mL/min) for approximately one hour so as to stabilize the inner temperature at 150° C., added with 26.81 g (84.0 mmol) of zinc iodide, and the content was allowed to react for approximately 48 hours. After cooled, 2000 mL of methanol was added, and the mixture was stirred at room temperature so as to induce crystallization. The deposited solid was collected by decantation, added with 2000 mL of methanol, and the mixture was stirred at 60° C. for one hour. After cooled and filtered under suction, the obtained crystal was dried overnight at 40° C. under air flow, to obtain approximately 104.5 g (80.5%) of Compound B.

(Synthesis of Exemplary Compound G-1 (Compound C))

In a flask, Compound B (30.0 g, 16.97 mmol) and 300 mL of THF/water (1:1), and lithium hydroxide (0.81 g, 33.94 mmol) were placed, and the content was stirred at an internal temperature of 60° C. for approximately 7 hours. After cooled, the content was added with 102 mL of a 1 M hydrochloric acid, and stirred at room temperature for 30 minutes. The obtained solution was condensed under reduced pressure at 40° C. for one hour, to evaporate off the solvent. The obtained residue was added with 50 mL of methanol, followed by suction filtration, and the collected crystal was dried overnight at 40° C. under air flow, to obtain approximately 1.54 g (88.2%) of Compound C.

<Exemplary Synthesis of Exemplary Compound G-2>

In a flask, Compound C (1.50 g, 0.91 mmol), 30 mL of THF, glycidol (0.27 g, 3.63 mmol), 1-ethyl-3-(3-dimethylaminopropyl)carbodiimide hydrochloride (0.52 g, 2.72 mmol), and 4-dimethylaminopyridine (5.6 mg, 0.05 mmol) were placed, and the content was stirred at room temperature for approximately 20 hours. The obtained solution was condensed under reduced pressure at 40° C. for one hour, to evaporate off the solvent. The obtained residue was added with 50 mL of methanol, followed by suction filtration, and the collected crystal was dried overnight at 40° C. under air flow, to obtain approximately 1.50 g (93.8%) of Compound G-2.

<Exemplary Synthesis of Exemplary Compound G-3>

The same reaction as in the synthesis of Compound A in the synthesis of Compound G-1 was allowed to proceed, except that an equimolar amount of tetrafluorophthalonitrile was used in place of tetrachlorophthalonitrile.

<Exemplary Synthesis of Exemplary Compound G-4>

The same reaction as in the synthesis of Compound G-2 was allowed to proceed, except that an equimolar amount of tetrafluorophthalonitrile was used in place of tetrachlorophthalonitrile.

<Exemplary Synthesis of Exemplary Compound G-5>

The same reaction as in the synthesis of Compound A in the synthesis of Compound G'-1 was allowed to proceed, except that an equimolar amount of phenyl 4-hydroxybenzoate was used in place of Compound 1.

<Exemplary Synthesis of Exemplary Compound G-6>

[Chemical Formula 35]

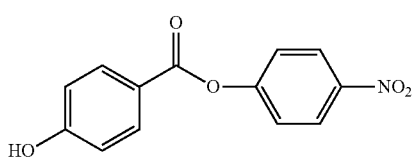

Compound 2

The same reaction as in the synthesis of Compound A in the synthesis of Compound G'-1 was allowed to proceed, except that an equimolar amount of Compound 2 was used in place of Compound 1.

<Exemplary Synthesis of Exemplary Compound G-7>

[Chemical Formula 36]

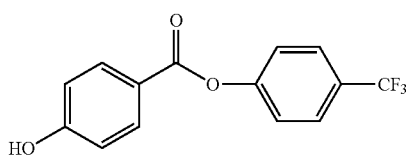

Compound 3

The same reaction as in the synthesis of Compound A in the synthesis of Compound G'-1 was allowed to proceed, except that an equimolar amount of Compound 3 was used in place of Compound 1.

<Exemplary Synthesis of Exemplary Compound G-8>

The same reaction as in the synthesis of Compound G-5 was allowed to proceed, except that an equimolar amount of tetrafluorophthalonitrile was used in place of tetrachlorophthalonitrile.

<Exemplary Synthesis of Exemplary Compound G-9>

The same reaction as in the synthesis of Compound G-6 was allowed to proceed, except that an equimolar amount of tetrafluorophthalonitrile was used in place of tetrachlorophthalonitrile.

<Exemplary Synthesis of Exemplary Compound G-10>

The same reaction as in the synthesis of Compound G-7 was allowed to proceed, except that an equimolar amount of tetrafluorophthalonitrile was used in place of tetrachlorophthalonitrile.

<Exemplary Synthesis of Exemplary Compound G-11>

[Chemical Formula 37]

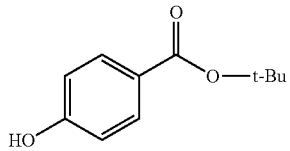

Compound 4

The same reaction as in the synthesis of Compound A in the synthesis of Compound G'-1 was allowed to proceed, except that an equimolar amount of Compound 4 was used in place of Compound 1.

<Exemplary Synthesis of Exemplary Compound G-12>

[Chemical Formula 38]

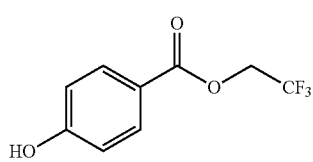

Compound 5

The same reaction as in the synthesis of Compound A in the synthesis of Compound G'-1 was allowed to proceed, except that an equimolar amount of Compound 5 was used in place of Compound 1.

<Exemplary Synthesis of Exemplary Compound G-13>

[Chemical Formula 39]

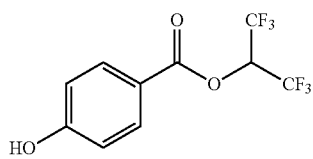

Compound 6

The same reaction as in the synthesis of Compound A in the synthesis of Compound G'-1 was allowed to proceed, except that an equimolar amount of Compound 6 was used in place of Compound 1.

[Chemical Formula 40]

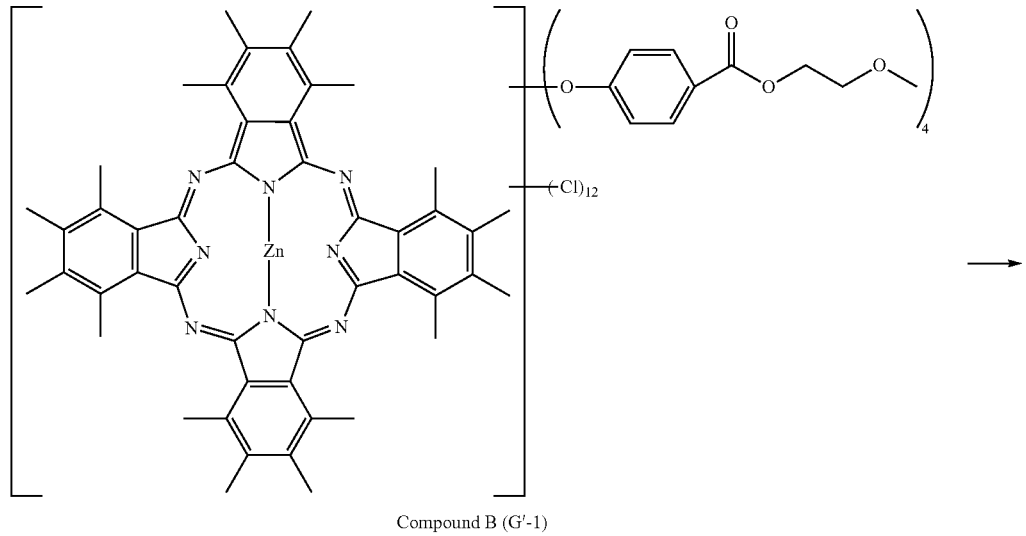

Compound B (G'-1)

-continued

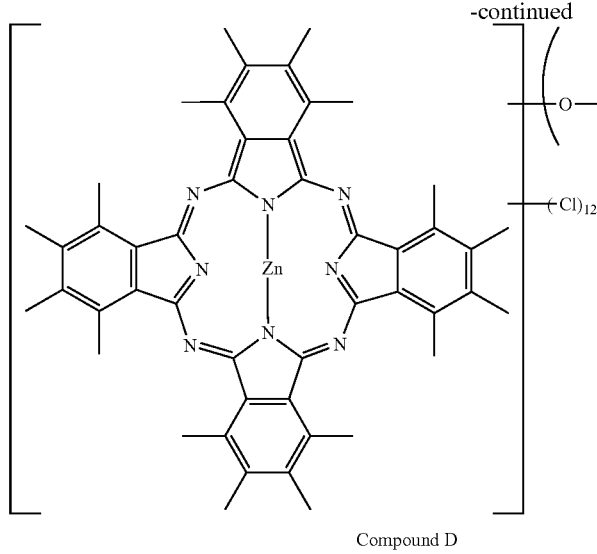
Compound D

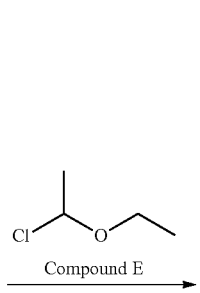
Compound E

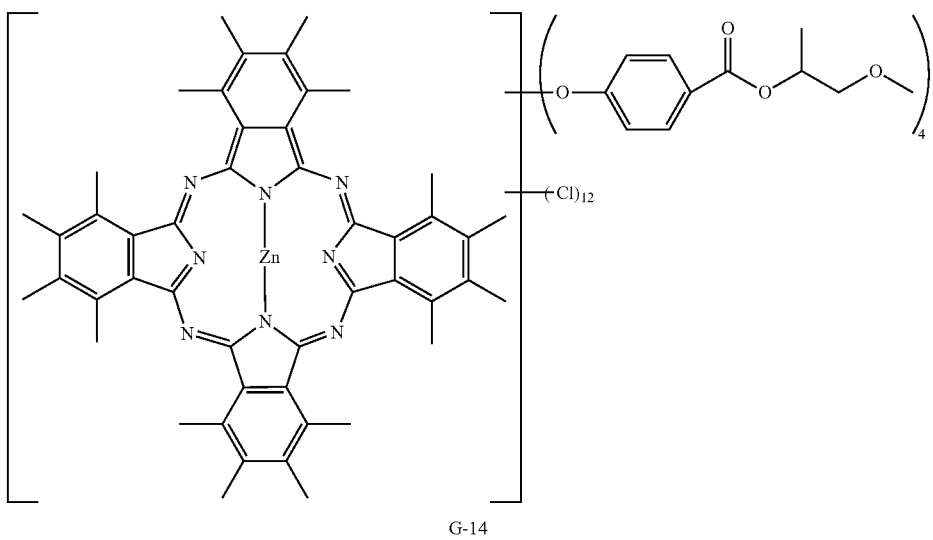
G-14

(Synthesis of Compound D)

The same reaction as in the synthesis of Compound C was allowed to proceed, except that 4-fold equivalent of lithium hydroxide relative to Compound B was used.

<Exemplary Synthesis of Exemplary Compound G-14>

In a flask under cooling on ice, Compound C (3.00 g, 1.95 mmol), mL of THF, Compound E (1.27 g, 11.72 mmol), and diisopropylethylamine (3.03 g, 23.44 mmol) were placed, and the content was stirred at room temperature for approximately 4 hours. The obtained solution was condensed under reduced pressure at 40° C. for one hour, to evaporate off the solvent. The obtained residue was added with MeOH/water (1:1, 120 mL), followed by suction filtration, and the collected crystal was dried overnight at 40° C. under air flow, to obtain approximately 3.40 g (95.4%) of Compound D.

<Exemplary Synthesis of Exemplary Compound G-15>

In a flask under cooling on ice, Compound C (3.00 g, 1.95 mmol), 60 mL of THF, 3,4-dihydro-2H-pyran (0.99 g, 11.72 mmol), and TsOH.H$_2$O (0.04 g, 0.20 mmol) were placed, and the content was stirred at room temperature for approximately 4 hours. The obtained solution was condensed under reduced pressure at 40° C. for one hour, to evaporate off the solvent. The obtained residue was added with MeOH/water (1:1, 120 mL), followed by suction filtration, and the collected crystal was dried overnight at 40° C. under air flow, to obtain approximately 3.40 g (95.4%) of Compound G-15.

<Exemplary Synthesis of Exemplary Compound G-16>

The same reaction as in the synthesis of Compound G-2 was allowed to proceed, except that an equimolar amount of 2-mercaptoethanol was used in place of glycidol.

[Chemical Formula 41]
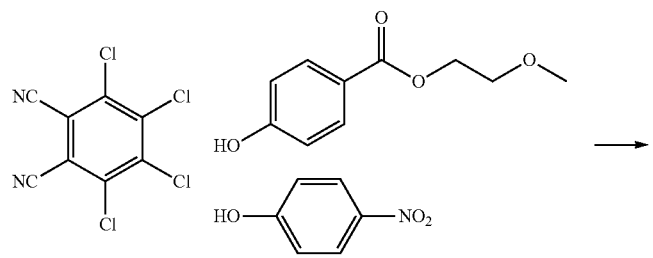
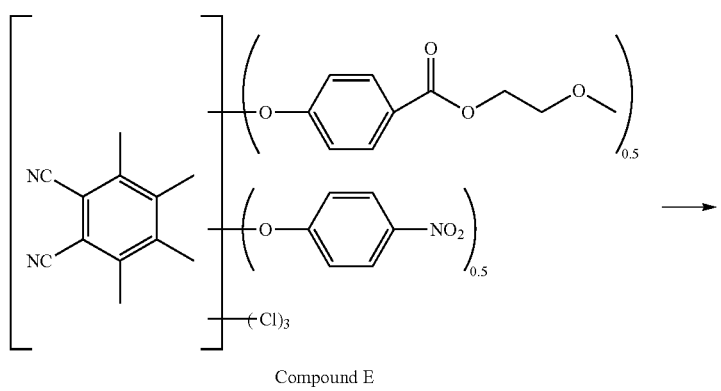
Compound E
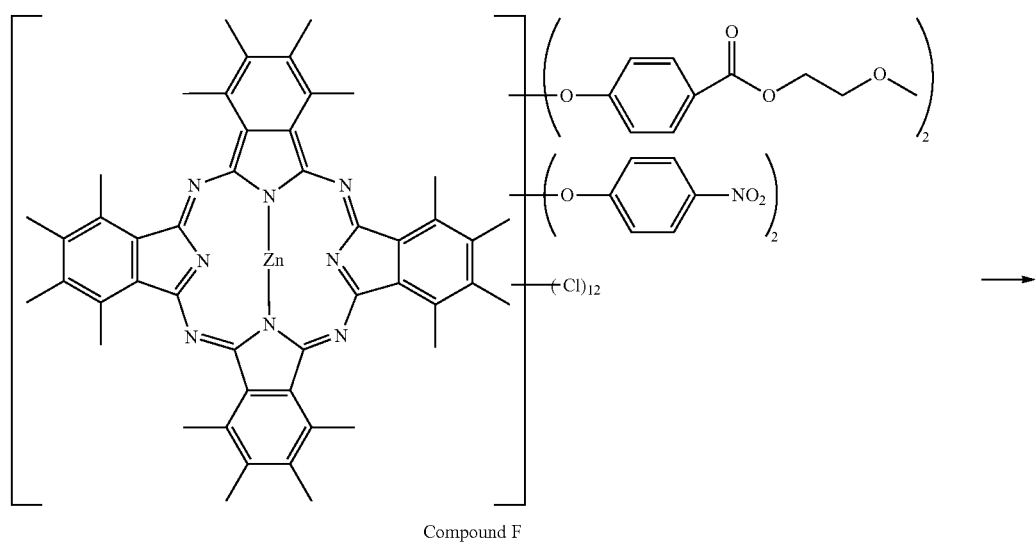
Compound F

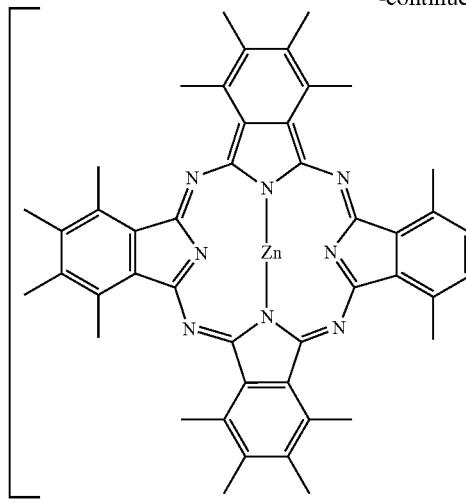

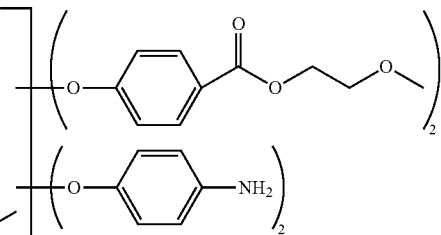

G-17

<Exemplary Synthesis of Compound F>

The same reaction as in the synthesis of Compound A was allowed to proceed, except that a half molar amount of Compound 1 was replaced with 4-hydroxynitrobenzene.

<Exemplary Synthesis of Exemplary Compound G-17>

In a flask, Compound F (5.00 g, 3.13 mmol), THF (50 mL), and 5% Pd/C (0.05 g) were placed, and the content was stirred under a hydrogen atmosphere for 24 hours. The obtained solution was filtered through celite, and washed with THF. The filtrate and the washate were combined, and condensed under reduced pressure at 40° C. for one hour, to evaporate off the solvent. The obtained residue was added with MeOH (100 mL), followed by suction filtration, and the collected crystal was dried overnight at 40° C. under air flow, to obtain approximately 4.50 g (95.3%) of Compound F.

<Exemplary Synthesis of Exemplary Compound G-18>

The same reaction as in the synthesis of Compound B in the synthesis of Compound G-1 was allowed to proceed, except that an equimolar amount of copper(II) chloride was used in place of zinc iodide.

<Exemplary Synthesis of Exemplary Compound G-19>

The same reaction as in the synthesis of Compound A in the synthesis of Compound G-18 was allowed to proceed, except that an equimolar amount of tetrafluorophthalonitrile was used in place of tetrachlorophthalonitrile.

<Exemplary Synthesis of Exemplary Compound G-20>

The same reaction as in the synthesis of Compound A in the synthesis of Compound G-1 was allowed to proceed, except that an equimolar amount of dichlorophthalonitrile was used in place of tetrachlorophthalonitrile.

<Exemplary Synthesis of Exemplary Compound G-21>

[Chemical Formula 42]

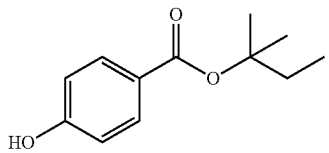

Compound 6

The same reaction as in the synthesis of Compound A in the synthesis of Compound G'-1 was allowed to proceed, except that an equimolar amount of Compound 6 was used in place of Compound 1.

<Exemplary Synthesis of Exemplary Compound G-22>

[Chemical Formula 43]

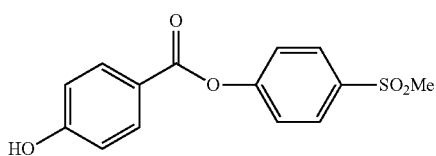

Compound 7

The same reaction as in the synthesis of Compound A in the synthesis of Compound G'-1 was allowed to proceed, except that an equimolar amount of Compound 7 was used in place of Compound 1.

<Exemplary Synthesis of Exemplary Compound G'-2>

The same reaction as in the synthesis of Compound A in the synthesis of Compound G'-1 was allowed to proceed, except that an equimolar amount of tetrafluorophthalonitrile was used in place of tetrachlorophthalonitrile.

<Exemplary Synthesis of Exemplary Compound G'-3>

[Chemical Formula 44]

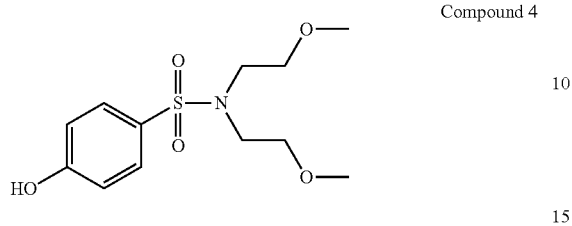

Compound 4

The same reaction as in the synthesis of Compound A in the synthesis of Compound G'-1 was allowed to proceed, except that an equimolar amount of Compound 4 was used in place of Compound 1.

[Chemical Formula 45]

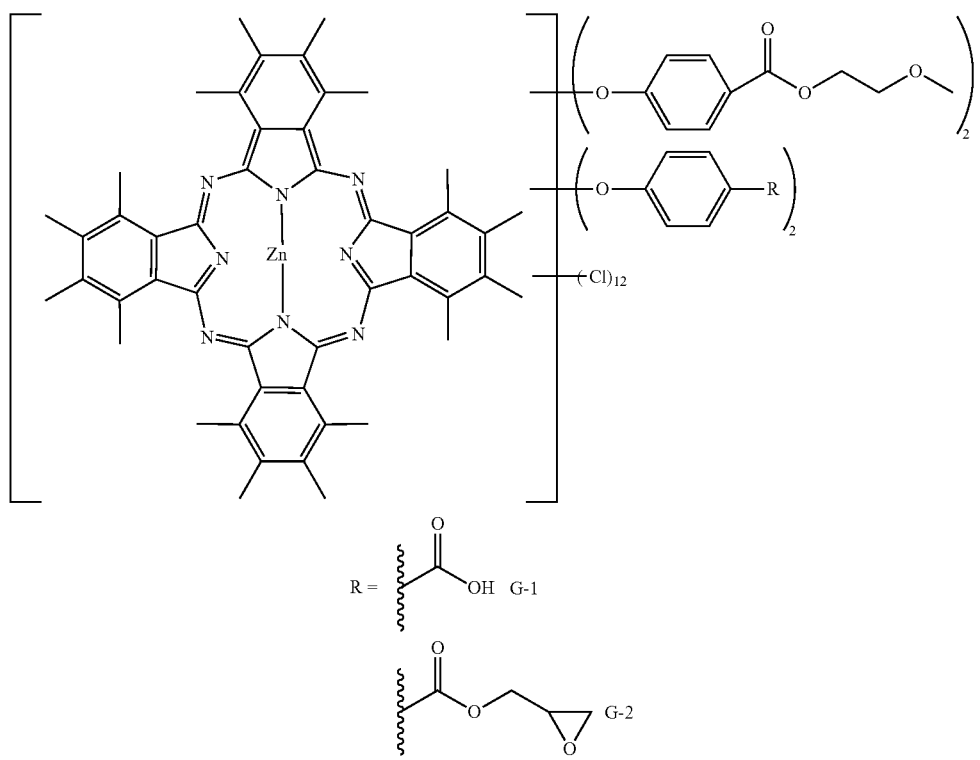

[Chemical Formula 46]
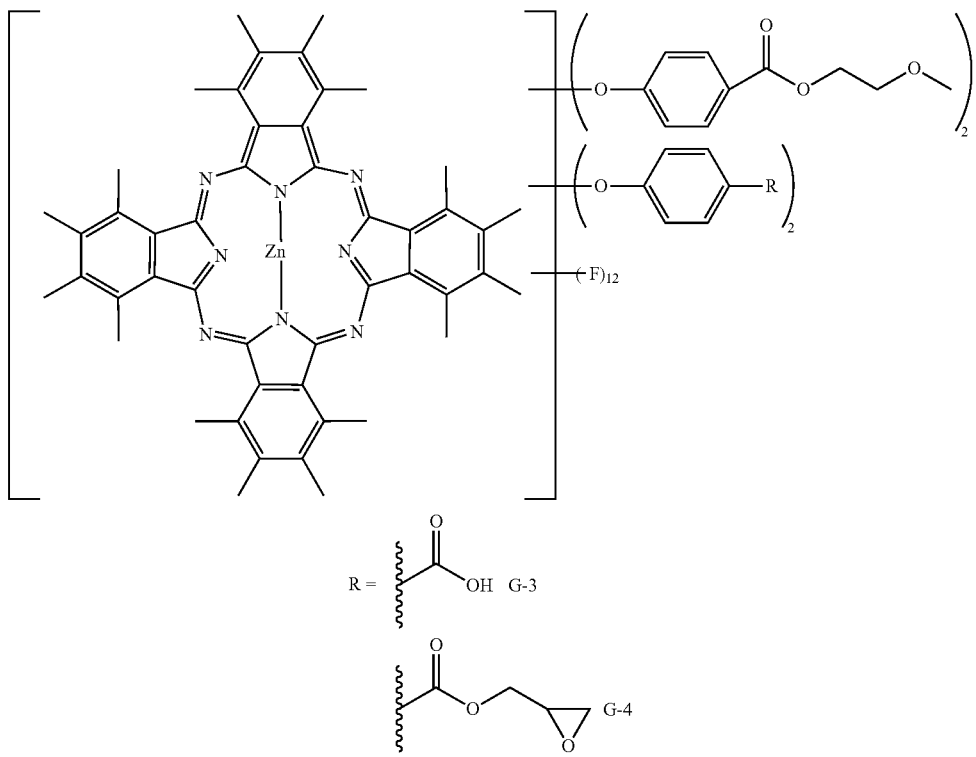
[Chemical Formula 47]
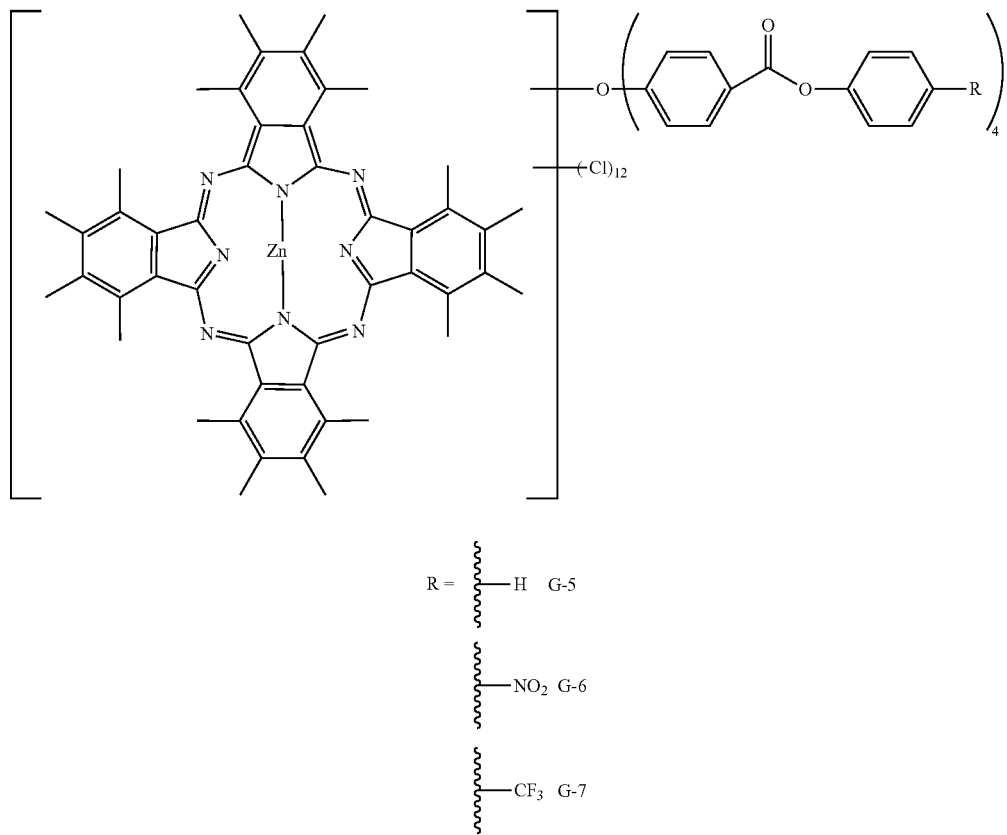

[Chemical Formula 48]
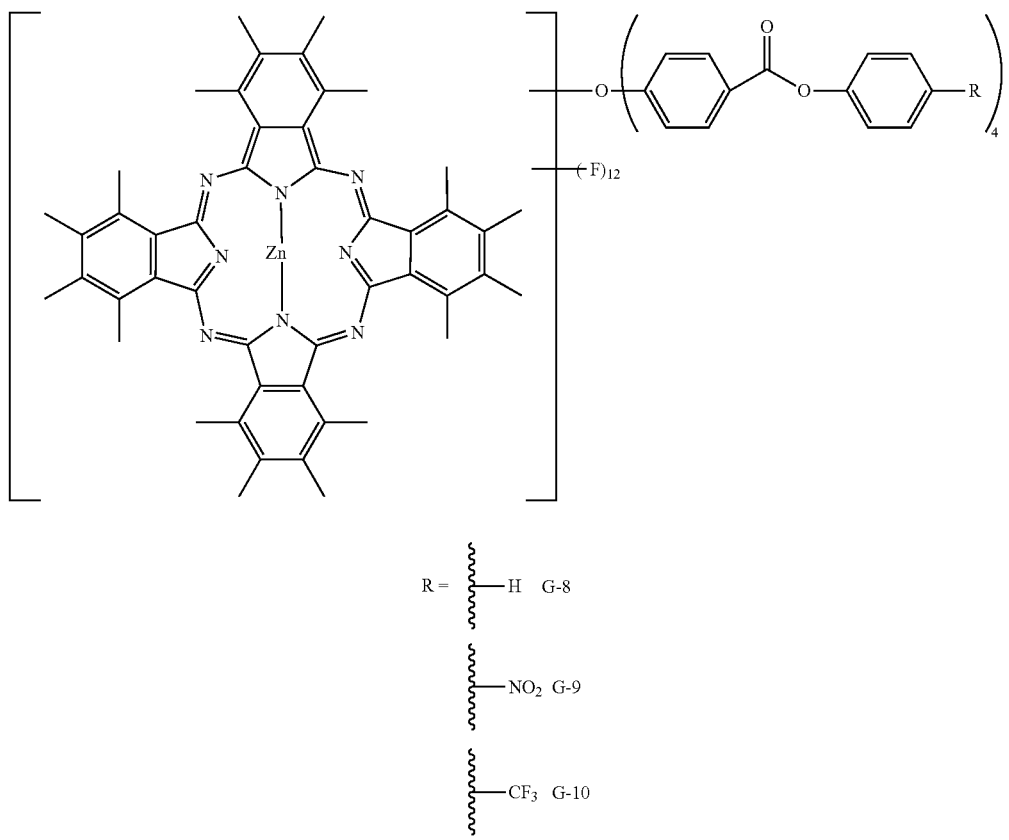
R = —H  G-8
—NO₂  G-9
—CF₃  G-10
[Chemical Formula 49]
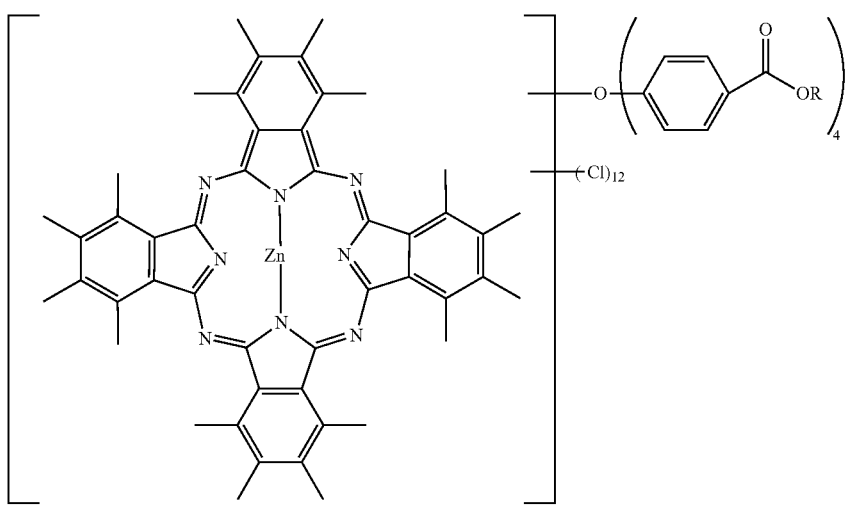

-continued
R = t-Bu G-11
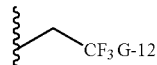
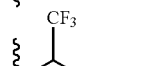
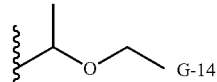
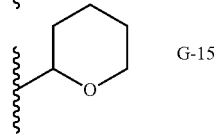
[Chemical Formula 50]
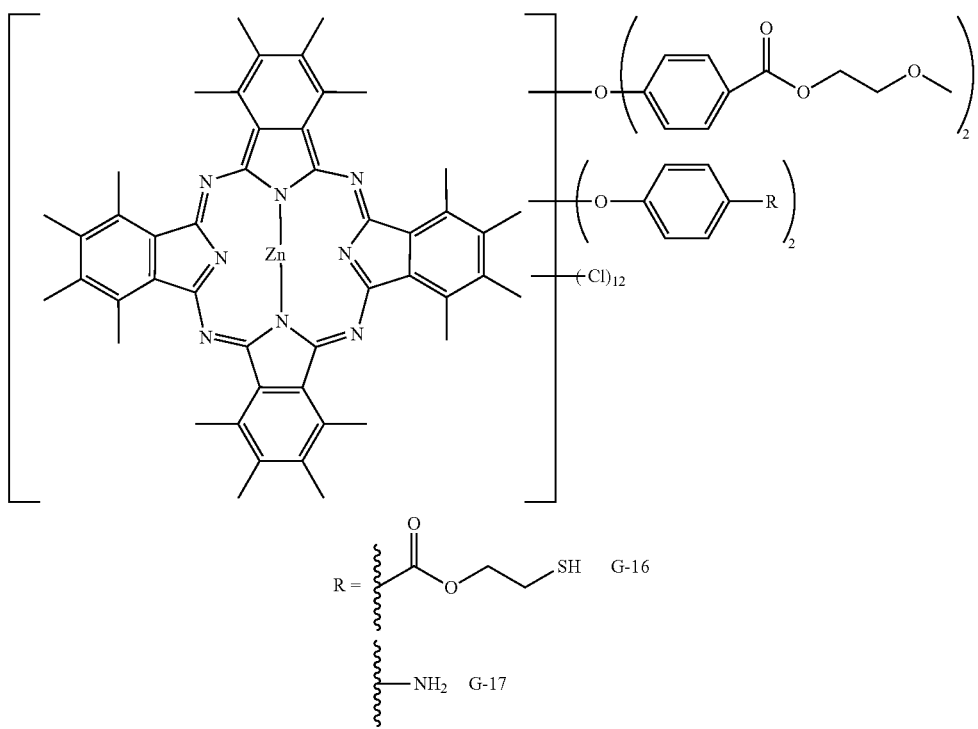

-continued
[Chemical Formula 51]
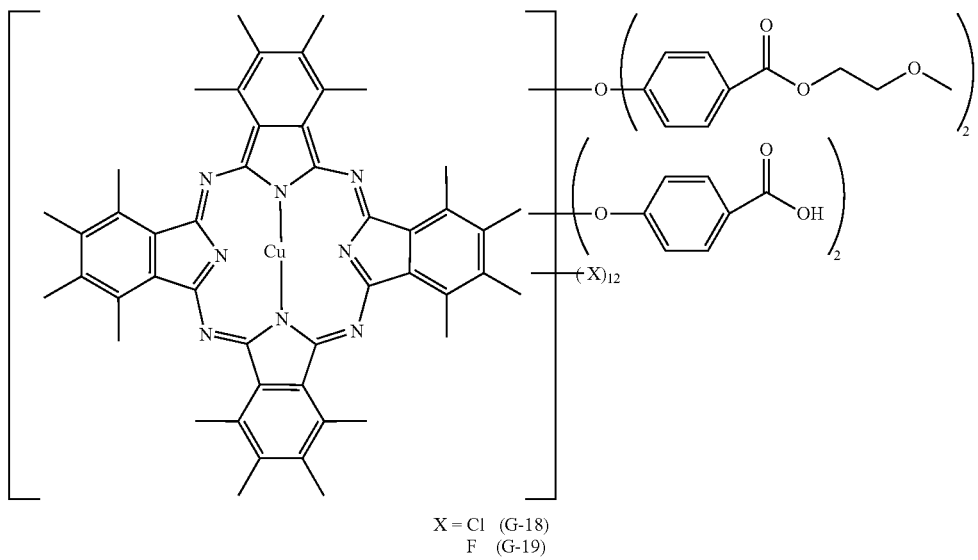
X = Cl (G-18)
F (G-19)
[Chemical Formula 52]
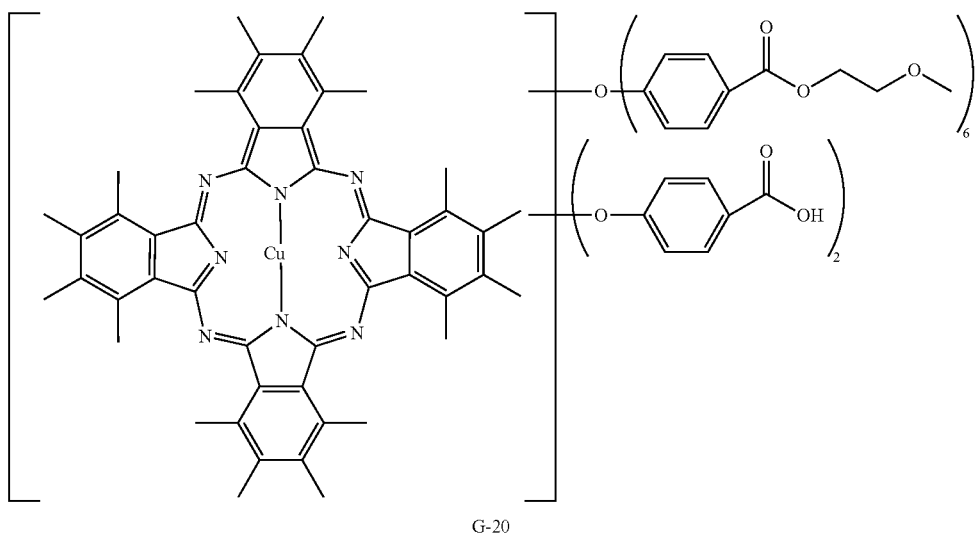
G-20

[Chemical Formula 53]
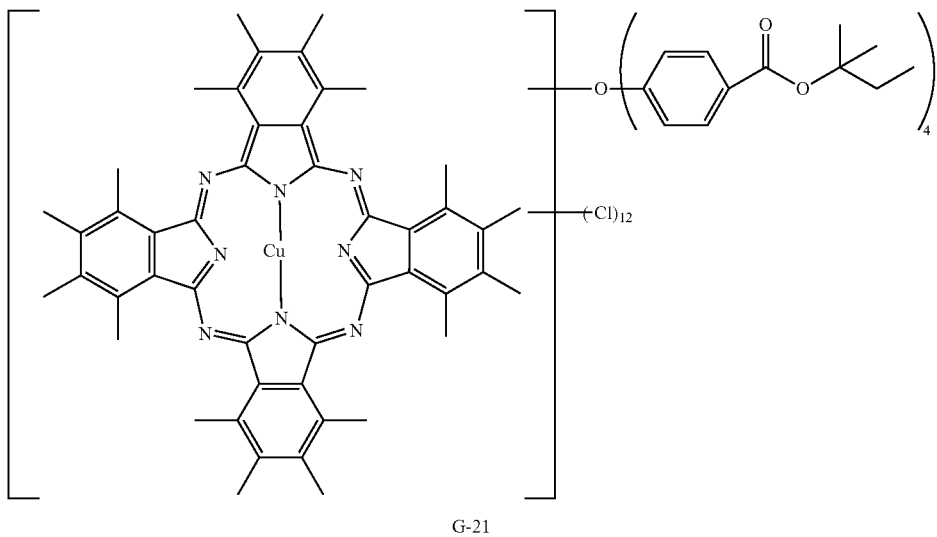
G-21
[Chemical Formula 54]
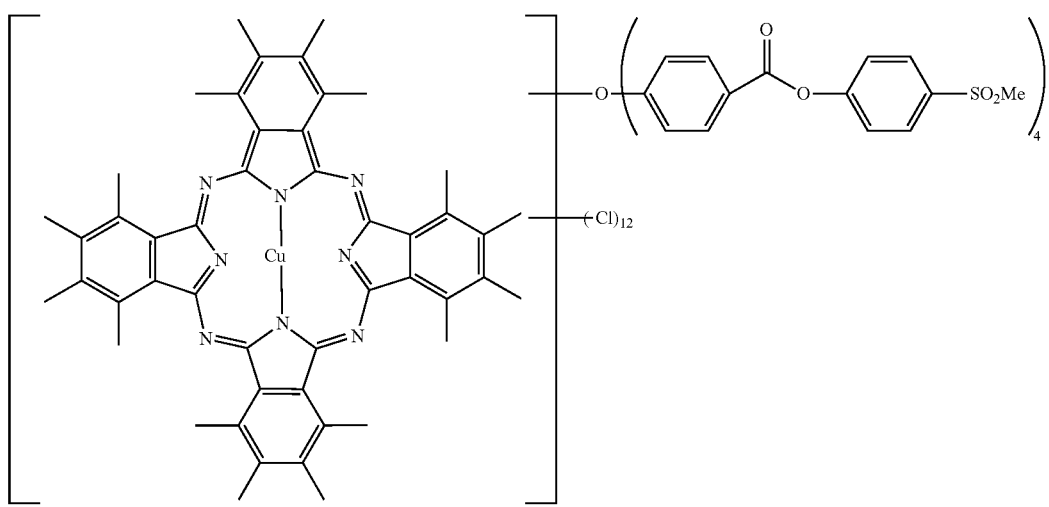
G-22

[Chemical Formula 55]
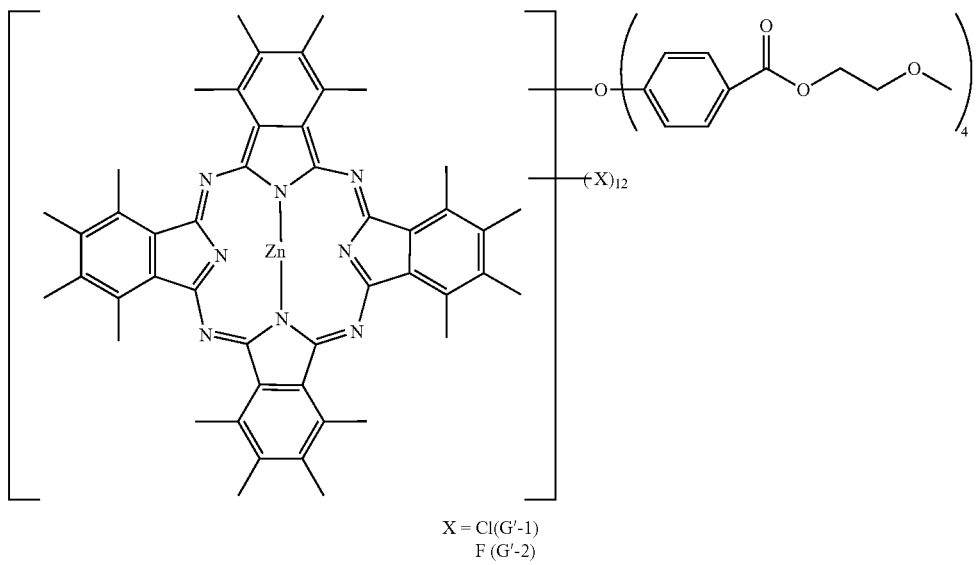
X = Cl(G'-1)
F (G'-2)
[Chemical Formula 56]
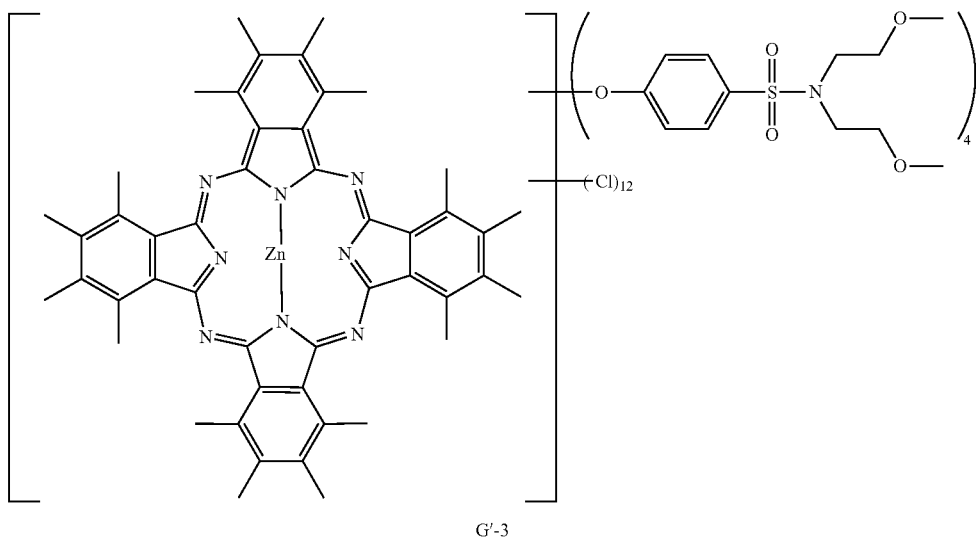
G'-3

<Other Colorant>

Y-1: yellow coloring matter (methine-base coloring matter (dye))

Y150: azo-base coloring matter (pigment)

[Chemical Formula 57]

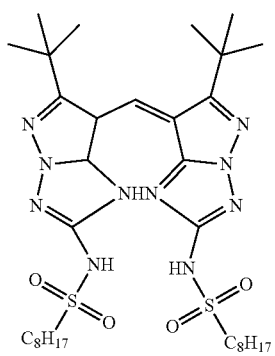

Y-1

<Exemplary Synthesis of Methine-Base Coloring Matter Y-1>

Methine-base coloring matter Y-1 was synthesized according to the scheme below.

[Chemical Formula 58]

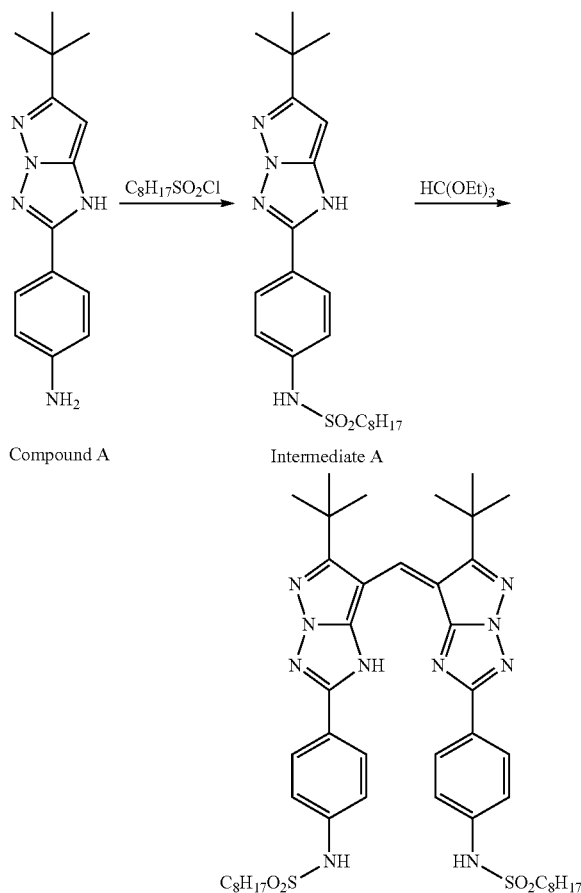

(Synthesis of Intermediate A)

A solution containing 100 parts by mass of Compound (A) (synthesized by a method described in EP0571959A2) and 390 mL of pyridine was cooled to 5° C., and 87 parts by weight of octanesulfonyl chloride was added dropwise while keeping the reaction temperature at 25° C. or below. The reaction liquid was stirred at room temperature for 2 hours, 2 L of a 4 N aqueous hydrochloric acid solution was added, the mixture was stirred at room temperature, and then filtered. The collected crystal was washed with 500 mL of methanol, and then dried to obtain 153 g (yield=91%) of intermediate A.

$^1$H-NMR CDCl$_3$ δ0.8 (t, 3H) 1.0-1.4 (m, 19H) 1.6 (m, 2H) 3.2 (t, 2H), 5.6 (s, 1H) 7.3 (d, 2H) 7.9 (d, 2H) 10.2 (s, 1H) 12.9 (s, 1H)

(Synthesis of Methine-Base Coloring Matter Y-1)

A suspended liquid containing 110 g of intermediate A and 650 mL of acetic acid was added with 168 g of ethyl orthoformate at room temperature, and the reaction liquid was stirred at 80° C. for 3 hours. The reaction liquid was added with 1.1 L of methanol, followed by cooling, collection by filtration, and washing with methanol, to thereby obtain 96 g (yield=88%) of methine-base coloring matter Y-1.

$^1$H-NMR CDCl$_3$ δ0.8 (t, 6H) 1.2-2.0 (m, 41H) 3.3 (t, 4H) 7.3 (d, 4H), 7.6 (br, 2H) 7.8 (d, 4H) 8.4 (s, 1H)

<Dispersant>

Dispersant A: (synthesized referring to paragraph [0334] of JP-A-2007-277514)

[Chemical Formula 59]

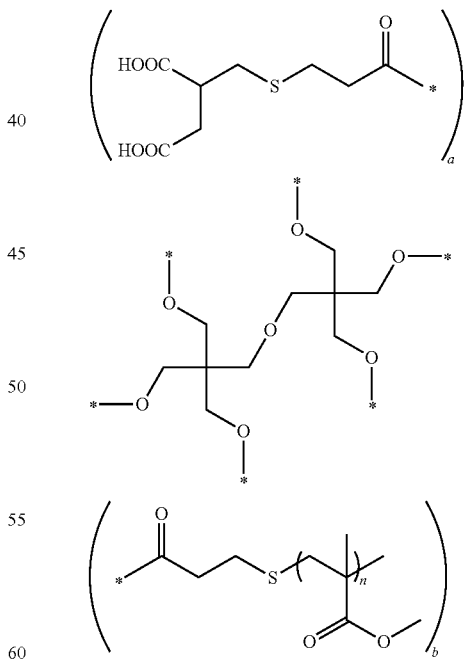

In the formula above, "a" is 2.0, "b" is 4.0, with acid value=10 mg KOH/g and Mw=20000.

In dispersant A, each of "a" and "b" represents the number of partial structures given in the parentheses, where a+b=6 holds.

Dispersant B: (synthesized referring to JP-A-2011-070156)

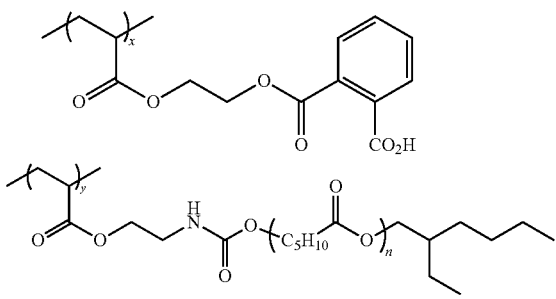

In the formulae above, x and y respectively represent the contents (% by mass) of the individual structural units, where x+y=100 holds. n is 20, with acid value=100 mg KOH/g and Mw=30000.

<Epoxy Group-Containing Compound>
JER1031S: (from Mitsubishi Chemical Company, epoxy equivalent: 180-220 (g/eq.))
JER157S70: (from Mitsubishi Chemical Company, epoxy equivalent: 200-220 (g/eq.))
JER1032H60: (from Mitsubishi Chemical Company, epoxy equivalent: 163-175 (g/eq.))
EPICLON HP-4700: (from DIC Corporation, epoxy equivalent: 160-170 (g/eq.))
EPICLON N-695: (from DIC Corporation, epoxy equivalent: 209-219 (g/eq.))
JER1003: (from Mitsubishi Chemical Company, epoxy equivalent: 670-700 (g/eq.))
JER1007: (from Mitsubishi Chemical Company, epoxy equivalent: 1750-2200 (g/eq.))
<Surfactant>
Surfactant A: F-781 (from DIC Corporation, fluorine-containing surfactant)
<Derivative>
Derivative A:

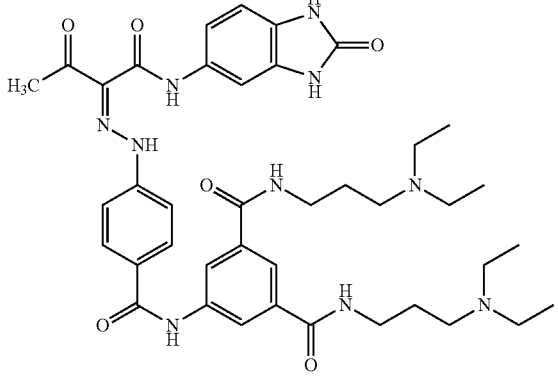

<Preparation of Pigment Dispersion>
A mixture obtained by mixing the compounds below was mixed and dispersed for 3 hours using a bead mill (high pressure homogenizer NANO-3000-10 with a pressure reducing mechanism (from Nihon BEE)) with zirconia bead of 0.3 mm in diameter, to thereby prepare a pigment dispersion. The amounts of mixing of the individual components were controlled so that the compositional ratio in the finally obtainable colored curable composition is given as summarized in Table below.

Pigment: PY150
Derivative A
Dispersant A or dispersant B
Solvent: propylene glycol monomethyl ether acetate (PGMEA)

<Preparation of Colored Curable Composition>
The colored curable compositions were prepared by mixing the individual components, so as to give the compositions summarized in Table below (Examples 1 to 27, Comparative Examples 1 to 13).

Phthalocyanine dye (the above-described Exemplary Compounds G-1 to G-17, G'-1 to G'-3): 42% in total solids
Yellow coloring matter (when the above-described dye (Y-1) is contained: 36% in total solids, when the above-described pigment dispersion is used: pigment (24% in total solids), derivative (4.5% in total solids), dispersant (7.5% in total solids), no addition: 0% in total solids)
Epoxy group-containing compound (the above-described epoxy group-containing compound): 21.9% in total solids
Surfactant (the above-described surfactant A): 0.1% in total solids
Solvent (cyclohexanone): amount controlled to adjust the final solid content to 15%

<Evaluation of Chemical Resistance>
Each colored curable composition obtained above was coated using a spin coater, over a 7.5 cm×7.5 cm glass substrate so as to form a 0.6 μm thick film, dried on a hot plate at 100° C. for 2 minutes, and the coated film was then cured at 200° C. for 8 minutes, to thereby form a colored layer.

The obtained colored layer was immersed in PGMEA, cyclohexanone or NMP for 10 minutes, rinsed with water, and the obtained substrate was subjected to spectrophotometry. The chemical resistance was evaluated respectively for PGMEA, cyclohexanone and NMP.

Absorbance was compared between before and after the colored layer was immersed, colorant retention ratio after the immersion was calculated by the equation below, and evaluated based on the rating scale below. As for the colorant retention ratio, the larger the value, the better the chemical resistance.

Colorant retention ratio(%)=(Maximum absorbance after immersion in solvent/Maximum absorbance before immersion in solvent)×100

4: 95%≤colorant retention ratio ≤100%
3: 80%≤colorant retention ratio <95%
2: 50%≤colorant retention ratio <85%
1: 0%≤colorant retention ratio <50%

<Manufacture by Dry Etching of Color Filter Using Colored Curable Composition>
<<Forming Colored Layer>>
Each colored curable composition obtained above was coated using a spin coater, over a 7.5 cm×7.5 cm glass substrate so as to form a 0.5 μm thick film, and the coated film was cured by heating on a hot plate at 200° C. for 5 minutes, to thereby form a colored layer. The colored layer was found to be 0.5 μm thick.

<<Forming Resist Layer>>
Next, positive photoresist "FHi622BC" (from FUJIFILM Electronic Materials Co., Ltd.) was coated and pre-baked at 90° C. for one minute, to thereby form a photoresist layer of 0.8 μm thick.

<<Forming Resist Pattern>>

Next, the photoresist layer was subjected to patterned exposure using an i-line stepper (from Canon Inc.) at a dose of 350 mJ/cm$^2$, and baked for one minute at a temperature capable of keeping the temperature of photoresist layer or the ambient temperature at 90° C. The photoresist layer was then developed using developing solution "FHD-5" (from FUJIFILM Electronic Materials Co., Ltd.) for one minute, and post-based at 110° C. for one minute, to thereby form a resist pattern. The resist pattern was formed into a 1.2 μm square, taking dimensional conversion difference after etching (narrowing of width of etched pattern) into consideration.

<<Forming Colored Pattern>>

Next, the obtained glass substrate was bonded to an 8-inch silicon wafer, and subjected to the first step of etching for 80 seconds, using a dry etcher (U-621, from Hitachi High-Technologies Corporation), under conditions including RF power=800 W, antenna bias power=400 W, wafer bias power=200 W, internal pressure of chamber=4.0 Pa, substrate temperature=50° C., wherein composition and flow rate of a mixed gas are $CF_4$=80 mL/min, $O_2$=40 mL/min, and Ar=800 mL/min.

Next, the second step of etching and over-etching were conducted for 28 seconds in the same etching chamber, under conditions including RF power=600 W, antenna bias power=100 W, wafer bias power=250 W, internal pressure of chamber=2.0 Pa, substrate temperature=50° C., wherein composition and flow rate of a mixed gas mixed gas are $N_2$=500 mL/min, $O_2$=50 mL/min, and Ar=500 mL/min ($N_2/O_2$/Ar=10/1/10).

After the dry etching under the conditions described above, the resist was removed by stripping using photoresist stripping liquid "MS230C" (from FUJIFILM Electronic Materials Co., Ltd.) at 50° C. for 120 seconds, to thereby form a green colored pattern. The green colored pattern was further rinsed with pure water, spin-dried, and baked at 100° C. for 2 minutes for dehydration. The color filter was obtained in this way.

<Evaluation of Pattern Formability of Color Filter Using Colored Curable Composition>

The thus manufactured color filter was cut with a glass cutter, and the cross section was observed under a scanning electron microscope (S-4800, from Hitachi Ltd.) at 15,000× magnification, and evaluated according to the rating scale below.

(Rating Scale)

A: 1.2 μm wide pattern with a good straightness
B: 1.2 μm wide pattern with a slight irregularity, practically acceptable
C: 1.2 μm wide pattern with a notably poor straightness In Table below, G dye represents phthalocyanine dye, and Y coloring matter represents yellow coloring matter.

TABLE 3

| | G dye | Y coloring matter | Dispersant | Epoxy Group-Containing Compound | Chemical Resistance (PGMEA) | Chemical Resistance (cyclohexanone) | Chemical Resistance (NMP) | Pattern Formability |
|---|---|---|---|---|---|---|---|---|
| Example 1 | G-1 | — | — | JER1031S | 4 | 4 | 3 | A |
| Example 2 | G-1 | PY150 | A | JER1031S | 4 | 4 | 3 | A |
| Example 3 | G-1 | PY150 | B | JER1031S | 4 | 4 | 3 | A |
| Example 4 | G-1 | PY150 | A | JER157S70 | 4 | 4 | 3 | A |
| Example 5 | G-1 | PY150 | A | EPICLON HP-4700 | 4 | 4 | 3 | A |
| Example 6 | G-1 | PY150 | B | EPICLON HP-4700 | 4 | 4 | 3 | A |
| Example 7 | G-1 | PY150 | A | EPICLON N-695 | 4 | 4 | 3 | A |
| Example 8 | G-1 | PY150 | A | JER1032H60 | 4 | 4 | 3 | A |
| Example 9 | G-1 | PY150 | A | JER1003 | 4 | 3 | 2 | A |
| Example 10 | G-1 | PY150 | B | JER1003 | 4 | 3 | 2 | A |
| Example 11 | G-1 | PY150 | A | JER1007 | 4 | 3 | 2 | A |
| Example 12 | G-1 | Y-1 | — | JER1031S | 4 | 4 | 3 | A |
| Example 13 | G-1 | Y-1 | — | JER1003 | 4 | 3 | 3 | A |
| Example 14 | G-2 | PY150 | — | JER1031S | 4 | 4 | 3 | A |
| Example 15 | G-3 | PY150 | — | JER1031S | 4 | 4 | 3 | A |
| Example 16 | G-4 | PY150 | — | JER1031S | 4 | 4 | 3 | A |
| Example 17 | G-5 | PY150 | — | JER1031S | 4 | 4 | 2 | A |
| Example 18 | G-6 | PY150 | — | JER1031S | 4 | 4 | 2 | A |
| Example 19 | G-7 | PY150 | — | JER1031S | 4 | 4 | 2 | A |
| Example 20 | G-8 | PY150 | — | JER1031S | 4 | 4 | 2 | A |
| Example 21 | G-9 | — | — | JER1031S | 4 | 4 | 2 | A |
| Example 22 | G-9 | PY150 | A | JER1031S | 4 | 4 | 2 | A |
| Example 23 | G-9 | PY150 | B | JER1031S | 4 | 4 | 2 | A |
| Example 24 | G-9 | Y-1 | — | JER1031S | 4 | 4 | 2 | A |
| Example 25 | G-10 | PY150 | — | JER1031S | 4 | 4 | 2 | A |
| Example 26 | G-11 | PY150 | — | JER1031S | 4 | 4 | 3 | A |
| Example 27 | G-12 | PY150 | — | JER1031S | 4 | 4 | 2 | A |
| Example 28 | G-13 | PY150 | — | JER1031S | 4 | 4 | 2 | A |
| Example 29 | G-14 | — | — | JER1031S | 4 | 4 | 3 | A |
| Example 30 | G-14 | PY150 | — | JER1031S | 4 | 4 | 3 | A |
| Example 31 | G-14 | Y-1 | — | JER1031S | 4 | 4 | 3 | A |
| Example 32 | G-15 | PY150 | — | JER1031S | 4 | 4 | 3 | A |
| Example 33 | G-16 | PY150 | — | JER1031S | 4 | 4 | 2 | A |
| Example 34 | G-17 | — | — | JER1031S | 4 | 4 | 2 | A |
| Example 35 | G-18 | — | — | JER1031S | 4 | 4 | 3 | A |
| Example 36 | G-19 | | | JER1031S | 4 | 4 | 3 | A |
| Example 37 | G-20 | | | JER1031S | 4 | 3 | 2 | B |
| Example 38 | G-21 | | | JER1031S | 4 | 4 | 3 | A |
| Example 39 | G-22 | | | JER1031S | 4 | 4 | 2 | A |
| Comparative Example 1 | G'-1 | — | — | JER1031S | 4 | 2 | 1 | B |
| Comparative Example 2 | G'-1 | PY150 | A | JER1031S | 4 | 2 | 1 | B |
| Comparative Example 3 | G'-1 | PY150 | B | JER1031S | 4 | 2 | 1 | B |

TABLE 3-continued

| | G dye | Y coloring matter | Dispersant | Epoxy Group-Containing Compound | Chemical Resistance (PGMEA) | Chemical Resistance (cyclohexanone) | Chemical Resistance (NMP) | Pattern Formability |
|---|---|---|---|---|---|---|---|---|
| Comparative Example 4 | G'-1 | PY150 | A | JER157S70 | 4 | 2 | 1 | B |
| Comparative Example 5 | G'-1 | PY150 | A | EPICLON HP-4700 | 4 | 2 | 1 | B |
| Comparative Example 6 | G'-1 | PY150 | A | EPICLON N-695 | 4 | 2 | 1 | B |
| Comparative Example 7 | G'-1 | PY150 | A | JER1032H60 | 4 | 2 | 1 | B |
| Comparative Example 8 | G'-1 | Y-1 | — | JER1031S | 4 | 2 | 1 | B |
| Comparative Example 9 | G'-2 | — | — | JER1031S | 4 | 2 | 1 | B |
| Comparative Example 10 | G'-2 | PY150 | A | JER1031S | 4 | 2 | 1 | B |
| Comparative Example 11 | G'-2 | Y-1 | — | JER1031S | 4 | 2 | 1 | B |
| Comparative Example 12 | G'-3 | — | — | JER1031S | 4 | 2 | 1 | B |
| Comparative Example 13 | G'-3 | PY150 | A | JER1031S | 4 | 2 | 1 | B |
| Comparative Example 14 | G'-3 | Y-1 | — | JER1031S | 4 | 2 | 1 | B |

As clearly known from Table above, the color filters (Examples 1 to 39) formed by using the colored curable compositions each containing the epoxy group-containing compound, and the phthalocyanine dye having a functional group capable of forming a covalent bond by a reaction with the epoxy group under heating, showed good chemical resistance and good pattern formability.

In contrast, the color filters (Comparative Examples 1 to 14) formed by using the phthalocyanine dye having no functional group capable of forming a covalent bond by a reaction with the epoxy group under heating, were found to show poor chemical resistance and poor pattern formability.

EXPLANATION OF SIGNS 10 solid-state image sensing device
11 first colored layer
12 first colored pattern
13, 100 color filter
14 planarizing film
15 microlens
20G green pixel (first color pixel)
20R red pixel (second color pixel)
20B blue pixel (third color pixel)
21 second colored radiation-sensitive layer
21A region corresponded to first throughhole subgroup 121
22 second colored pattern
22R plurality of second color pixels provided inside individual throughholes in second throughhole subgroup 122
31 third colored radiation-sensitive layer
31A region corresponded to second throughhole subgroup 122
32 third colored pattern
41 P-well
42 photodetector (photodiode)
43 impurity-diffused layer
44 electrode
45 interconnect layer
46 BPSG film
47 insulating film
48 P-SiN film
49 planarizing film layer
51 photoresist layer
51A resist throughhole group
52 resist pattern (patterned photoresist layer)
120 throughhole group
121 first throughhole subgroup
122 second throughhole subgroup

What is claimed is:
1. A colored curable composition comprising an epoxy group-containing compound and a phthalocyanine dye having a functional group capable of forming a covalent bond by a reaction with the epoxy group under heating,
   wherein the epoxy group-containing compound has an epoxy equivalent of 500 g/eq or less;
   the epoxy group-containing compound is contained in an amount of 5 to 40% by mass, relative to the total solids content of the colored curable composition;
   the phthalocyanine dye is contained in an amount of 20 to 70% by mass, relative to the total solids content of the colored curable composition; and
   the number of functional groups possessed by the phthalocyanine dye and the epoxy equivalent of the epoxy group-containing compound satisfy the following relation:
   (epoxy equivalent of the epoxy group-containing compound/number of functional groups possessed by phthalocyanine dye)=25 g/eq or more, and 500 g/eq or less.
2. The colored curable composition of claim 1, wherein the phthalocyanine dye is a halogenated phthalocyanine dye.
3. The colored curable composition of claim 2, wherein the halogenated phthalocyanine dye is represented by the formula (1-2);

Formula (1-2)

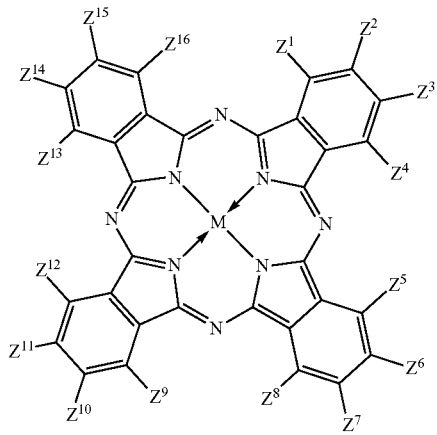

wherein each of $Z^1$ to $Z^{16}$ represents a hydrogen atom, a substituent or a halogen atom, at least one of $Z^1$ to $Z^{16}$ represents a halogen atom, and at least other one of $Z^1$ to $Z^{16}$ represents a substituent having the functional group; M represents two hydrogen atoms, a metal atom, a metal oxide or a metal halide.

4. The colored curable composition of claim 2, wherein the epoxy group-containing compound has, per molecule, two or more epoxy groups.

5. The colored curable composition of claim 1, wherein the phthalocyanine dye has, per molecule, one to four functional groups capable of forming a covalent bond by a reaction with the epoxy group under heating.

6. The colored curable composition of claim 1, wherein the epoxy group-containing compound has, per molecule, two or more epoxy groups.

7. The colored curable composition of claim 1, further comprising a yellow coloring matter.

8. The colored curable composition of claim 7, which comprises 50 to 90% by mass of a colorant containing the phthalocyanine dye and the yellow coloring matter, relative to total solids of the colored curable composition.

9. A cured film obtainable by curing a colored curable composition described in claim 1.

10. A color filter having a colored layer obtainable by using the colored curable composition described in claim 1.

11. The color filter of claim 10, wherein the colored layer has a thickness of 0.1 to 0.8 µm.

12. A device comprising the color filter described in claim 10, wherein the device is selected from a liquid crystal display device, an organic electroluminescence element, and a solid-state image sensing device.

13. A method for manufacturing a color filter, the method comprising:
forming a colored layer by curing a colored curable composition which contains a phthalocyanine dye having a functional group capable of forming a covalent bond by a reaction with an epoxy group under heating, and an epoxy group-containing compound;
forming a photoresist layer on the colored layer;
obtaining a resist pattern by patterning the photoresist layer by exposure and development; and
dry-etching the colored layer using the resist pattern as an etching mask,
wherein the epoxy group-containing compound has an epoxy equivalent of 500 g/eq or less;
the epoxy group-containing compound is contained in an amount of 5 to 40% by mass, relative to the total solids content of the colored curable composition;
the phthalocyanine dye is contained in an amount of 20 to 70% by mass, relative to the total solids content of the colored curable composition; and
the number of functional groups possessed by the phthalocyanine dye and the epoxy equivalent of the epoxy group-containing compound satisfy the following relation:
(epoxy equivalent of the epoxy group-containing compound/number of functional groups possessed by phthalocyanine dye)=25 g/eq or more, and 500 g/eq or less.

* * * * *